United States Patent
Lam et al.

(10) Patent No.: US 8,291,857 B2
(45) Date of Patent: Oct. 23, 2012

(54) APPARATUSES AND METHODS FOR ATOMIC LAYER DEPOSITION

(75) Inventors: Hyman Lam, San Jose, CA (US); Bo Zheng, Saratoga, CA (US); Hua Ai, Mountain View, CA (US); Michael Jackson, Sunnyvale, CA (US); Xiaoxiong (John) Yuan, San Jose, CA (US); Hou Gong Wang, Pleasanton, CA (US); Salvador P. Umotoy, Antioch, CA (US); Sang Ho Yu, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 711 days.

(21) Appl. No.: 12/494,901

(22) Filed: Jun. 30, 2009

(65) Prior Publication Data

US 2010/0003406 A1 Jan. 7, 2010

Related U.S. Application Data

(60) Provisional application No. 61/078,321, filed on Jul. 3, 2008.

(51) Int. Cl.
*C23C 16/452* (2006.01)
*C23C 16/455* (2006.01)
*C23F 1/00* (2006.01)
*H01L 21/306* (2006.01)
*C23C 16/06* (2006.01)
*C23C 16/22* (2006.01)

(52) U.S. Cl. ........... 118/723 ME; 118/715; 156/345.33; 156/345.34; 156/345.35

(58) Field of Classification Search ........... 118/723 ME, 118/715; 156/345.35, 345.33, 345.34
See application file for complete search history.

(56) References Cited

U.S. PATENT DOCUMENTS 3,524,630 A * 8/1970 Marion ........................... 261/76
4,825,809 A * 5/1989 Mieno ........................... 118/725
4,911,102 A * 3/1990 Manabe et al. ............... 118/719
(Continued)

FOREIGN PATENT DOCUMENTS

EP 1595974 A2 11/2005
(Continued)

OTHER PUBLICATIONS

PCT International Search Report and Written Opinion dated Feb. 19, 2010 for International Application No. PCT/US2009/049578.
(Continued)

*Primary Examiner* — Rudy Zervigon
(74) *Attorney, Agent, or Firm* — Patterson & Sheridan, LLP

(57) ABSTRACT

Embodiments of the invention provide apparatuses and methods for atomic layer deposition (ALD), such as plasma-enhanced ALD (PE-ALD). In some embodiments, a PE-ALD chamber is provided which includes a chamber lid assembly coupled with a chamber body having a substrate support therein. In one embodiment, the chamber lid assembly has an inlet manifold assembly containing an annular channel encompassing a centralized channel, wherein the centralized channel extends through the inlet manifold assembly, and the inlet manifold assembly further contains injection holes extending from the annular channel, through a sidewall of the centralized channel, and to the centralized channel. The chamber lid assembly further contains a showerhead assembly disposed below the inlet manifold assembly, a water box disposed between the inlet manifold assembly and the showerhead assembly, and a remote plasma system (RPS) disposed above and coupled with the inlet manifold assembly, and in fluid communication with the centralized channel.

16 Claims, 29 Drawing Sheets

U.S. PATENT DOCUMENTS

| | | | |
|---|---|---|---|
| 5,030,476 A * | 7/1991 | Okamura et al. | 427/575 |
| 5,225,366 A * | 7/1993 | Yoder | 117/90 |
| 5,229,081 A * | 7/1993 | Suda | 422/186 |
| 5,281,274 A * | 1/1994 | Yoder | 118/697 |
| 5,284,519 A * | 2/1994 | Gadgil | 118/719 |
| 5,453,124 A * | 9/1995 | Moslehi et al. | 118/715 |
| 5,672,204 A * | 9/1997 | Habuka | 117/204 |
| 5,846,330 A * | 12/1998 | Quirk et al. | 118/723 DC |
| 5,879,574 A * | 3/1999 | Sivaramakrishnan et al. | 216/60 |
| 5,887,117 A * | 3/1999 | Desu et al. | 392/386 |
| 5,902,404 A * | 5/1999 | Fong et al. | 118/723 ME |
| 5,935,334 A * | 8/1999 | Fong et al. | 118/723 ME |
| 5,935,490 A * | 8/1999 | Archbold et al. | 261/76 |
| 5,951,771 A * | 9/1999 | Raney et al. | 118/723 ER |
| 6,029,602 A * | 2/2000 | Bhatnagar | 118/723 ME |
| 6,135,053 A * | 10/2000 | Okamura | 118/723 E |
| 6,258,170 B1 * | 7/2001 | Somekh et al. | 118/715 |
| 6,329,297 B1 * | 12/2001 | Balish et al. | 438/714 |
| 6,428,847 B1 * | 8/2002 | Grant et al. | 427/248.1 |
| 6,432,831 B2 | 8/2002 | Dhindsa et al. | 438/710 |
| 6,444,039 B1 | 9/2002 | Nguyen | |
| 6,450,117 B1 * | 9/2002 | Murugesh et al. | 118/723 ME |
| 6,596,643 B2 | 7/2003 | Chen et al. | |
| 6,603,269 B1 * | 8/2003 | Vo et al. | 315/111.21 |
| 6,607,976 B2 | 8/2003 | Chen et al. | |
| 6,645,303 B2 * | 11/2003 | Frankel et al. | 118/725 |
| 6,720,027 B2 | 4/2004 | Yang et al. | |
| 6,767,007 B2 * | 7/2004 | Luman | 261/76 |
| 6,773,507 B2 * | 8/2004 | Jallepally et al. | 117/89 |
| 6,838,125 B2 | 1/2005 | Chung et al. | |
| 6,849,545 B2 | 2/2005 | Mak et al. | |
| 6,866,746 B2 * | 3/2005 | Lei et al. | 156/345.29 |
| 6,875,271 B2 | 4/2005 | Glenn et al. | |
| 6,878,206 B2 | 4/2005 | Tzu et al. | |
| 6,911,391 B2 | 6/2005 | Yang et al. | |
| 6,916,398 B2 * | 7/2005 | Chen et al. | 156/345.33 |
| 6,958,296 B2 | 10/2005 | Chen et al. | |
| 6,998,014 B2 * | 2/2006 | Chen et al. | 156/345.34 |
| 7,017,514 B1 * | 3/2006 | Shepherd et al. | 118/723 ME |
| 7,041,335 B2 * | 5/2006 | Chung | 427/255.394 |
| 7,094,685 B2 | 8/2006 | Yang et al. | |
| 7,204,886 B2 * | 4/2007 | Chen et al. | 118/715 |
| 7,214,903 B2 * | 5/2007 | Curatolo | 219/121.38 |
| 7,402,210 B2 * | 7/2008 | Chen et al. | 118/715 |
| 7,473,638 B2 | 1/2009 | Yang et al. | |
| 7,521,379 B2 | 4/2009 | Khandelwal et al. | |
| 7,572,337 B2 * | 8/2009 | Rocha-Alvarez et al. | 118/715 |
| 7,582,181 B2 * | 9/2009 | Babic | 156/345.18 |
| 7,591,907 B2 * | 9/2009 | Chen et al. | 118/715 |
| 7,699,023 B2 * | 4/2010 | Chen et al. | 118/723 VE |
| 7,732,325 B2 | 6/2010 | Yang et al. | |
| 7,780,785 B2 * | 8/2010 | Chen et al. | 118/715 |
| 7,780,788 B2 * | 8/2010 | Chen et al. | 118/715 |
| 7,780,789 B2 * | 8/2010 | Wu et al. | 118/715 |
| 7,794,544 B2 * | 9/2010 | Nguyen et al. | 118/715 |
| 7,824,743 B2 | 11/2010 | Lee et al. | |
| 7,838,441 B2 | 11/2010 | Khandelwal et al. | |
| 7,850,779 B2 * | 12/2010 | Ma et al. | 118/715 |
| 8,070,879 B2 * | 12/2011 | Chen et al. | 118/715 |
| 8,100,081 B1 * | 1/2012 | Henri et al. | 118/723 R |
| 2001/0054387 A1 * | 12/2001 | Frankel et al. | 118/725 |
| 2002/0005442 A1 | 1/2002 | Watanabe et al. | |
| 2002/0073922 A1 * | 6/2002 | Frankel et al. | 118/715 |
| 2003/0019428 A1 * | 1/2003 | Ku et al. | 118/715 |
| 2003/0049931 A1 | 3/2003 | Byun et al. | |
| 2003/0072884 A1 | 4/2003 | Zhang et al. | |
| 2003/0079686 A1 * | 5/2003 | Chen et al. | 118/715 |
| 2003/0082301 A1 | 5/2003 | Chen et al. | |
| 2003/0116087 A1 | 6/2003 | Nguyen et al. | |
| 2003/0121608 A1 * | 7/2003 | Chen et al. | 156/345.33 |
| 2003/0143328 A1 * | 7/2003 | Chen et al. | 427/255.28 |
| 2003/0213560 A1 * | 11/2003 | Wang et al. | 156/345.31 |
| 2003/0221780 A1 * | 12/2003 | Lei et al. | 156/345.29 |
| 2004/0003777 A1 | 1/2004 | Carpenter et al. | |
| 2004/0009336 A1 | 1/2004 | Marcadal et al. | |
| 2004/0013803 A1 | 1/2004 | Chung et al. | |
| 2004/0028810 A1 * | 2/2004 | Grant et al. | 427/248.1 |
| 2004/0144311 A1 * | 7/2004 | Chen et al. | 118/715 |
| 2005/0009325 A1 | 1/2005 | Chung et al. | |
| 2005/0106865 A1 * | 5/2005 | Chung et al. | 438/685 |
| 2005/0115675 A1 | 6/2005 | Tzu et al. | |
| 2005/0139160 A1 * | 6/2005 | Lei et al. | 118/715 |
| 2005/0173068 A1 * | 8/2005 | Chen et al. | 156/345.33 |
| 2005/0252449 A1 * | 11/2005 | Nguyen et al. | 118/715 |
| 2005/0252450 A1 * | 11/2005 | Kowalsky et al. | 118/715 |
| 2005/0263072 A1 * | 12/2005 | Balasubramanian et al. | 118/715 |
| 2005/0263248 A1 * | 12/2005 | Rocha-Alvarez et al. | 156/345.34 |
| 2005/0266682 A1 * | 12/2005 | Chen et al. | 438/637 |
| 2005/0271812 A1 * | 12/2005 | Myo et al. | 427/248.1 |
| 2006/0075966 A1 * | 4/2006 | Chen et al. | 118/723 E |
| 2006/0130966 A1 * | 6/2006 | Babic et al. | 156/345.1 |
| 2006/0162661 A1 * | 7/2006 | Jung et al. | 118/723 ER |
| 2006/0199372 A1 * | 9/2006 | Chung et al. | 438/628 |
| 2006/0213557 A1 * | 9/2006 | Ku et al. | 137/240 |
| 2006/0213558 A1 * | 9/2006 | Ku et al. | 137/240 |
| 2006/0216928 A1 * | 9/2006 | Chung et al. | 438/630 |
| 2006/0276020 A1 * | 12/2006 | Yoon et al. | 438/592 |
| 2007/0003698 A1 * | 1/2007 | Chen et al. | 427/248.1 |
| 2007/0026147 A1 * | 2/2007 | Chen et al. | 427/248.1 |
| 2007/0044719 A1 * | 3/2007 | Ku et al. | 118/728 |
| 2007/0099415 A1 | 5/2007 | Chen et al. | |
| 2007/0119370 A1 * | 5/2007 | Ma et al. | 118/723 E |
| 2007/0119371 A1 * | 5/2007 | Ma et al. | 118/723 E |
| 2007/0128862 A1 * | 6/2007 | Ma et al. | 438/680 |
| 2007/0128863 A1 * | 6/2007 | Ma et al. | 438/680 |
| 2007/0128864 A1 * | 6/2007 | Ma et al. | 438/680 |
| 2007/0151514 A1 * | 7/2007 | Chen et al. | 118/715 |
| 2007/0221129 A1 * | 9/2007 | Bae et al. | 118/715 |
| 2007/0277734 A1 * | 12/2007 | Lubomirsky et al. | 118/715 |
| 2007/0289534 A1 * | 12/2007 | Lubomirsky et al. | 118/723 R |
| 2008/0038463 A1 | 2/2008 | Chen et al. | |
| 2008/0041307 A1 * | 2/2008 | Nguyen et al. | 118/715 |
| 2008/0041313 A1 * | 2/2008 | Chen et al. | 118/728 |
| 2008/0063798 A1 * | 3/2008 | Kher et al. | 427/255.394 |
| 2008/0102203 A1 * | 5/2008 | Wu et al. | 427/248.1 |
| 2008/0102208 A1 * | 5/2008 | Wu et al. | 427/255.28 |
| 2008/0107809 A1 * | 5/2008 | Wu et al. | 427/248.1 |
| 2008/0185104 A1 * | 8/2008 | Brcka | 156/345.29 |
| 2008/0268171 A1 * | 10/2008 | Ma et al. | 427/569 |
| 2008/0274299 A1 * | 11/2008 | Chen et al. | 427/569 |
| 2009/0111264 A1 | 4/2009 | Yang et al. | |
| 2009/0277587 A1 * | 11/2009 | Lubomirsky et al. | 156/345.34 |
| 2009/0308318 A1 * | 12/2009 | Chen et al. | 118/723 R |
| 2010/0003406 A1 * | 1/2010 | Lam et al. | 427/255.391 |
| 2010/0048032 A1 * | 2/2010 | Sangam et al. | 438/785 |
| 2010/0055347 A1 * | 3/2010 | Kato et al. | 427/569 |
| 2010/0075499 A1 | 3/2010 | Olsen | |
| 2010/0101728 A1 * | 4/2010 | Iwasaki | 156/345.33 |
| 2010/0102417 A1 | 4/2010 | Ganguli et al. | |
| 2010/0247767 A1 * | 9/2010 | Chen et al. | 427/255.23 |
| 2011/0052833 A1 * | 3/2011 | Hanawa et al. | 427/534 |
| 2011/0098841 A1 * | 4/2011 | Tsuda | 700/117 |
| 2011/0223334 A1 * | 9/2011 | Yudovsky et al. | 427/255.23 |
| 2011/0230008 A1 * | 9/2011 | Lakshmanan et al. | 438/96 |
| 2011/0253044 A1 * | 10/2011 | Tam et al. | 118/666 |
| 2011/0315079 A1 * | 12/2011 | Perpar et al. | 118/716 |
| 2012/0000422 A1 * | 1/2012 | Lam et al. | 118/715 |
| 2012/0052216 A1 * | 3/2012 | Hanawa et al. | 427/582 |
| 2012/0073501 A1 * | 3/2012 | Lubomirsky et al. | 118/723 E |
| 2012/0122302 A1 * | 5/2012 | Weidman et al. | 438/478 |
| 2012/0180954 A1 * | 7/2012 | Yang et al. | 156/345.34 |

FOREIGN PATENT DOCUMENTS

| | | |
|---|---|---|
| JP | 01-149964 | 6/1989 |
| JP | 2004-247538 | 9/2004 |
| KR | 2001-0035563 | 5/2001 |

OTHER PUBLICATIONS

European Search Report Application No. 09774542.6 dated Jan. 26, 2012.

* cited by examiner

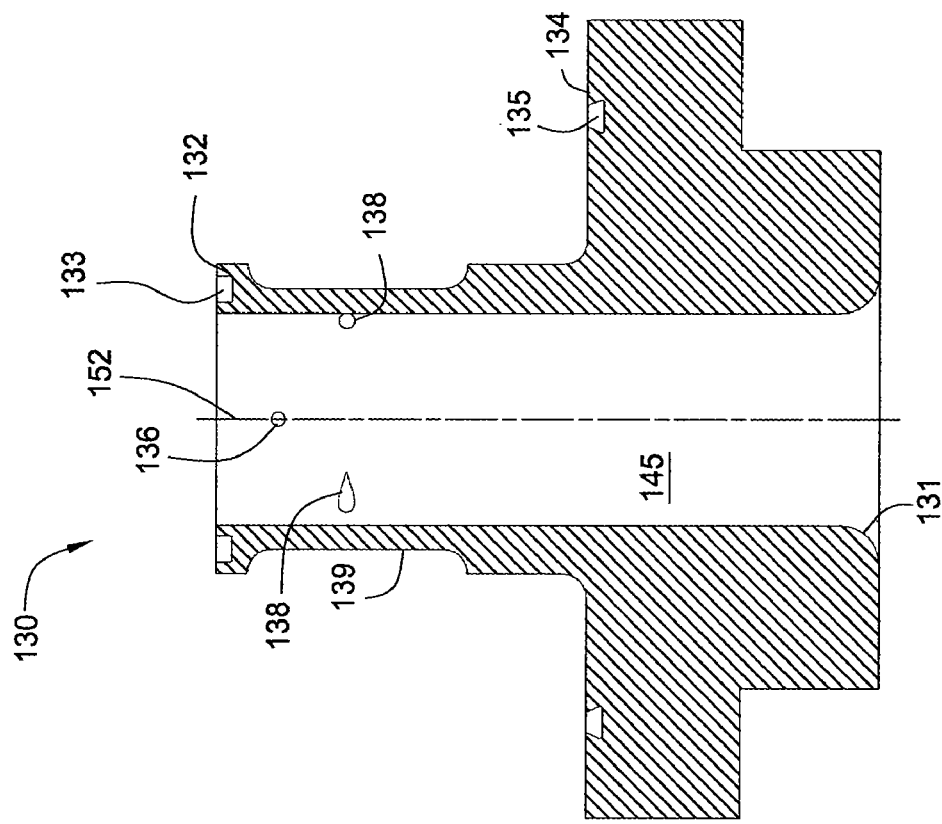
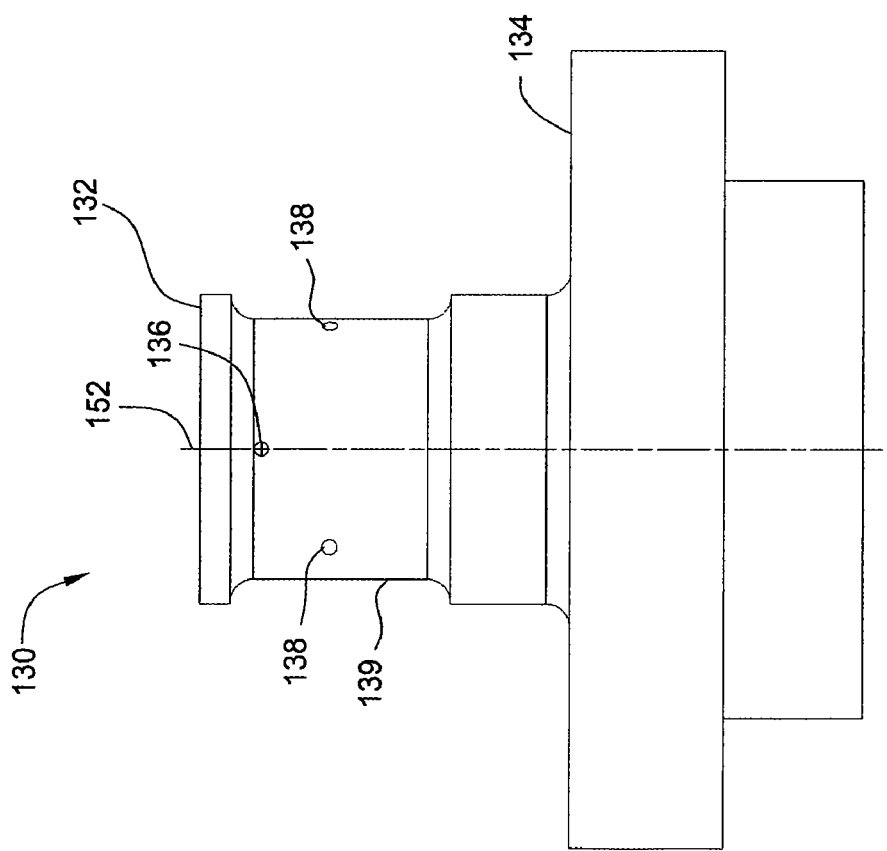

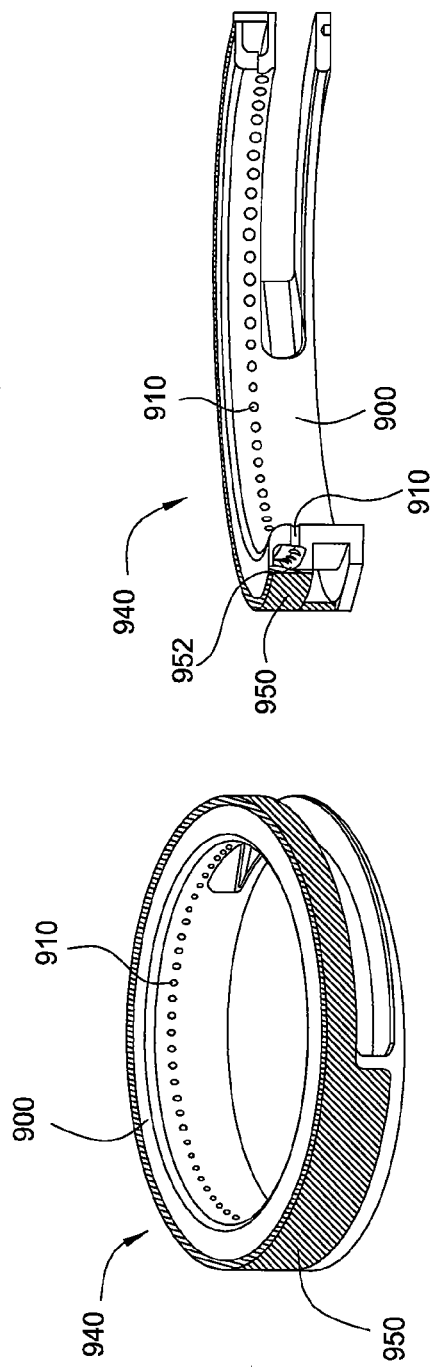
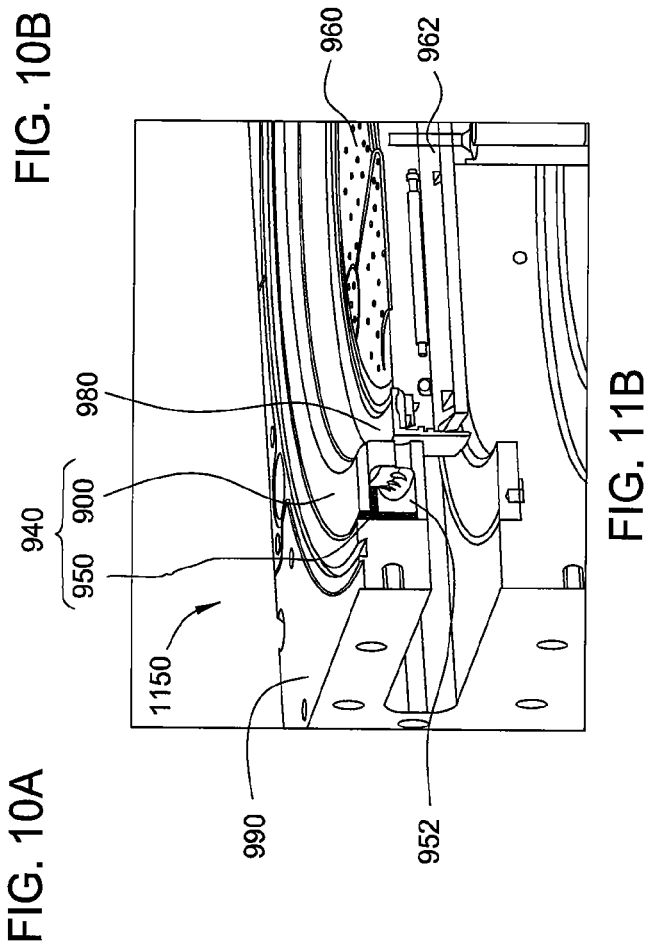

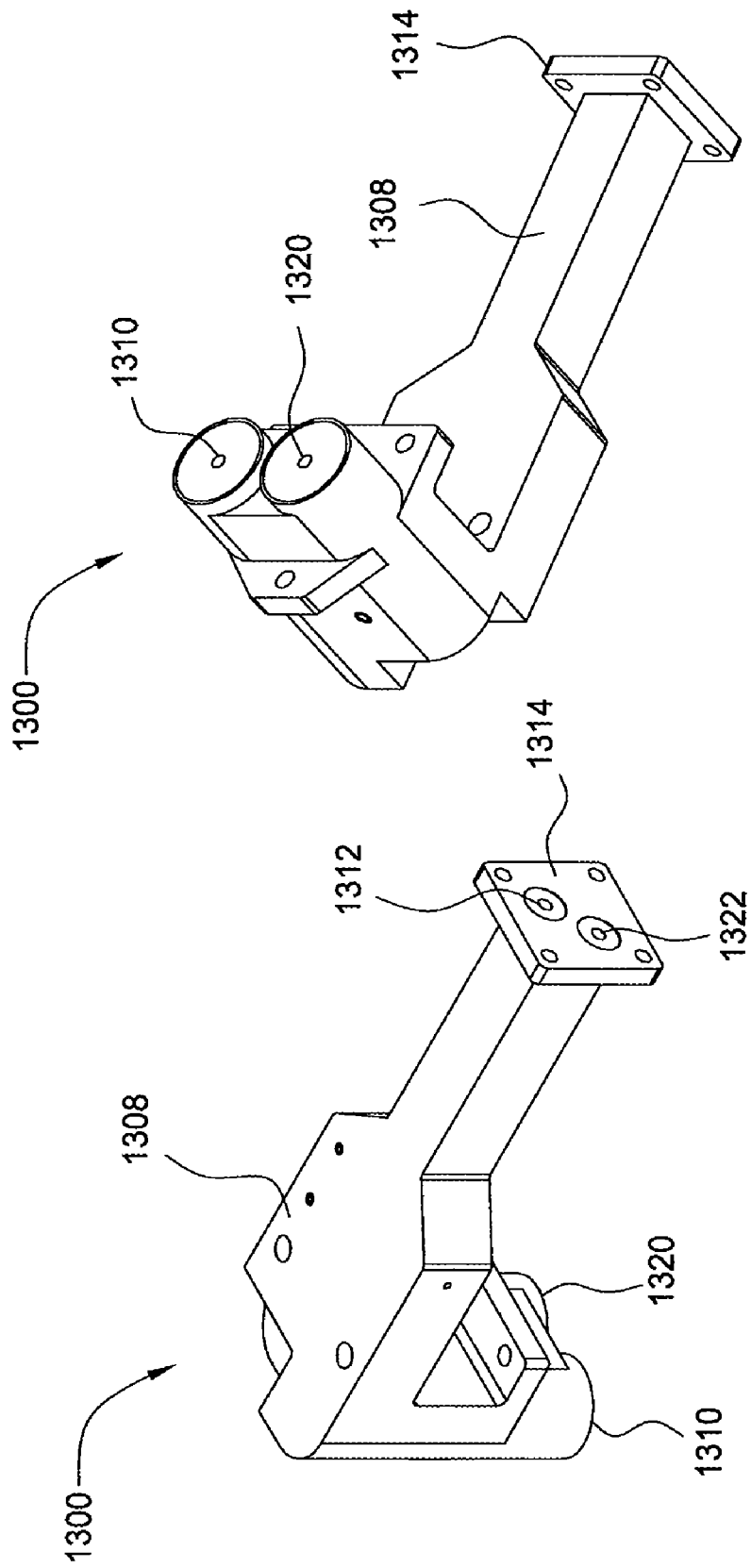

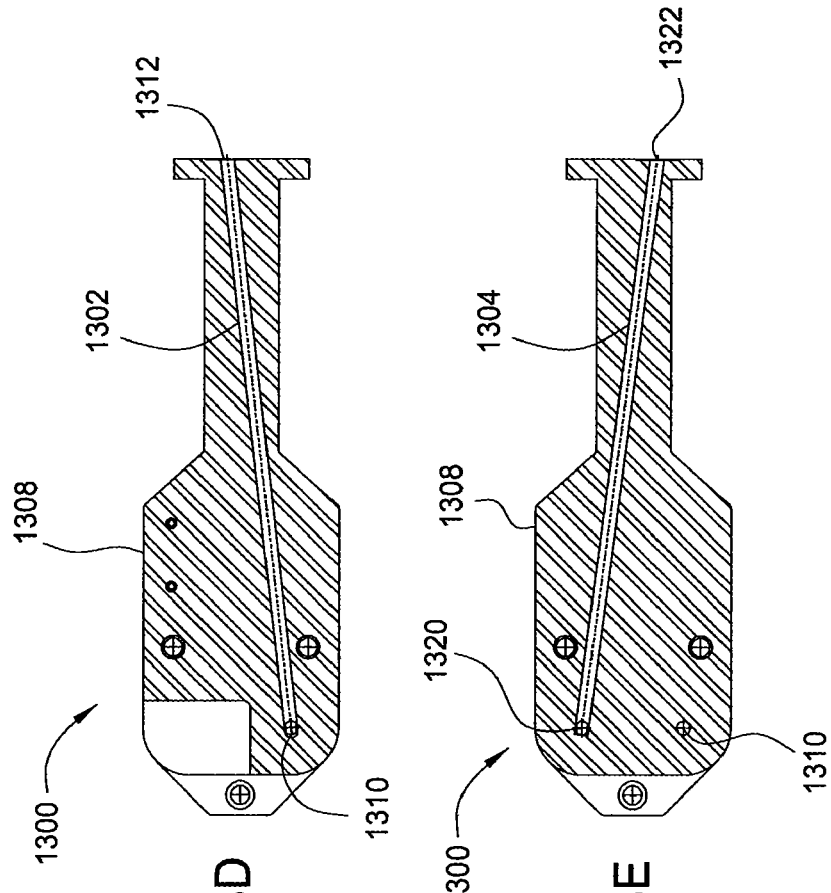
FIG. 13D
FIG. 13E
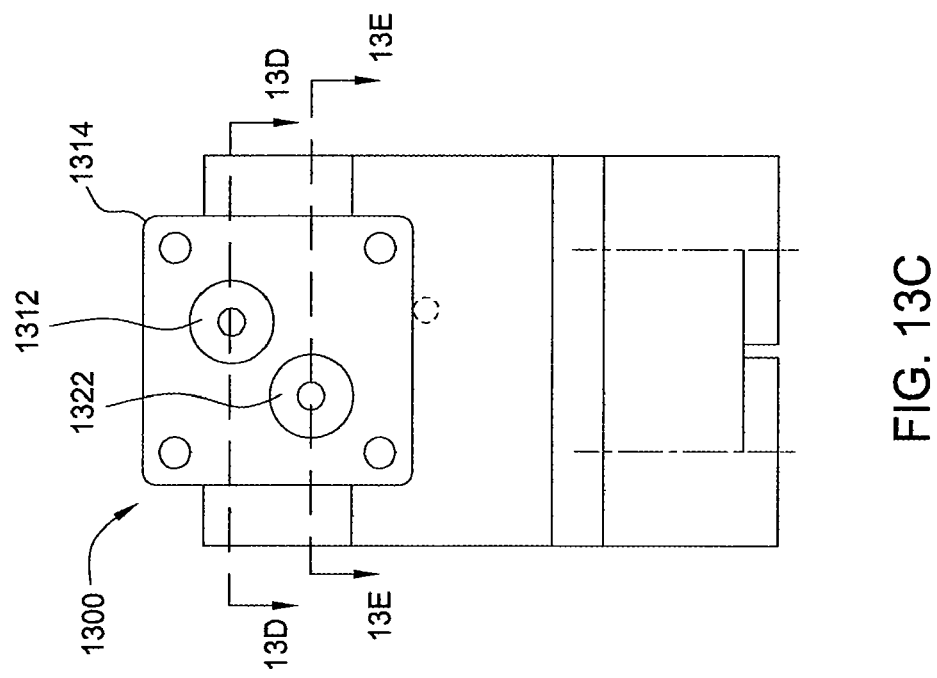
FIG. 13C

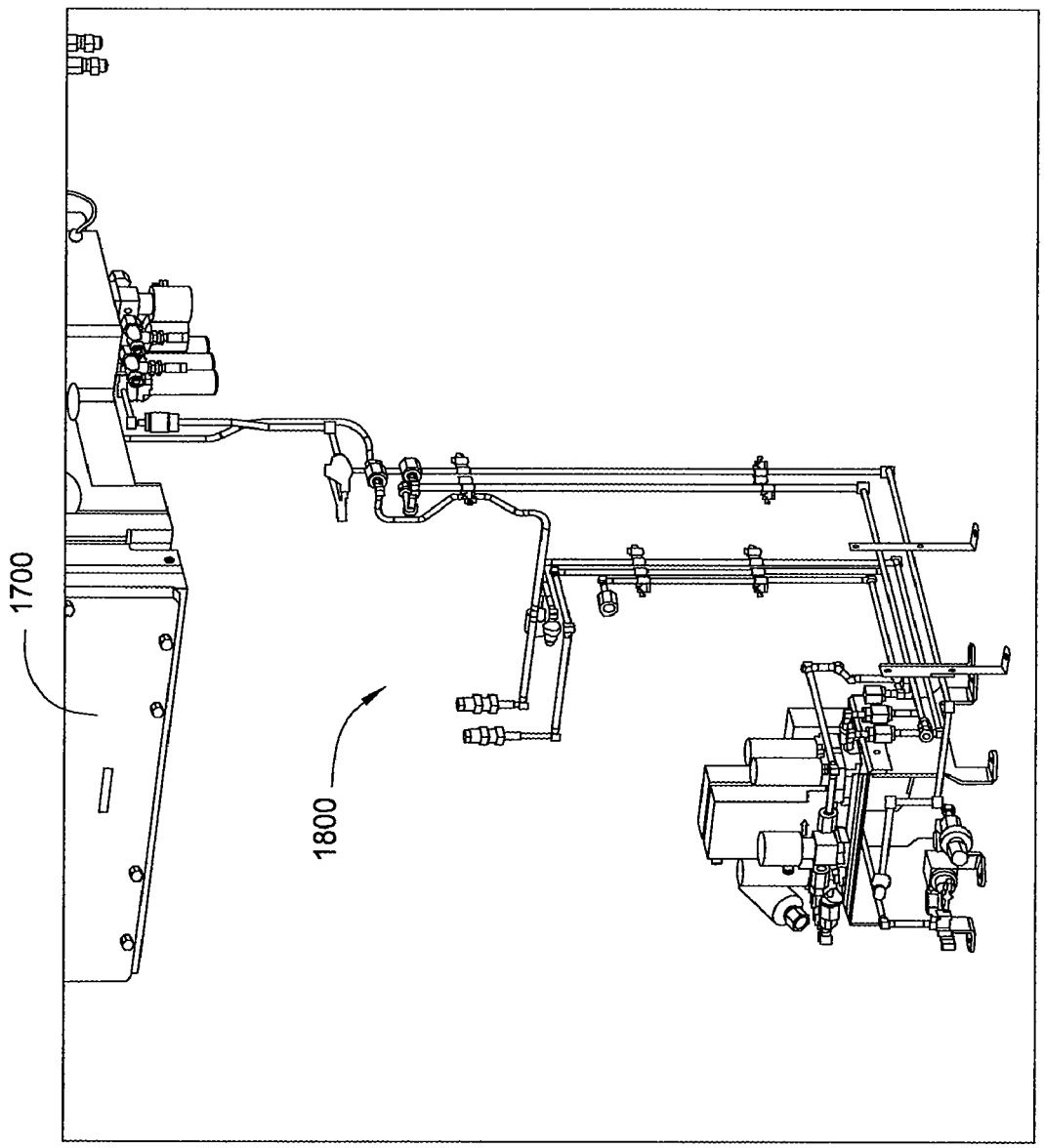

APPARATUSES AND METHODS FOR ATOMIC LAYER DEPOSITION

CROSS-REFERENCE TO RELATED APPLICATION

This application claims benefit of U.S. Ser. No. 61/078,321 (APPM/012913L), filed Jul. 3, 2008, which is herein incorporated by reference in its entirety.

BACKGROUND OF THE INVENTION

1. Field of the Invention

Embodiments of the invention generally relate to an apparatus and a method for depositing materials, and more particularly to an atomic layer deposition chamber configured to deposit a material during a plasma-enhanced process.

2. Description of the Related Art

In the field of semiconductor processing, flat-panel display processing or other electronic device processing, vapor deposition processes have played an important role in depositing materials on substrates. As the geometries of electronic devices continue to shrink and the density of devices continues to increase, the size and aspect ratio of the features are becoming more aggressive, e.g., feature sizes of 0.07 μm and aspect ratios of 10 or greater. Accordingly, conformal deposition of materials to form these devices is becoming increasingly important.

While conventional chemical vapor deposition (CVD) has proved successful for device geometries and aspect ratios down to 0.15 μm, the more aggressive device geometries require an alternative deposition technique. One technique that is receiving considerable attention is atomic layer deposition (ALD). During an ALD process, reactant gases are sequentially introduced into a deposition chamber containing a substrate. Generally, a first reactant is pulsed into the deposition chamber and is adsorbed onto the substrate surface. A second reactant is pulsed into the deposition chamber and reacts with the first reactant to form a deposited material. A purge step is typically carried out between the delivery of each reactant gas. The purge step may be a continuous purge with the carrier gas or a pulse purge between the delivery of the reactant gases. Thermally induced ALD processes are the most common ALD technique and use heat to cause the chemical reaction between the two reactants. While thermal ALD processes work well to deposit some materials, the processes often have a slow deposition rate. Therefore, fabrication throughput may be impacted to an unacceptable level. The deposition rate may be increased at a higher deposition temperature, but many chemical precursors, especially metal-organic compounds, decompose at elevated temperatures.

Plasma-enhanced ALD (PE-ALD) may be used to form various materials. In some examples of PE-ALD processes, a material may be formed from the same chemical precursors as a thermal ALD process, but at a higher deposition rate and a lower temperature. Although several variations of techniques exist, in general, a PE-ALD process provides that a reactant gas and a reactant plasma are sequentially introduced into a deposition chamber containing a substrate. The first reactant gas is pulsed into the deposition chamber and is adsorbed onto the substrate surface. Thereafter, the reactant plasma is pulsed into the deposition chamber and reacts with the first reactant gas to form a deposited material. Similarly to a thermal ALD process, a purge step may be conducted between the delivery of each of the reactants. While PE-ALD processes overcome some of the shortcomings of thermal ALD processes due to the high degree of reactivity of the reactant radicals within the plasma, PE-ALD processes have many limitations. PE-ALD process may cause plasma damage to a substrate (e.g., etching), be incompatible with certain chemical precursors and require additional hardware.

Therefore, there is a need for an apparatus and a process for depositing a material on a substrate by a vapor deposition technique, such as by a PE-ALD process.

SUMMARY OF THE INVENTION

Embodiments of the invention provide an apparatus and a method for depositing a material on a substrate during atomic layer deposition (ALD) processes, such as a thermal ALD process or a plasma-enhanced ALD (PE-ALD) process. In some embodiments, a deposition chamber for PE-ALD processes is provided which includes a substrate support containing a substrate receiving surface and disposed within a chamber body, a chamber lid assembly coupled with the chamber body, and a processing region disposed between the substrate receiving surface and a lower surface of a showerhead plate.

In one embodiment, the chamber lid assembly has an inlet manifold assembly containing an annular channel encompassing a centralized channel, wherein the centralized channel extends through the inlet manifold assembly, and the inlet manifold assembly further contains injection holes extending from the annular channel, through a sidewall of the centralized channel, and to the centralized channel. The chamber lid assembly further contains a showerhead assembly having the showerhead plate disposed below the inlet manifold assembly, a water box disposed between the inlet manifold assembly and the showerhead assembly, and a remote plasma system (RPS) disposed above and coupled with the inlet manifold assembly, and in fluid communication with the centralized channel.

The inlet manifold assembly may contain or be made from aluminum or an aluminum alloy. In some examples, the inlet manifold assembly contains an aluminum alloy, such as an aluminum alloy containing magnesium and silicon.

In some embodiments, the injection holes have a first plurality of injection holes extending towards or substantially towards a central axis of the centralized channel. The injection holes may also have a second plurality of injection holes that usually extend at a different angle than the first plurality of holes. In some examples, the second plurality of injection holes extend tangential or substantially tangential towards the sidewall of the centralized channel. The second plurality of injection holes may be disposed along the sidewall of the centralized channel and between the first plurality of injection holes and the showerhead assembly. Generally, the second plurality of injection holes may extend away from or substantially away from the centralized channel. In one example, the first plurality of injection holes contains three or more injection holes. In another example, the second plurality of injection holes contains three or more injection holes. Each injection hole may have a diameter within a range from about 0.06 inches to about 0.12 inches.

Embodiments provide that the chamber may further contain a gas manifold assembly coupled with and in fluid communication with the inlet manifold assembly. The gas manifold assembly may have a first conduit coupled with and in fluid communication with the annular channel. A valve assembly may be coupled with and in fluid communication with the first conduit. In one example, the valve assembly may contain a mass flow controller (MFC) to enable an ALD deposition process. The gas manifold assembly may also have a second conduit coupled with and in fluid communication with the annular channel. Alternatively, the gas manifold assembly may have a second conduit coupled with and in fluid communication with the RPS. The RPS is usually disposed at the upper end of the centralized channel while the showerhead assembly is disposed at the lower end of the centralized channel.

In another embodiment, a method for depositing a material on a substrate is provided which includes exposing the substrate sequentially to a titanium precursor gas and a nitrogen plasma to form a titanium nitride material on the substrate during an ALD process within a deposition chamber. In some examples, the titanium precursor gas contains tetrakis(dimethylamido)titanium and the nitrogen plasma is generated from a RPS. The deposition chamber contains a chamber lid assembly coupled with a chamber body. The chamber lid assembly has an inlet manifold assembly containing an annular channel encompassing a centralized channel. The centralized channel extends through the inlet manifold assembly.

In one embodiment, the ALD process includes flowing the titanium precursor gas into the annular channel within the inlet manifold assembly, flowing the titanium precursor gas from the annular channel into the centralized channel via a plurality of injection holes which extend from the annular channel through a sidewall of the centralized channel, and to the centralized channel, flowing the titanium precursor gas through the centralized channel, through a showerhead assembly attached with the chamber lid assembly, and absorbing a layer of the tetrakis(dimethylamido)titanium on the substrate. The method of the ALD process further provides generating the nitrogen plasma by igniting a process gas containing nitrogen ($N_2$) with the RPS, flowing the nitrogen plasma through the centralized channel, through the showerhead assembly, and towards the substrate, and exposing the layer of the tetrakis(dimethylamido)titanium to the nitrogen plasma to form the titanium nitride material on the substrate.

In some embodiments, the method provides flowing the titanium precursor gas from a first plurality of injection holes towards or substantially towards a central axis of the centralized channel. In other embodiments, the method provides flowing the titanium precursor gas from a second plurality of injection holes extending tangential or substantially tangential towards the sidewall of the centralized channel. Alternatively, the method provides flowing the titanium precursor gas through the second plurality of injection holes to form a circular gas flow of the titanium precursor gas through the centralized channel. In several embodiments, the circular flow pattern of the titanium precursor gas or the nitrogen plasma may be a flow pattern such as a vortex flow pattern, a helix flow pattern, a spiral flow pattern, a swirl flow pattern, a twirl flow pattern, a twist flow pattern, a coil flow pattern, a corkscrew flow pattern, a curl flow pattern, a whirlpool flow pattern, or a derivative thereof. In some examples, the first plurality of injection holes contains three or more injection holes and/or the second plurality of injection holes contains three or more injection holes.

In another embodiment, a showerhead assembly for a vapor deposition process is provided which includes a showerhead plate having a top surface, a bottom surface, and a radius extending from the center to the outer edge of the showerhead plate, a first plurality of holes in fluid communication with the top surface and the bottom surface, positioned within a first zone extending from the center of the showerhead plate to about 25% of the radius of the showerhead plate, and each hole has a diameter of less than 0.1 inches, and a second plurality of holes in fluid communication with the top surface and the bottom surface, positioned within a second zone extending from about 25% of the radius of the showerhead plate to about the outer edge of the showerhead plate, and each hole has a diameter of greater than 0.1 inches.

In some examples, the diameter of the first plurality of holes may be about 0.09 inches or less. The diameter of the second plurality of holes may be about 0.11 inches or greater, such as about 0.12 inches or greater, such as about 0.13 inches or greater. In other examples, the showerhead plate may have an increasing hole density radially extending towards the outer edge. The showerhead plate may contain or be made from aluminum, aluminum alloys, aluminum-plated metals, stainless steel, nickel, nickel alloys, nickel-plated aluminum, nickel-plated metal, chromium, iron, alloys thereof, derivatives thereof, or combinations thereof. In some examples, the showerhead plate contains an aluminum alloy, such as an aluminum alloy containing magnesium and silicon.

In other embodiments, the showerhead plate contains a lower hole density at the center of the showerhead plate and a higher hole density at the edge of the showerhead plate. These lower/higher hole densities help to direct more nitrogen plasma or nitrogen radicals to edge of the showerhead plate for better uniformity as gas inlet was located in the center position. In addition, gradual change of hole sizes from small to large at center to edge of showerhead plate. In another aspect, the showerhead plate may contain holes with a diameter within a range from about 0.08 inches to about 0.13 inches. This hole size reduces the recombination of nitrogen radicals, which improves the film properties.

BRIEF DESCRIPTION OF THE DRAWINGS

So that the manner in which the features of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIGS. 3A-3D depict a lower inlet manifold as described in embodiments herein;

FIGS. 10A-10B depict schematic views of a pumping ring assembly as described in some embodiments herein;

FIG. 11B depicts a schematic and partial view of an alternative chamber body assembly as described in other embodiments herein;

FIGS. 13A-13E depict schematic views of a gas manifold assembly as described in embodiments herein;

FIGS. 18A-18B depict schematic views of a gas purge assembly as described in embodiments herein.

DETAILED DESCRIPTION

Deposition Chamber

Embodiments of the invention provide an apparatus configured to form materials during atomic layer deposition (ALD) processes, such as a thermal ALD process or a plasma-enhanced ALD (PE-ALD) process. Other embodiments of the invention provide ALD and PE-ALD processes for forming various materials, such as titanium nitride. In some embodiments, a processing system or chamber is configured to expose a substrate to a sequence of gases and plasmas during a PE-ALD process. In one embodiment, a deposition chamber is configured to perform a PE-ALD process using a remote plasma system (RPS) for igniting the plasma. In another embodiment, the deposition chamber is configured to perform a thermal ALD process.

Figure 1:
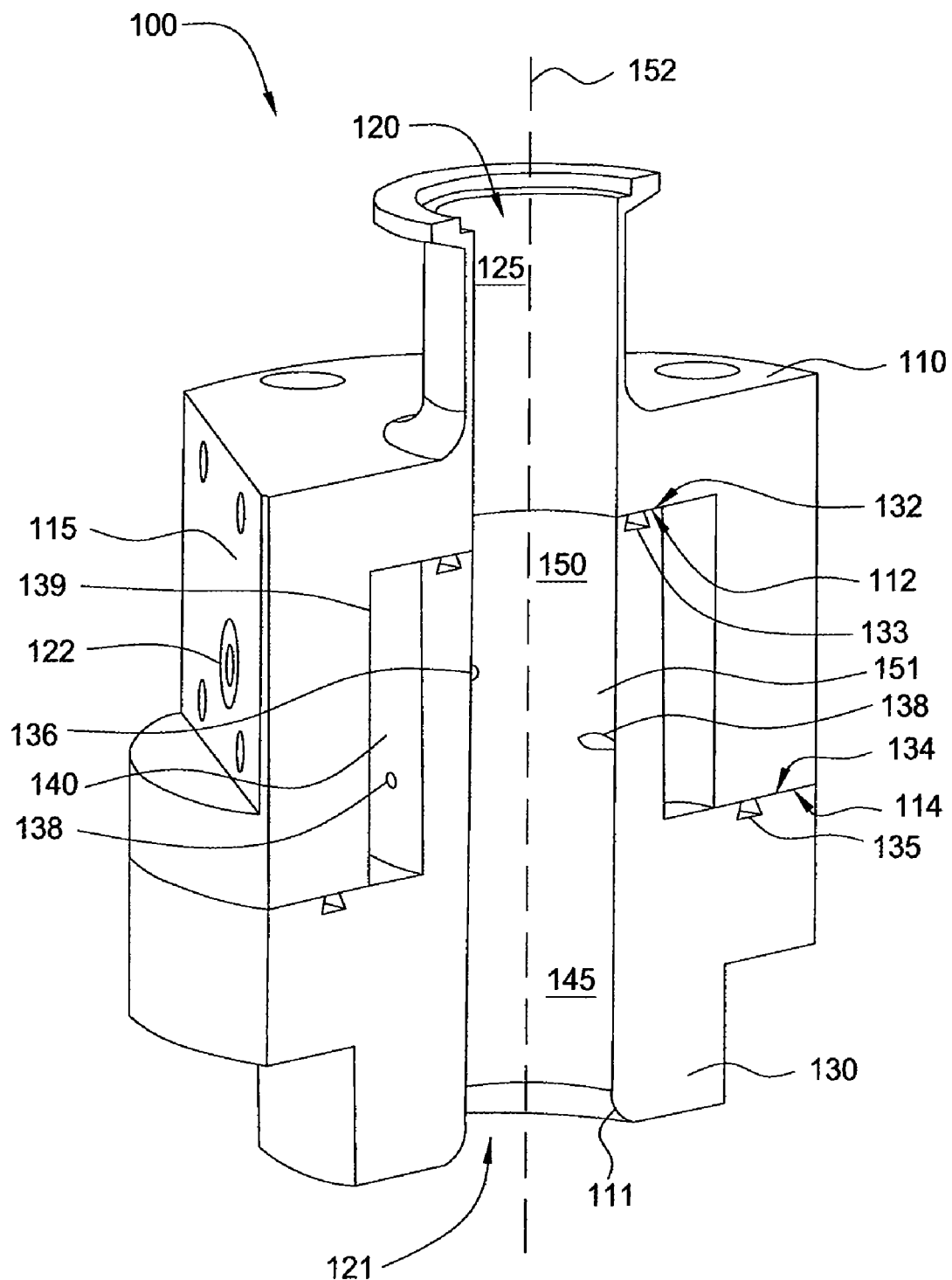
FIG. 1 depicts an inlet manifold assembly as described in embodiments herein.

FIG. 1 depicts inlet manifold assembly 100 which may be utilized within or by thermal or plasma-enhanced ALD systems, chambers, and processes, such as described herein. Inlet manifold assembly 100 contains upper inlet manifold 110 and lower inlet manifold 130. Upper inlet manifold 110 and lower inlet manifold 130 may each independently contain or be formed from a metal such as aluminum, aluminum alloys, aluminum-plated metals, steel, stainless steel, nickel, nickel alloys (such as INCONEL® or HASTELLOY®), nickel-plated aluminum, nickel-plated metal, chromium, iron, alloys thereof, derivatives thereof, or combinations thereof. In one embodiment, both upper inlet manifold 110 and lower inlet manifold 130 contain or are formed from aluminum or an aluminum alloy, for example, an aluminum alloy containing magnesium and silicon, such as aluminum 6061.

The aluminum alloy may contain silicon, magnesium, iron, copper, and other elements, such as manganese, chromium, zinc, or titanium. In some embodiments, the aluminum alloy may have a concentration by weight of aluminum within a range from about 95% to about 99%, magnesium within a range from about 0.8% to about 1.2%, silicon within a range from about 0.4% to about 0.8%, copper within a range from about 0.15% to about 0.40%, and iron within a range from about 0.2% to about 0.70%. In one example, an aluminum alloy may have the following composition by weight: Mg (1.00% less), Si (0.60%), Cu (0.30%), Fe (0.7% or less), Mn (0.15%), Cr (0.20%), Zn (0.25% or less), Ti (0.15% or less), and Al (balance). In another example, the aluminum alloy may be aluminum 6061.

Figure 2A:
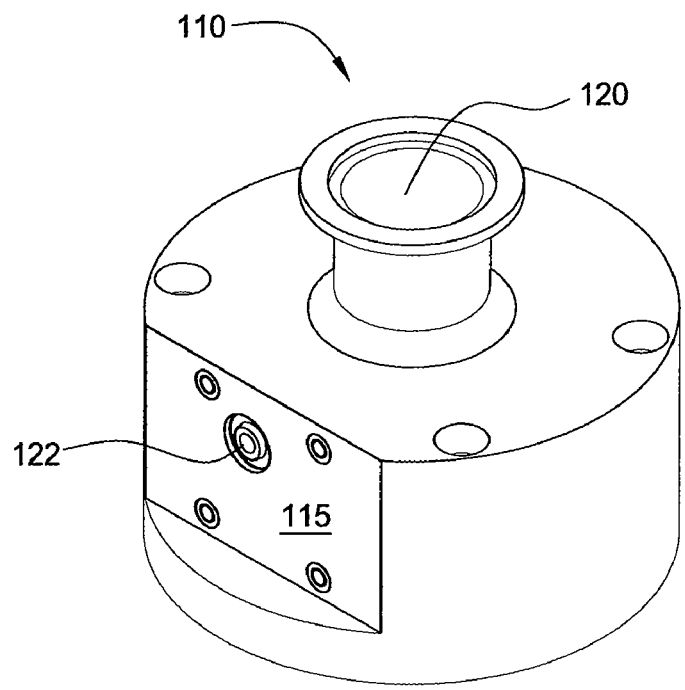
FIGS. 2A-2C depict an upper inlet manifold as described in embodiments herein.
Figure 2B:
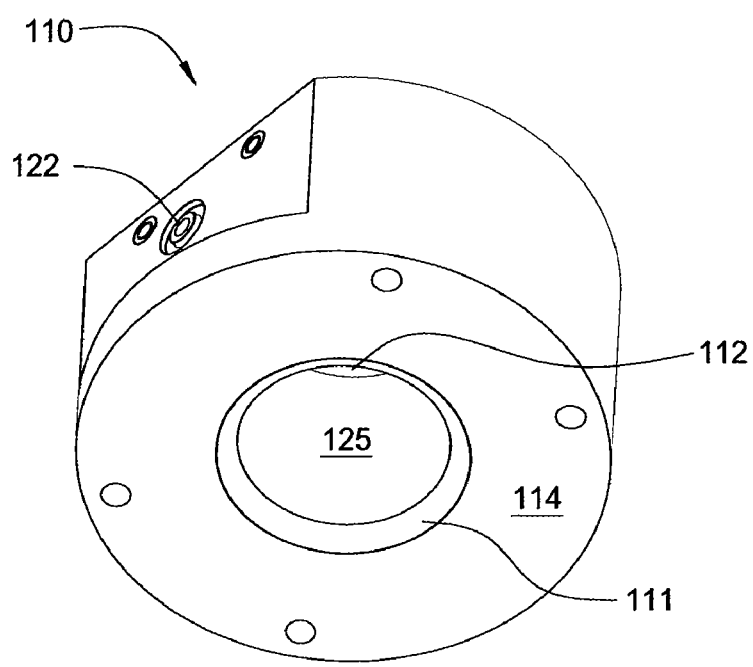
Figure 2C:
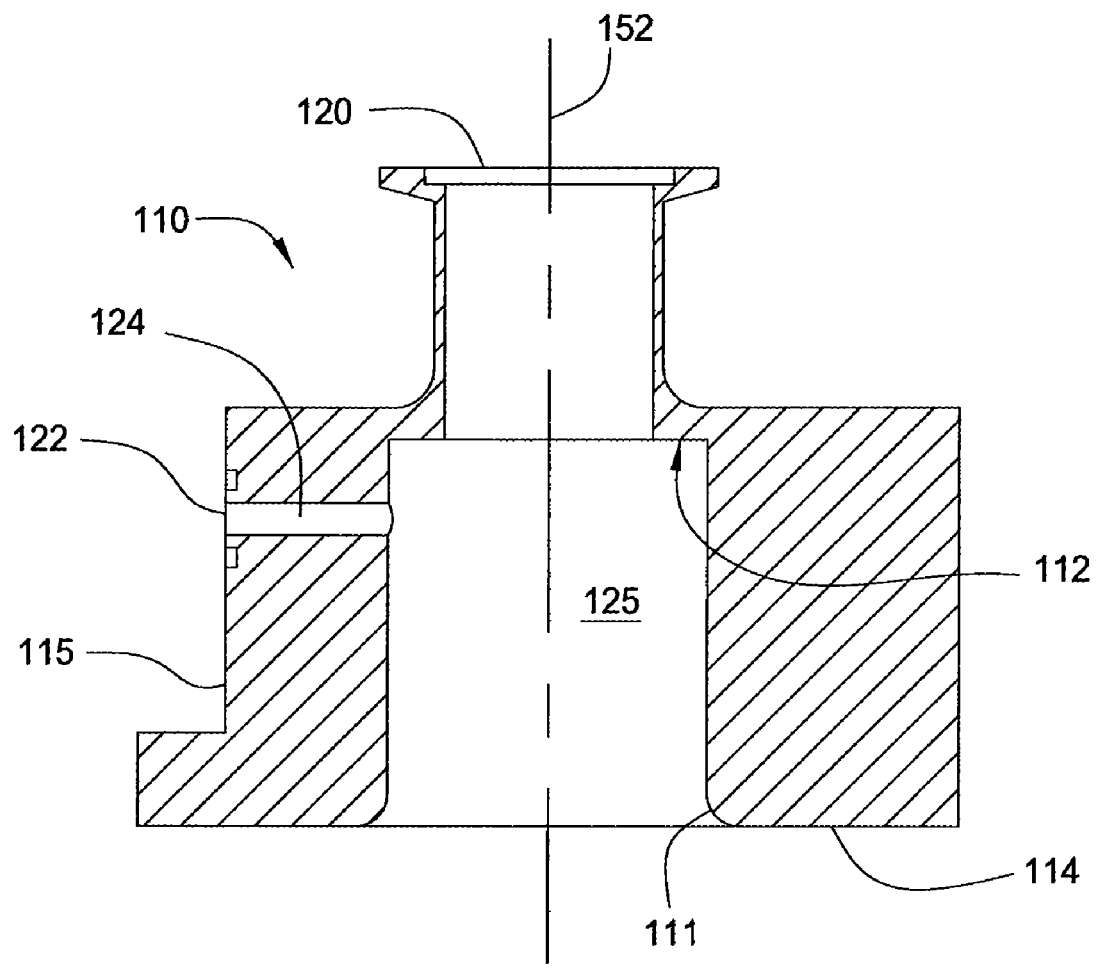
Figure 3B:
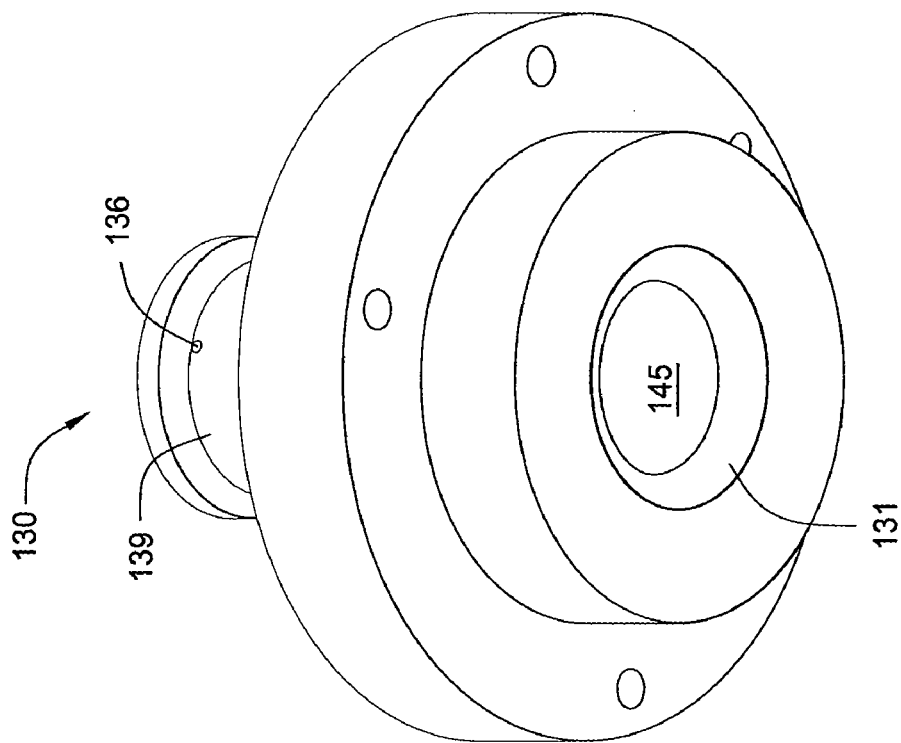
Figure 3A:
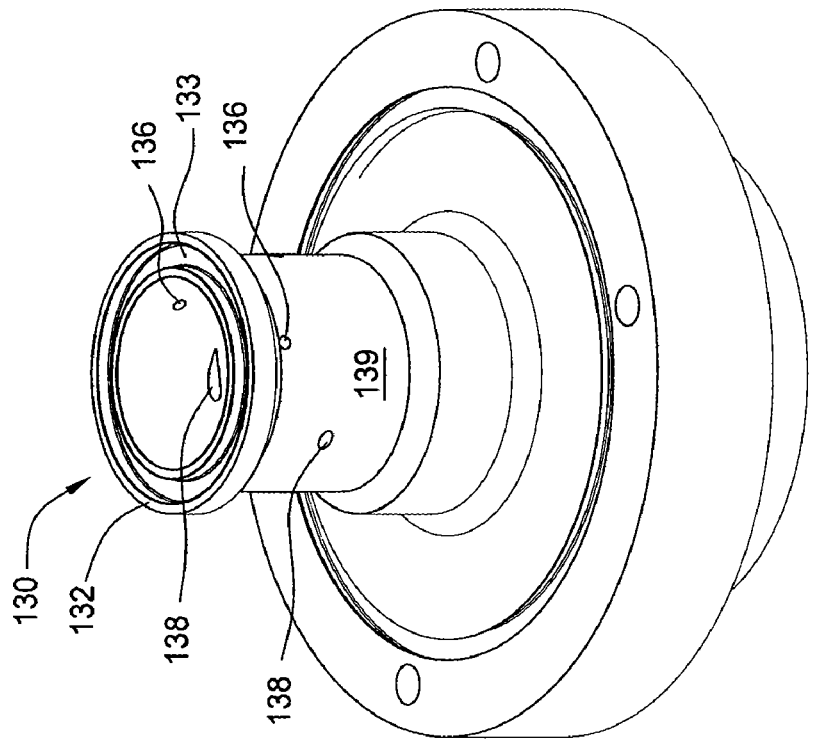

Upper inlet manifold 110 is further illustrated in FIGS. 2A-2C and lower inlet manifold 130 is further illustrated in FIGS. 3A-3D. Upper inlet manifold 110 may be disposed on top of and partially over lower inlet manifold 130. Lower surfaces 112 and 114 of upper inlet manifold 110 may be respectively disposed on upper surfaces 132 and 134 of lower inlet manifold 130. Upper surface 132 contains groove 133 and upper surface 134 contains groove 135. Grooves 133 and 135 may each contain an o-ring, which is used to form a seal between lower surface 112 and upper surface 132, as well, between lower surface 114 and upper surface 134. Annular channel 140 is formed between upper inlet manifold 110 and lower inlet manifold 130. Annular channel 140 encircles or encompasses centralized channel 150, which is formed through upper inlet manifold 110 and lower inlet manifold 130.

Centralized channel 150 contains channel 125 within upper inlet manifold 110 and channel 145 within lower inlet manifold 130. Centralized channel 150 may have an inner diameter which stays fairly consistent along central axis 152. In one embodiment, the inner diameter of centralized channel 150 for a chamber adapted to process a 300 mm diameter substrate is within a range from about 0.2 inches to about 2 inches, preferably, from about 1 inch to about 1.8 inches, and more preferably, from about 1.2 inches to about 1.5 inches, for example, about 1.4 inches.

Upper inlet manifold 110 contains inlet 120 and outlet 121, which are aligned with central axis 152 and in fluid communication with centralized channel 150. A remote plasma system (RPS) may be fluidly coupled to inlet 120. Upper inlet manifold 110 contains inlet 122 extending from outside sidewall 115 of upper inlet manifold 110, through upper inlet manifold 110, and into annular channel 140. In one example, upper inlet manifold 110 may also contain tapered surface 111 at outlet 121.

Figure 4B:
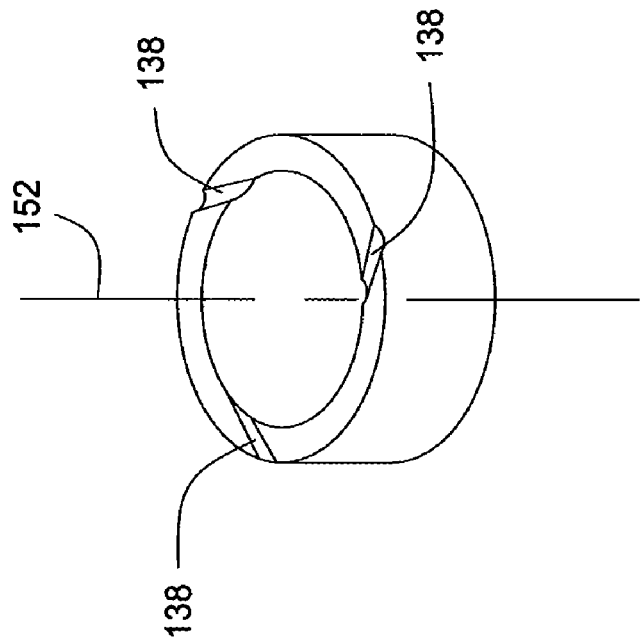
FIGS. 4A-4B depict schematic views of a portion of the lower inlet manifold as described in embodiments herein.
Figure 4A:
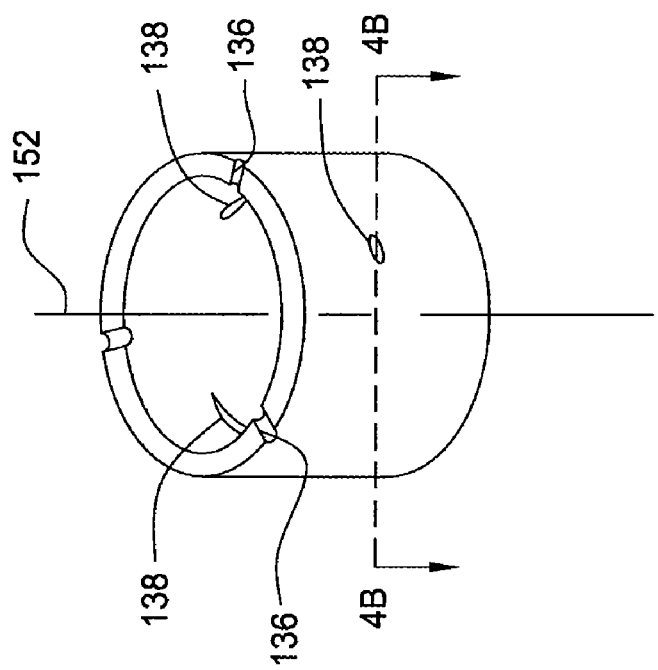

In one embodiment, lower inlet manifold 130 contains injection holes 136 and injection holes 138. Both sets of injection holes 136 and 138 extend through sidewall 139 of lower inlet manifold 130 and provide fluid communication between annular channel 140 and centralized channel 150. FIGS. 4A-4B provide a schematic view of a portion of lower inlet manifold 130 depicting injection holes 136 and 138, as described by one embodiment herein. In some embodiments, injection holes 136 may be positioned directly towards or substantially towards central axis 152 extending through the middle of centralized channel 150, as depicted in FIG. 4A. Injection holes 138 are positioned tangentially towards or substantially tangentially towards sidewall 151 of centralized channel 150, as depicted in FIG. 4B.

Throughout the embodiments, there is at least one injection hole 136 and at least one injection hole 138. As depicted in FIGS. 4A-4B, lower inlet manifold 130 contains three holes for injection holes 136 and three holes for injection holes 138. In other embodiments, lower inlet manifold 130 may contain 1, 2, 3, 4, 5, 6, or more injections holes 136 and independently contain 1, 2, 3, 4, 5, 6, or more injections holes 138. Injection holes 136 and 138 may independently have a diameter within a range from about 0.02 inches to about 0.5 inches, preferably, from about 0.04 inches to about 0.4 inches, preferably, from about 0.05 inches to about 0.2 inches, and more preferably, from about 0.06 inches to about 0.12 inches, and more preferably, from about 0.07 inches to about 0.11 inches. In one example, injection holes 136 have a diameter of about 0.089 inches and injection holes 138 have a diameter of about 0.100 inches Injection holes 138 may be positioned tangentially towards or substantially tangentially towards sidewall 151 of centralized channel 150. A gas flow coming from each of injection holes 138 combines within centralized channel 150 to form a gas flow having a circular direction. Injection holes 136 may be positioned directly towards or substantially towards central axis 152. A gas flow coming from each of injection holes 136 combines within centralized channel 150 at or near central axis 152. The combined gas flow forms a downward gas flow extending down centralized channel 150 towards the formed by injection holes 138. The downward gas flow from injection holes 136 and the circular gas flow from injection holes 138 combine to form a sweeping vortex gas flow that extends down centralized channel 150, along and past rounded corner 131 of lower inlet manifold 130, towards the showerhead. Although the exact geometry of sweeping vortex gas flow through centralized channel 150 is not known, it is believed that the process gas or plasma may travel with a circular gas flow having a flow pattern of a vortex flow pattern, a helix flow pattern, a spiral flow pattern, a swirl flow pattern, a twirl flow pattern, a twist flow pattern, a coil flow pattern, a corkscrew flow pattern, a curl flow pattern, a whirlpool flow pattern, or derivatives thereof.

Figure 5A:
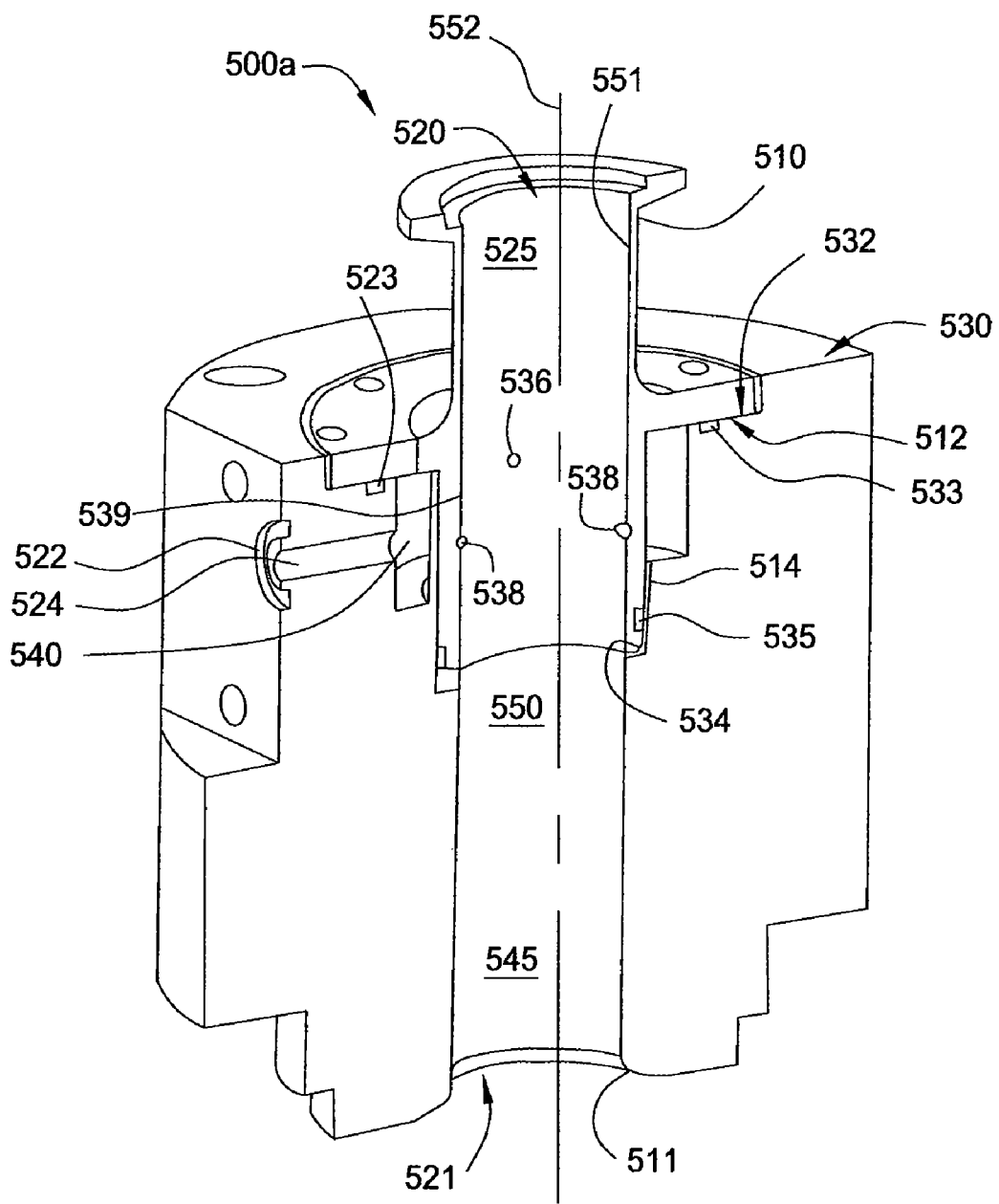
FIG. 5A depicts an alternative inlet manifold assembly as described in another embodiment herein.
Figure 5B:
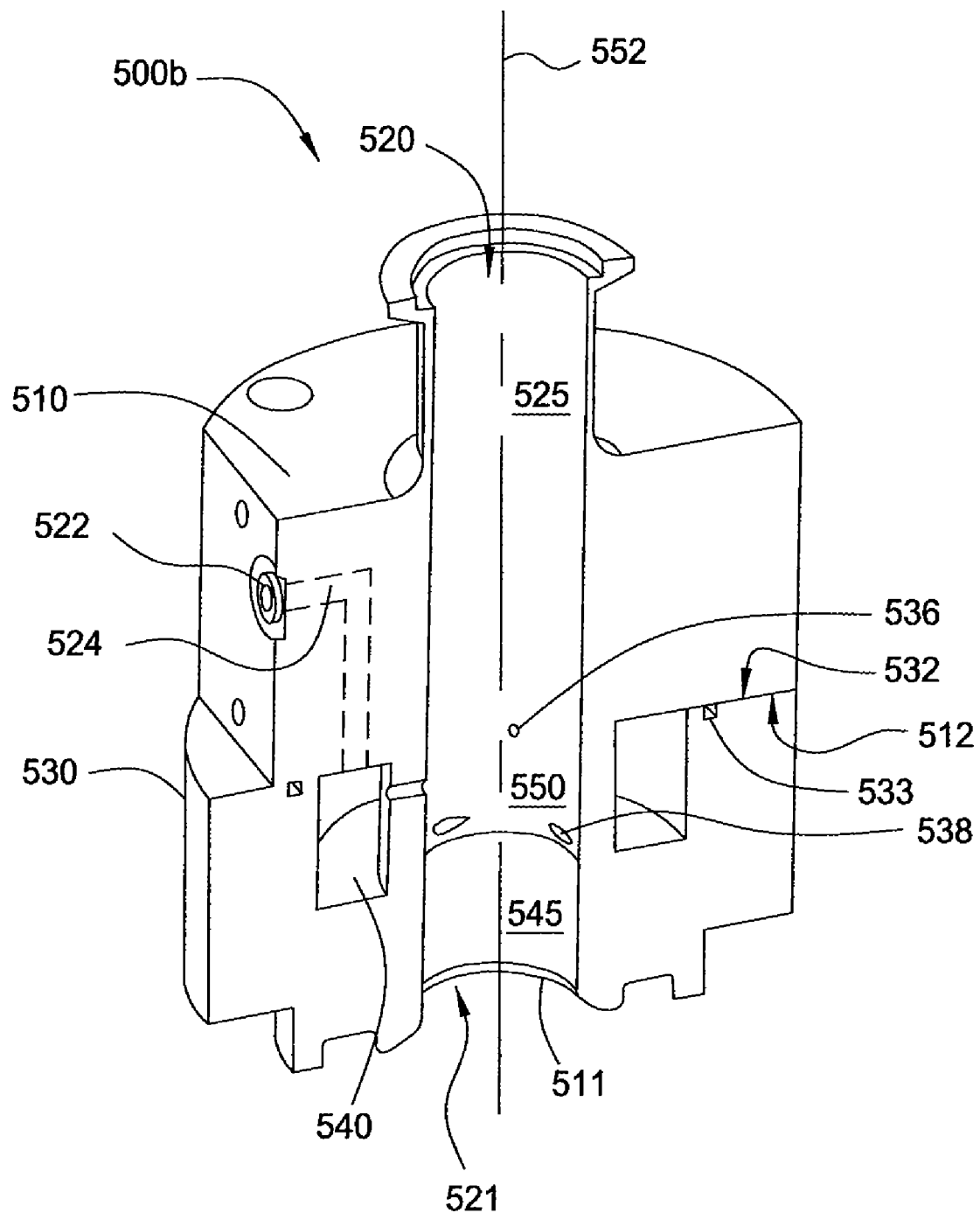
FIG. 5B depicts another alternative inlet manifold assembly as described in another embodiment herein.
Figure 6A:
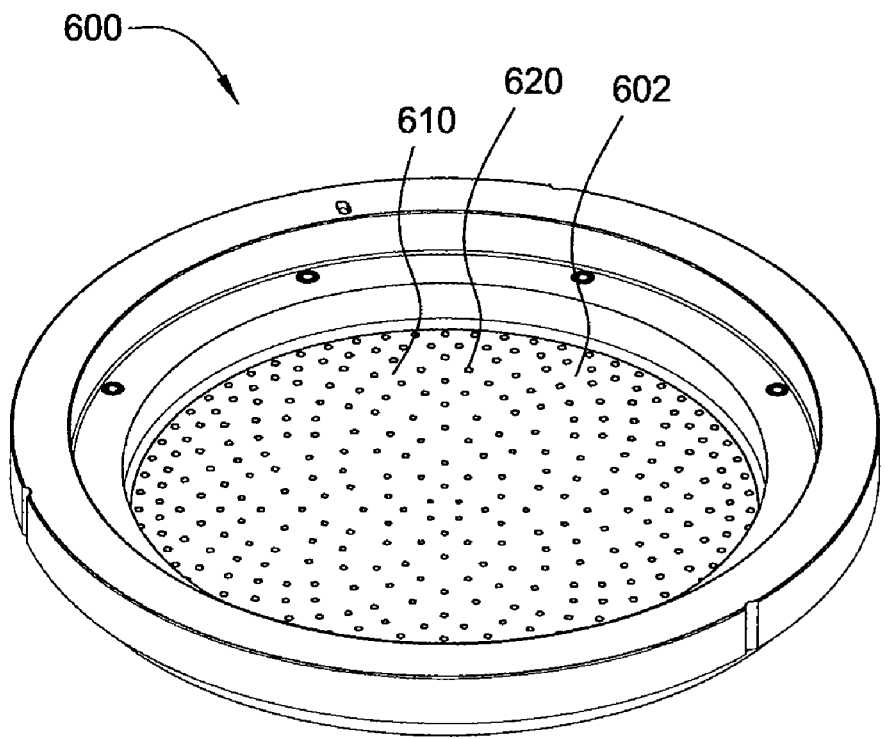
FIGS. 6A-6D depict schematic views of a showerhead assembly as described in embodiments herein.
Figure 6B:
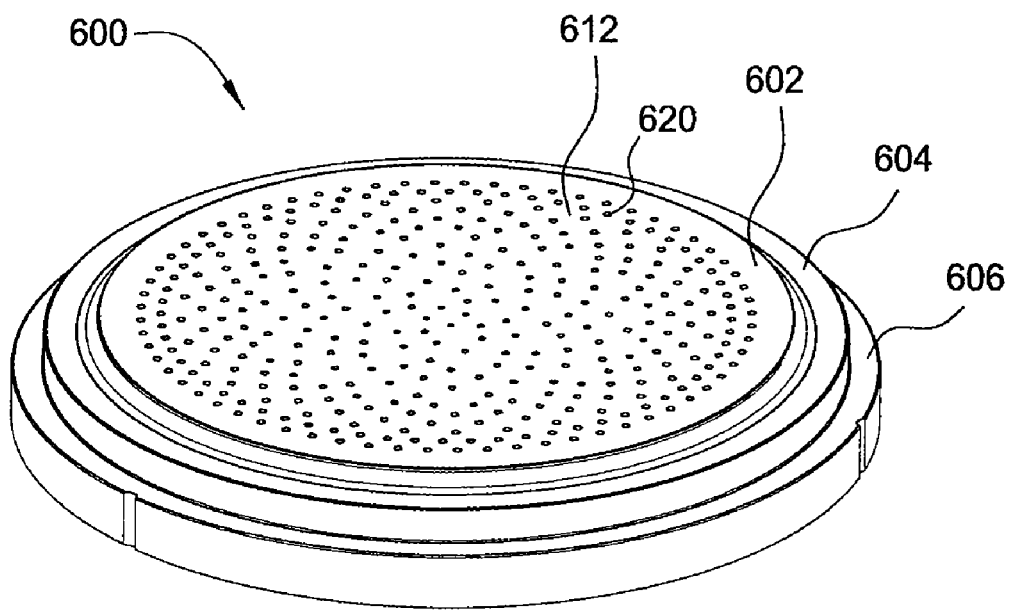
Figure 6C:
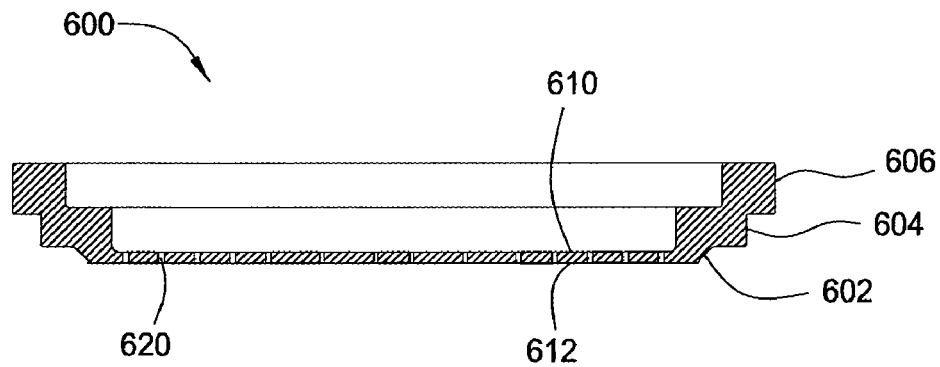
Figure 6D:
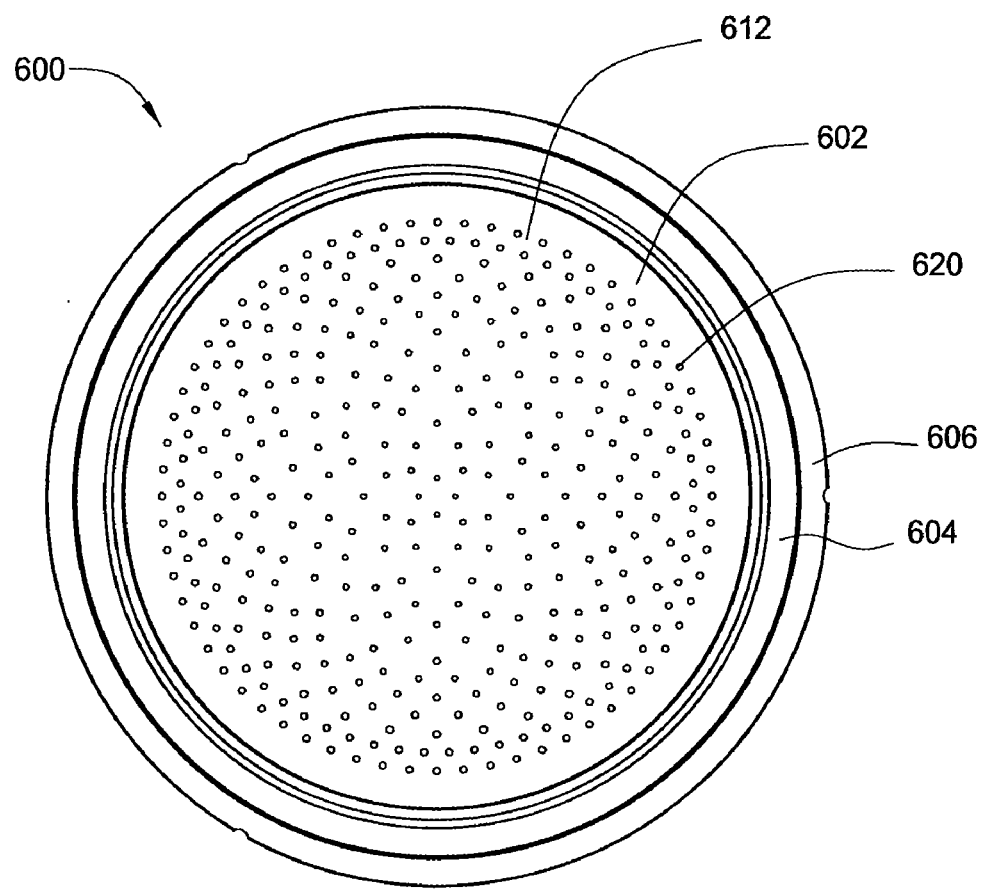

In several alternative embodiments, FIG. 5A depicts inlet manifold assembly 500a and FIG. 5B depicts inlet manifold assembly 500b which may be utilized within or by thermal or plasma-enhanced ALD systems, chambers, and processes, such as described herein. Inlet manifold assemblies 500a and 500b contain upper inlet manifold 510 and lower inlet manifold 530. Upper inlet manifold 510 may be disposed on top of and partially within lower inlet manifold 530. Lower surface 512 of upper inlet manifold 510 may be disposed on upper surface 532 of lower inlet manifold 530. Upper surface 532 contains groove 533. Groove 533 may contain an o-ring, which is used to form a seal between lower surface 512 and upper surface 532. Also, for inlet manifold assembly 500a, side surface 514 of upper inlet manifold 510 may be disposed against side surface 534 of lower inlet manifold 530. Side surface 534 contains groove 535. Groove 535 may contain an o-ring, which is used to form a seal between side surface 514 and side surface 534.

Annular channel 540 is formed between upper inlet manifold 510 and lower inlet manifold 530. Annular channel 540 encircles or encompasses centralized channel 550, which is formed through upper inlet manifold 510 and lower inlet manifold 530. Centralized channel 550 contains upper channel 525 within upper inlet manifold 510 and lower channel 545 within lower inlet manifold 530.

In another embodiment, upper inlet manifold 510 contains injection holes 536 and injection holes 538. Both sets of injection holes 536 and 538 extend through sidewall 539 of upper inlet manifold 510 and provide fluid communication between annular channel 540 and centralized channel 550. FIG. 5A provides a schematic view of a portion of lower inlet manifold 530 depicting injection holes 536 and 538, as described by one embodiment herein. In some embodiments, injection holes 536 are positioned directly towards or substantially towards a central axis extending through the middle of centralized channel 550. Injection holes 538 are positioned tangentially towards or substantially tangentially towards sidewall 551 of centralized channel 550.

Centralized channel 550 contains channel 525 within upper inlet manifold 510 and channel 545 within lower inlet manifold 530. Centralized channel 550 may have an inner diameter which stays fairly consistent along central axis 552. In one embodiment, the inner diameter of centralized channel 550 for a chamber adapted to process a 300 mm diameter substrate is within a range from about 0.2 inches to about 2 inches, preferably, from about 1 inch to about 1.8 inches, and more preferably, from about 1.2 inches to about 1.5 inches, for example, about 1.4 inches.

Upper inlet manifold 510 contains inlet 520 and outlet 521, which are aligned with central axis 552 and in fluid communication with centralized channel 550. A remote plasma system (RPS) may be fluidly coupled to inlet 520. Upper inlet manifold 510 contains inlet 522 extending from outside sidewall 515 of upper inlet manifold 510, through upper inlet manifold 510, and into annular channel 540. In one example, upper inlet manifold 510 may also contain tapered surface 511 at outlet 521.

Upper inlet manifold 510 contains inlet 520, which may be aligned with central axis 552 and in fluid communication with centralized channel 550. A remote plasma system (RPS) may be fluidly coupled to inlet 520. Upper inlet manifold 510 contains inlet 522 extending from outside sidewall 515 of upper inlet manifold 510, through upper inlet manifold 510, and into annular channel 540. In one example, upper inlet manifold 510 may also contain tapered surface 511.

Upper inlet manifold 510 and lower inlet manifold 530 may each independently contain or be formed from a metal such as aluminum, aluminum alloys, aluminum-plated metals, steel, stainless steel, nickel, nickel alloys (such as INCONEL® or HASTELLOY®), nickel-plated aluminum, nickel-plated metal, chromium, iron, alloys thereof, derivatives thereof, or combinations thereof. In one example, both upper inlet manifold 510 and lower inlet manifold 530 independently contain or are formed from aluminum or an aluminum alloy. In some examples, the aluminum alloy contains magnesium and silicon, such as aluminum 6061.

Throughout the embodiments, there is at least one injection hole 536 and at least one injection hole 538. Lower inlet manifold 530 contains 3 injection holes 536 and 3 injection holes 538. In other embodiments, lower inlet manifold 530 may contain 1, 2, 3, 4, 5, 6, or more injections holes 536 and independently contain 1, 2, 3, 4, 5, 6, or more injections holes 538. Injection holes 536 and 538 may independently have a diameter within a range from about 0.02 inches to about 0.5 inches, preferably, from about 0.04 inches to about 0.4 inches, preferably, from about 0.05 inches to about 0.2 inches, and more preferably, from about 0.06 inches to about 0.12 inches, and more preferably, from about 0.07 inches to about 0.11 inches. In one example, injection holes 536 have a diameter of about 0.089 inches and injection holes 538 have a diameter of about 0.100 inches Injection holes 538 may be positioned tangentially towards or substantially tangentially towards sidewall 551 of centralized channel 550. A gas flow coming from each of injection holes 538 combines within centralized channel 550 to form a gas flow having a circular direction. Injection holes 536 may be positioned directly towards or substantially towards central axis 552. A gas flow coming from each of injection holes 536 combines within centralized channel 550 at or near central axis 552. The combined gas flow forms a downward gas flow extending down centralized channel 550 towards the circular gas flow formed by injection holes 538. The downward gas flow from injection holes 536 and the circular gas flow from injection holes 538 combine to form a sweeping vortex gas flow that extends down centralized channel 550, along and past rounded corner 531 of lower inlet manifold 530, towards the showerhead. Although the exact geometry of sweeping vortex gas flow through centralized channel 550 is not known, it is believed that the process gas may travel in a circular flow pattern, a vortex flow pattern, a helix flow pattern, a spiral flow pattern, a swirl flow pattern, a twirl flow pattern, a twist flow pattern, a coil flow pattern, a corkscrew flow pattern, a curl flow pattern, a whirlpool flow pattern, or derivatives thereof.

FIGS. 6A-6D and 7A depict showerhead assembly 600 containing showerhead plate 602 having holes 620. FIGS. 7B-7E depict showerhead plate 602 which may be utilized in showerhead assembly 600. Holes 620 extend through showerhead plate 602, from upper surface 610 to lower surface 612 of showerhead plate 602. In one embodiment, showerhead assembly 600 contains showerhead plate 602 disposed on inner ring 604, which is disposed on outer ring 606. Showerhead plate 602, inner ring 604, and outer ring 606 may be a single piece or separate isolatable pieces or parts which together form showerhead assembly 600. For example, showerhead plate 602, inner ring 604, and outer ring 606 may be one piece, two pieces, or multiple pieces which together form showerhead assembly 600. In some embodiments, showerhead assembly 600, showerhead plate 602, inner ring 604, and/or outer ring 606 may independently each contain or be formed from a metal such as aluminum, aluminum alloys, aluminum-plated metals, steel, stainless steel, nickel, nickel alloys (such as INCONEL® or HASTELLOY®), nickel-plated aluminum, nickel-plated metal, chromium, iron, alloys thereof, derivatives thereof, or combinations thereof. In one example, showerhead assembly 600 and/or showerhead plate 602 independently contains or is formed from aluminum or an aluminum alloy. In some examples, the aluminum alloy contains magnesium and silicon, such as aluminum 6061.

In an alternative embodiment, showerhead assembly 600 and/or showerhead plate 602 may contain or be formed from a material such as quartz, ceramic, fused quartz, sapphire, pyrolytic boron nitrite (PBN) material, glass, silicate materials, silica materials, alumina materials, zirconia materials, alloys thereof, derivatives thereof, and combinations thereof. In one example, showerhead assembly 600 and/or showerhead plate 602 contains or is formed from quartz. In one embodiment, upper surface 610 and lower surface 612 may be roughened (e.g., machined) to have a mean roughness ($R_a$) of at least about 300 microinch or greater.

In one embodiment, showerhead assembly 600 has an increasing hole density radially extending towards the outer edge. Upper surface 610 of showerhead plate 602 receives a process gas or plasma for distributing into a process region through holes 620. Holes 620 pass through showerhead plate 602 from upper surface 610 to lower surface 612 and provide fluid communication therethrough. Holes 620 may have a variety of sizes and be contained across upper surface 610 and lower surface 612 in multiple patterns. Each hole of the plurality of holes 620 may have a diameter within a range from about 0.05 inches to about 0.16 inches, preferably, from about 0.07 inches to about 0.14 inches, and more preferably, from about 0.08 inches to about 0.13 inches. In one embodiment, showerhead plate 602 has at least about 300 holes, such as from about 320 holes to about 500 holes. In one example, showerhead plate 602 contains about 350 holes.

Figure 7A:
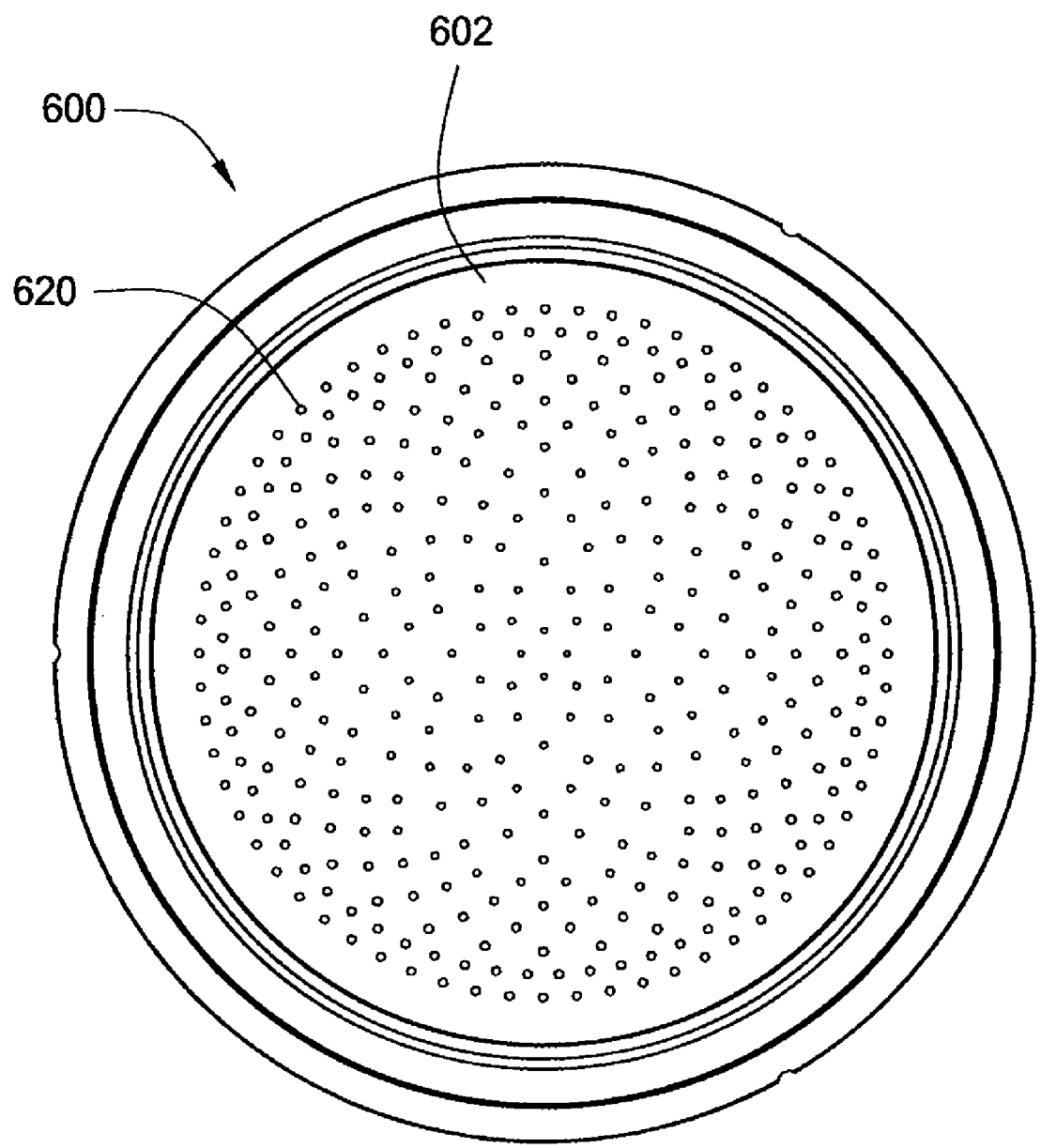
FIG. 7A depicts a schematic view of the showerhead assembly with one type of showerhead plate as described in an embodiments herein.
Figure 7C:
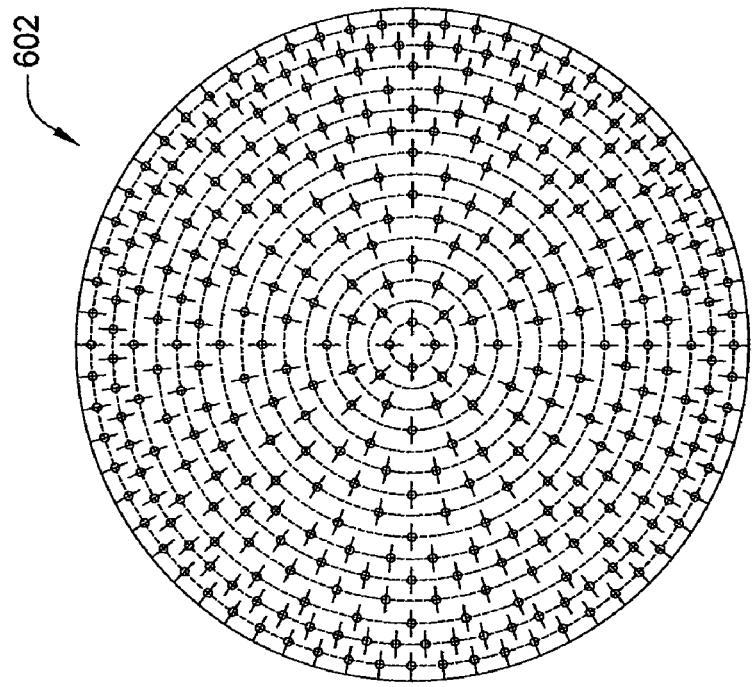
FIGS. 7B-7E depict schematic views of various other showerhead plates as described in embodiments herein.
Figure 7B:
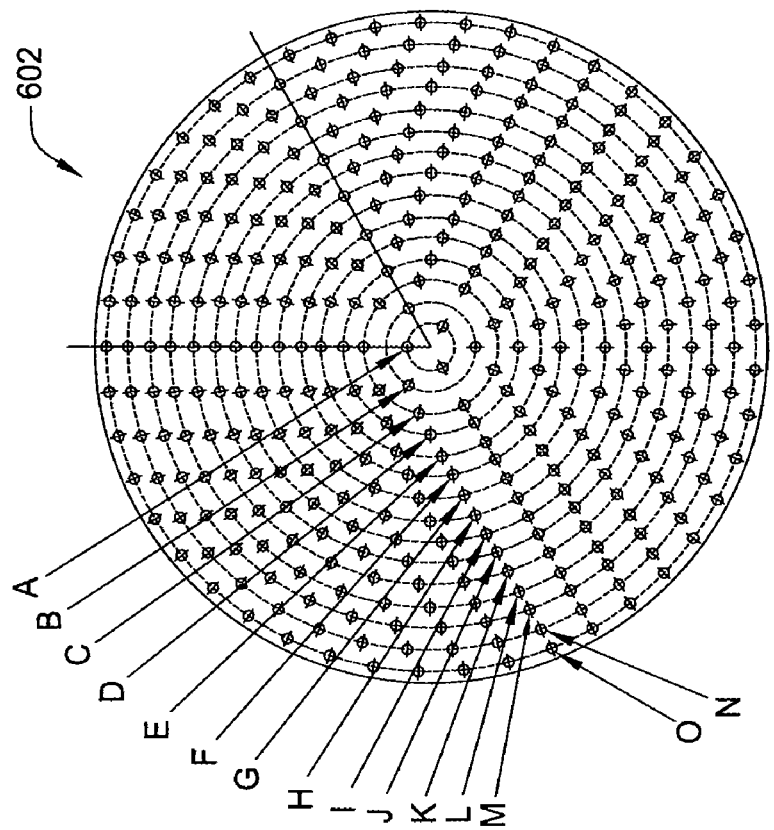
Figure 7E:
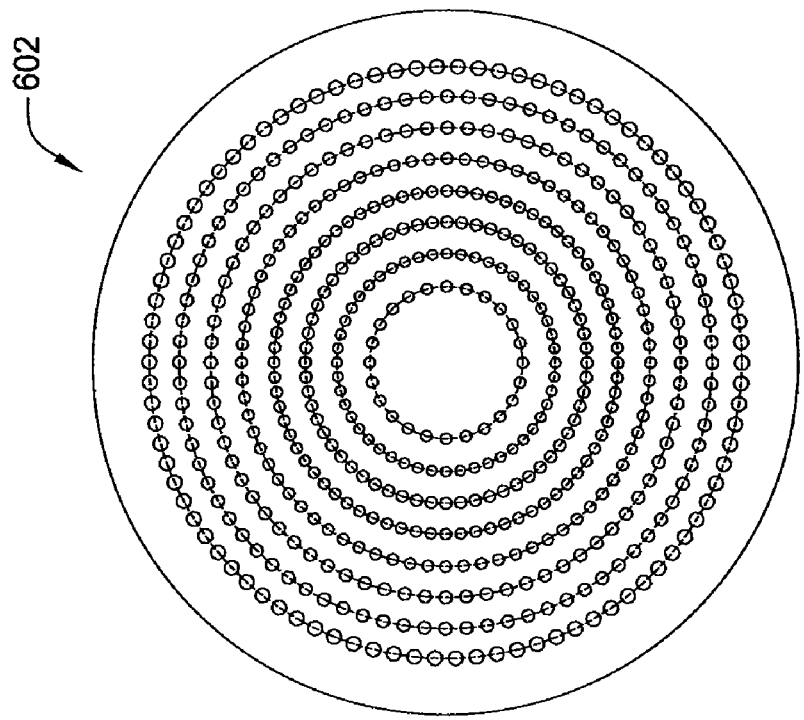
Figure 7D:
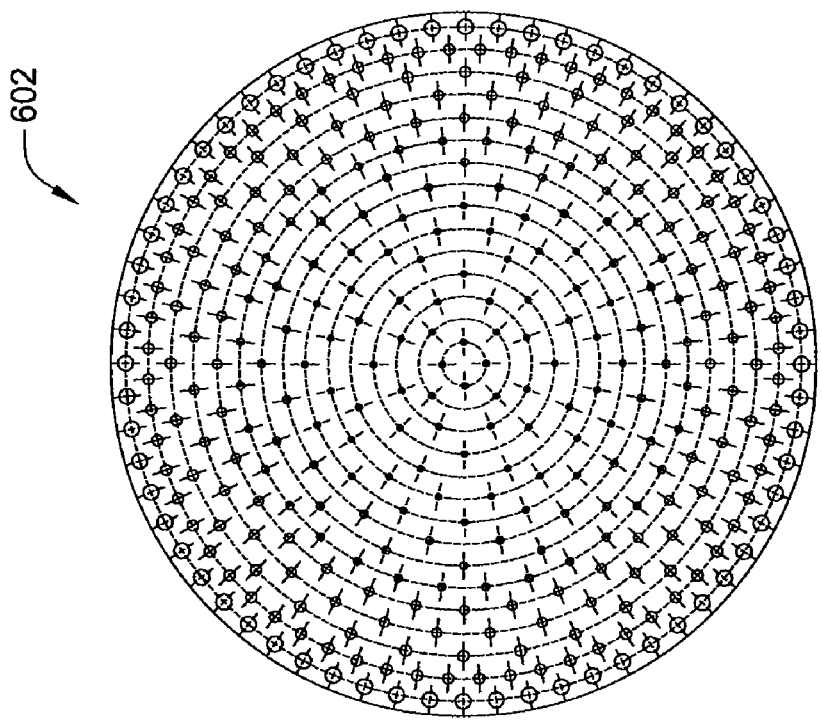

In another embodiment, showerhead assembly 600 or showerhead plate 602 may have multiple rings of holes 620 and may have holes 620 of varying diameters, as depicted in FIGS. 7A-7E. Showerhead assembly 600 or showerhead plate 602 may have 15 rings of holes 620 (FIGS. 7A-7D) or less rings, such as 8 rings (FIG. 7E). FIG. 7B depicts Rings A-O extending radially towards the outer edge of showerhead plate 602. The diameter of holes 620 may increase, as well as the overall hole density of showerhead plate 602, extending radially towards the outer edge of showerhead plate 602.

In some embodiments, showerhead assembly 600 or showerhead plate 602 contains a first plurality of holes 620 in fluid communication upper surface 610 and lower surface 612. The first plurality of holes 620 are positioned within a first zone extending from the center of showerhead plate 602 to about 25% of the radius of showerhead plate 602, and each hole has a diameter of less than 0.1 inches. Showerhead assembly 600 contains a second plurality of holes in fluid communication with upper surface 610 and lower surface 612. The second plurality of holes 620 are positioned within a second zone extending from about 25% of the radius of showerhead plate 602 to about the outer edge of showerhead assembly 600, and each hole has a diameter of greater than 0.1 inches. In some examples the diameter of the first plurality of holes is about 0.09 inches or less. In other examples, the diameter of the second plurality of holes is about 0.11 inches or greater, preferably, about 0.12 inches or greater, and more preferably, about 0.13 inches or greater.

Figure 8A:
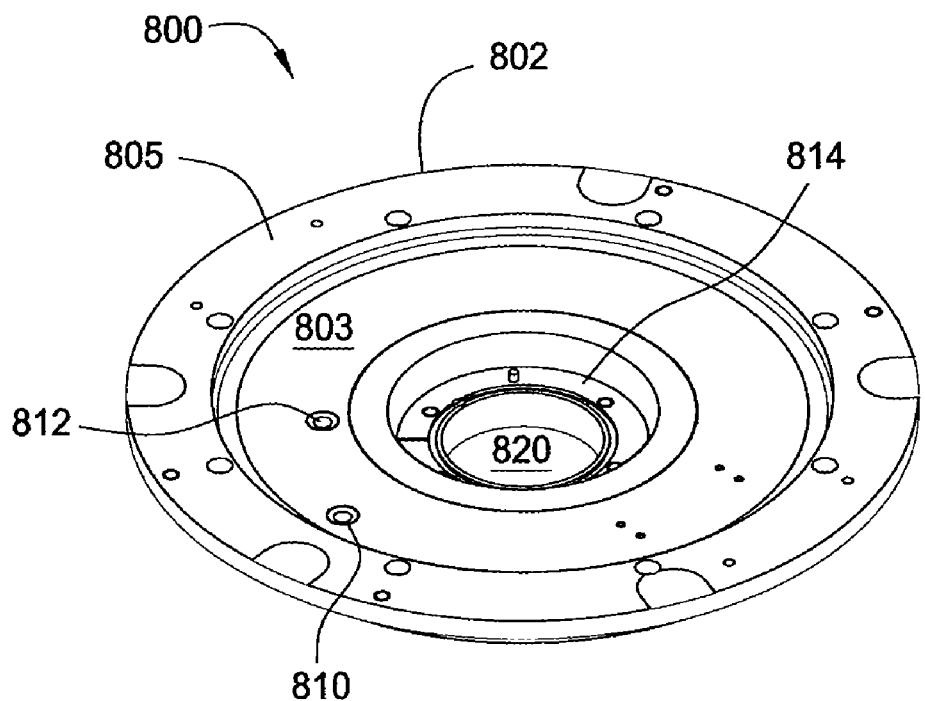
FIGS. 8A-8C depict schematic views of a water box as described in embodiments herein.
Figure 8B:
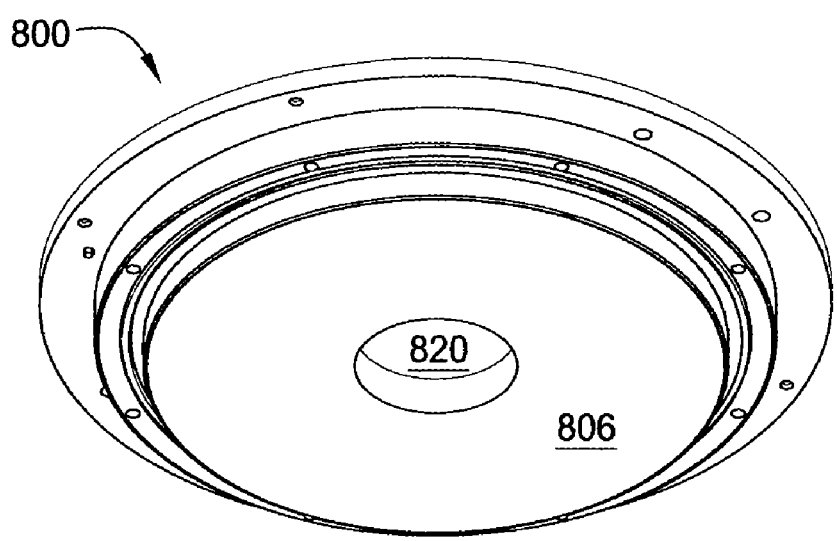
Figure 8C:
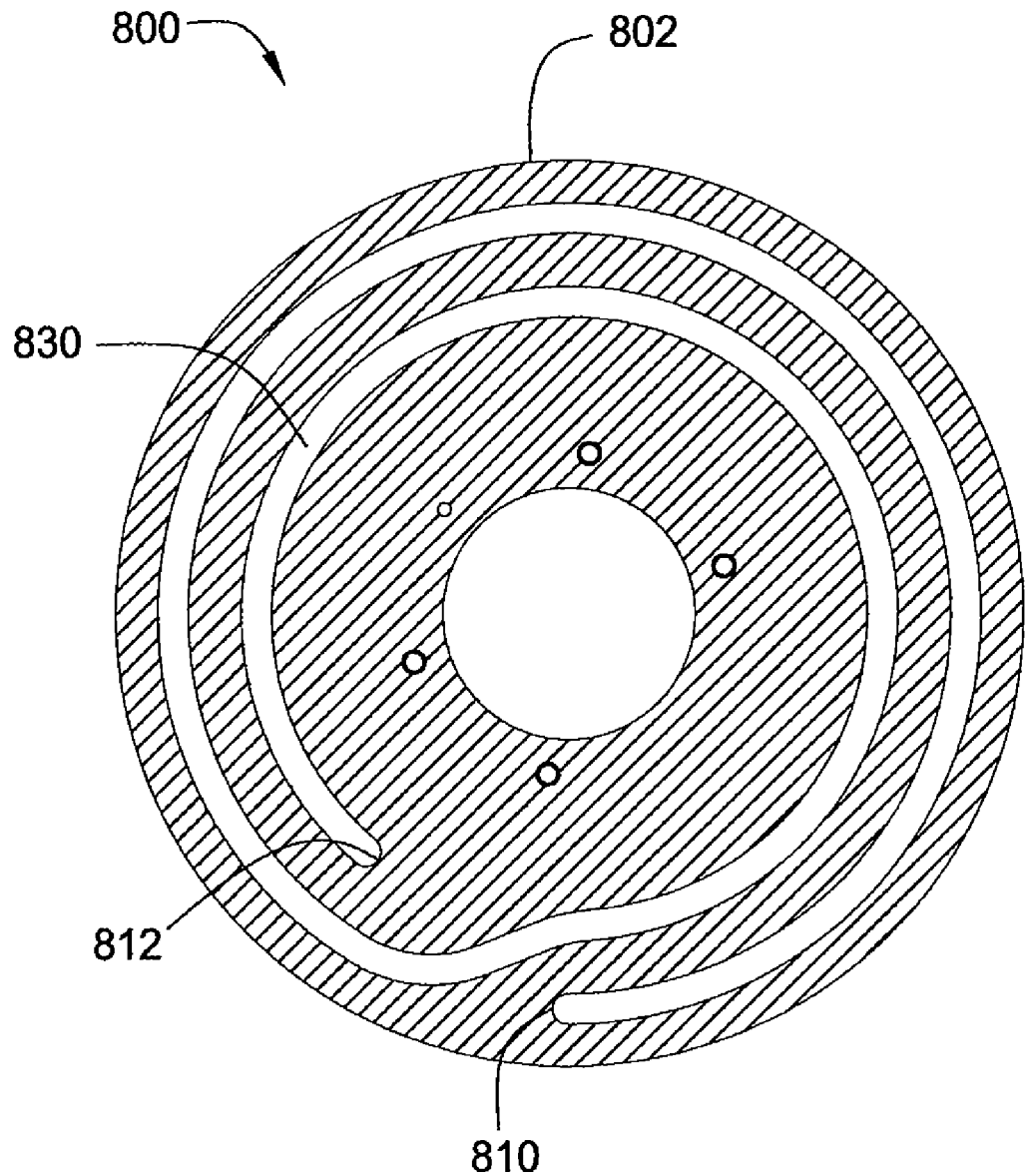
Figure 9A:
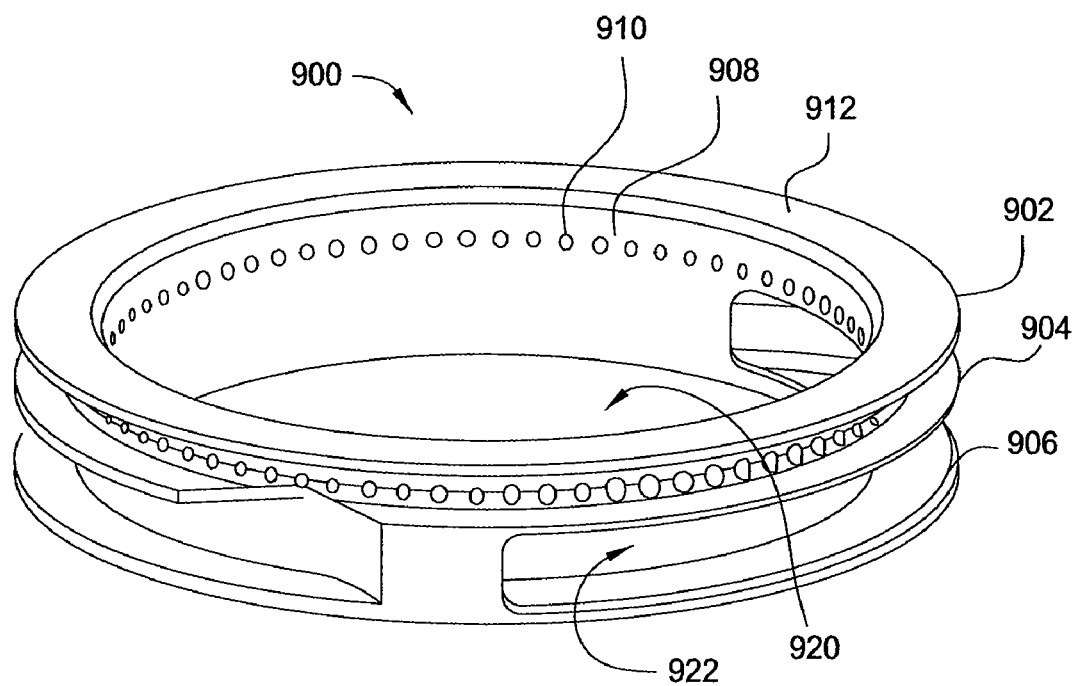
FIGS. 9A-9D depict schematic views of a pumping ring as described in embodiments herein.
Figure 9B:
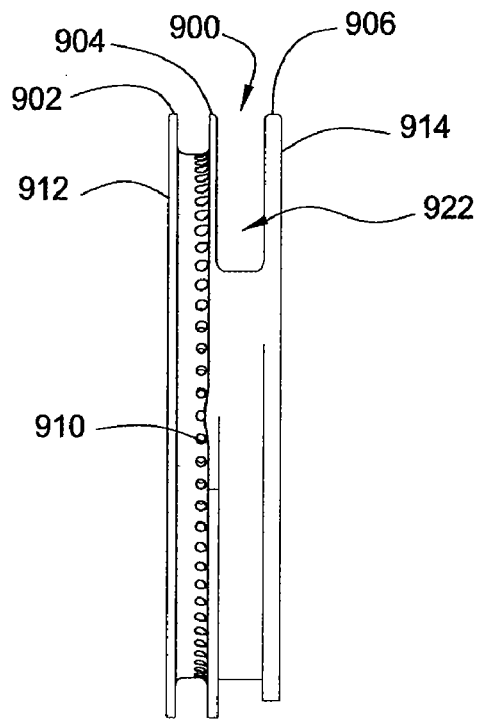
Figure 9C:
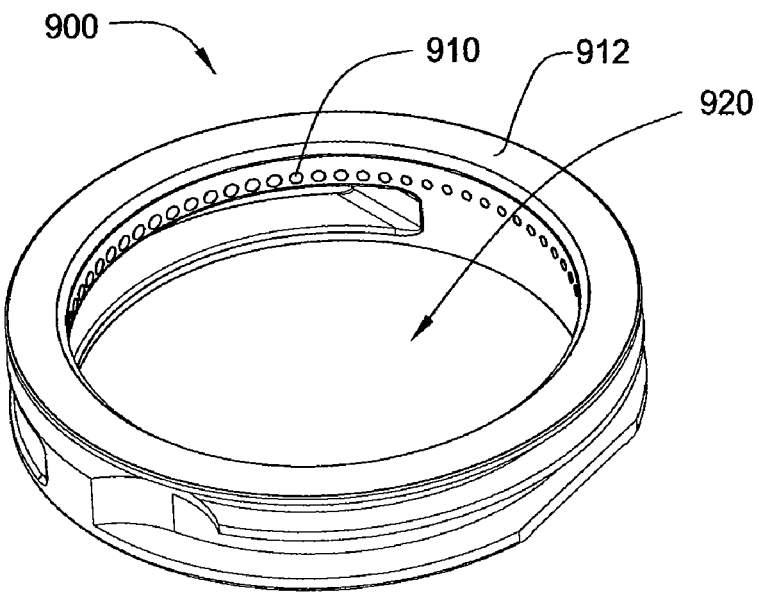
Figure 9D:
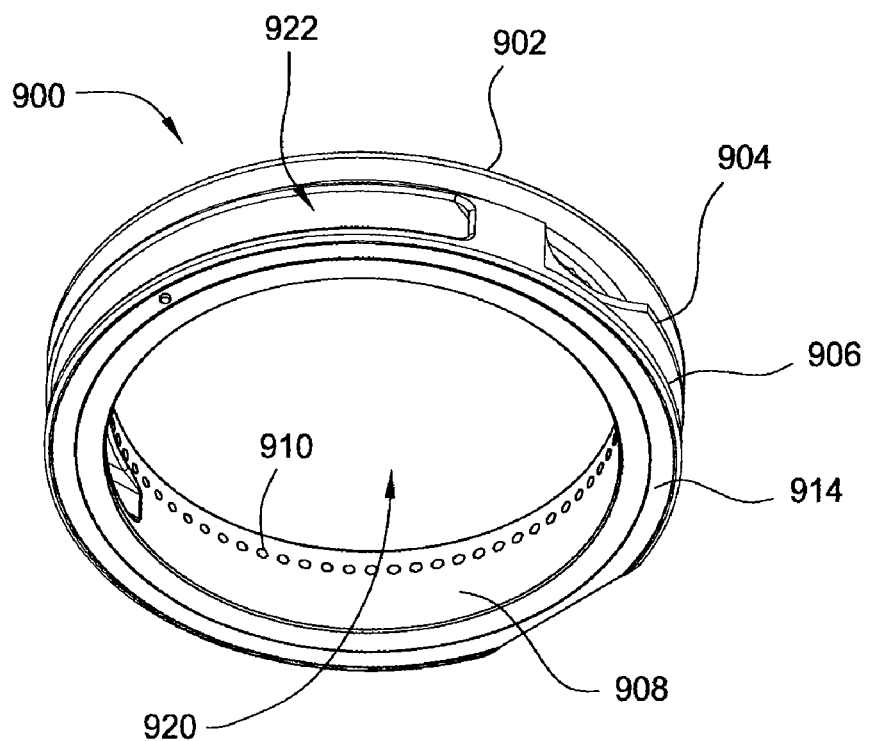

FIGS. 8A-8C depict water box 800 used to regulate the temperature by removing heat from deposition chambers lid assemblies, such as chamber lid assembly 1400 or 1500. Water box 800 may be positioned on top of showerhead assembly 600. Water box 800 contains a centralized passageway, such as opening 820, through body 802. Inner upper surface 803 and outer upper surface of body 802 both encircle opening 820. Lower surface 806 of water box 800 faces showerhead assembly 600 within chamber lid assembly 1400. Opening 820 is adapted to receive inlet manifold assembly 100, which may be positioned on ledge surface 814. Water box 800 may contain or be formed from a metal such as aluminum, aluminum alloys (e.g., aluminum magnesium silicon alloys, such as aluminum 6061), aluminum-plated metals, stainless steel, nickel, nickel alloys (such as INCONEL® or HASTELLOY®), nickel-plated aluminum, nickel-plated metal, chromium, iron, alloys thereof, derivatives thereof, or combinations thereof. In one example, water box 800 may contain or is formed from aluminum or an aluminum alloy.

Water box 800 removes heat from chamber lid assembly 1400 or 1500, such as from showerhead assembly 600. Inner upper surface 803 of water box 800 contains inlet 810 and outlet 812 that are in fluid communication with passageway 830. During a deposition process, a fluid at an initial temperature is administered into water box 800 through inlet 810. The fluid absorbs heat while traveling along passageway 830. The fluid at a higher temperature is removed from water box 800 through outlet 812.

The fluid may be in liquid, gas or supercritical state and is capable of adsorbing and dissipating heat in a timely manner. Liquids that may be used in water box 800 include water, oil, alcohols, glycols, glycol ethers, other organic solvents, supercritical fluids (e.g., $CO_2$) derivatives thereof or mixtures thereof. Gases may include nitrogen, argon, air, hydrofluorocarbons (HFCs), or combinations thereof. Preferably, water box 800 is supplied with water or a water/alcohol mixture.

Figure 14:
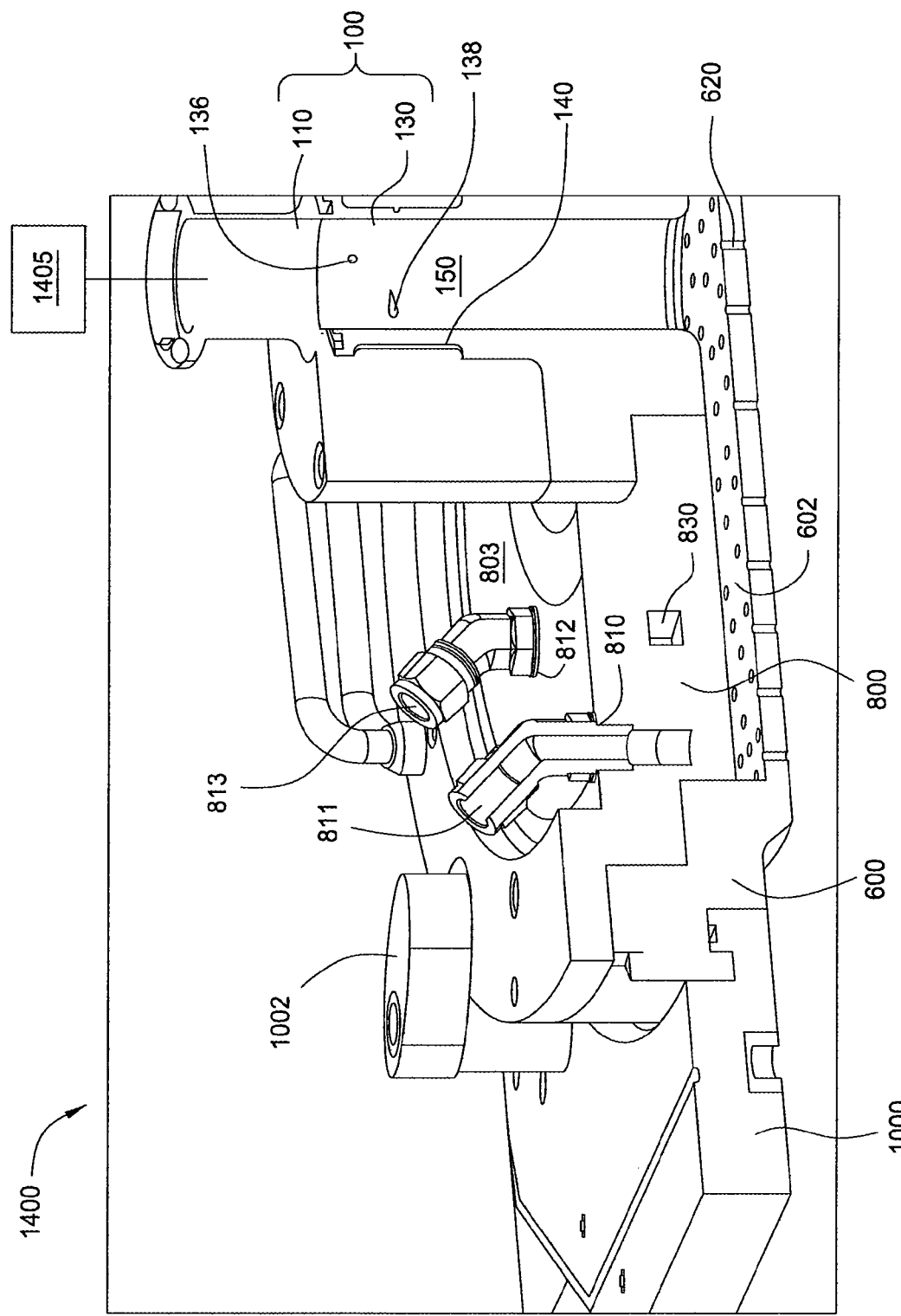
FIG. 14 depicts a schematic view of a chamber lid assembly as described in some embodiments herein.

Inlet nozzle 811 may be coupled with and in fluid communication with inlet 810 and outlet nozzle 813 may be coupled with and in fluid communication with outlet 812, as depicted in FIG. 14. Inlet 810 may be adapted to receive inlet nozzle 811 connected to a line (e.g., hose) in fluid communication with a fluid source. Similarly, outlet 812 may be adapted to receive outlet nozzle 813 connected to a line in fluid communication with a fluid return. The fluid source and fluid return may be an in-house cooling system or an independent cooling system. The fluid lines may be a tube, a hose, or a conduit.

In one embodiment, the fluid may be administered into water box 800 at a temperature within a range from about −20° C. to about 40° C., preferably, from about 0° C. to about 20° C. The temperature, flow rate, and fluid composition may be adjusted accordingly to remove the appropriate amount of heat from chamber lid assembly 1400 including showerhead assembly 600 while maintaining water box 800 at a predetermined temperature. Water box 800 may be maintained at a predetermined temperature within a range from about 0° C. to about 100° C., preferably, from about 18° C. to about 65° C., and more preferably, from about 20° C. to about 50° C. In an alternative embodiment, passageway 830 may have a variety of different geometries that may be used to maintain the predetermined temperature. Passageway 830 may include a partial loop, a single loop, multiple loops, or contain branches or spurs there around.

FIGS. 9A-9D depict pumping ring 900 used in embodiments herein. Pumping ring 900 contains upper ring 902, middle ring 904, and lower ring 906. Upper surface 912 of pumping ring 900 is the outer surface of upper ring 902 and lower surface 914 of pumping ring 900 is the outer surface of lower ring 906. Pumping ring 900 contains a centralized passageway, such as opening 920, extending therethrough and encompassed by sidewall 908. Upper ring 902, middle ring 904, and lower ring 906 encircle opening 920. Pumping ring 900 also contains opening 922 disposed between middle ring 904 and lower ring 906.

Pumping ring 900 contains a plurality of holes 910 between upper ring 902 and middle ring 904. Holes 910 provide fluid communication from opening 920 and through sidewall 908 and pumping ring 900. Pumping ring 900 may contain from about 50 holes to about 100 holes, such as about 72 holes. Holes 910 may have a diameter within a range from about 0.1 inches to about 0.5 inches, preferably, from about 0.25 inches to about 0.40 inches. Pumping ring 900 may contain or be formed from a metal such as aluminum, aluminum alloys (e.g., aluminum magnesium silicon alloys, such as aluminum 6061), aluminum-plated metals, stainless steel, nickel, nickel alloys (such as INCONEL® or HASTELLOY®), nickel-plated aluminum, nickel-plated metal, chromium, iron, alloys thereof, derivatives thereof, or combinations thereof.

FIGS. 10A-10B and FIG. 11B depict pumping ring assembly 940 containing outer shield ring 950 encompassing pumping ring 900, as described in some embodiments herein. Channel 952 is formed within pumping ring assembly 940, between pumping ring 900 and outer shield ring 950, and is in fluid communication with opening 920 via holes 910. Outer shield ring 950 may contain or be formed from a metal such as aluminum, aluminum alloys (e.g., aluminum magnesium silicon alloys, such as aluminum 6061), aluminum-plated metals, stainless steel, nickel, nickel alloys (such as INCONEL® or HASTELLOY®), nickel-plated aluminum, nickel-plated metal, chromium, iron, alloys thereof, derivatives thereof, or combinations thereof.

Figure 11A:
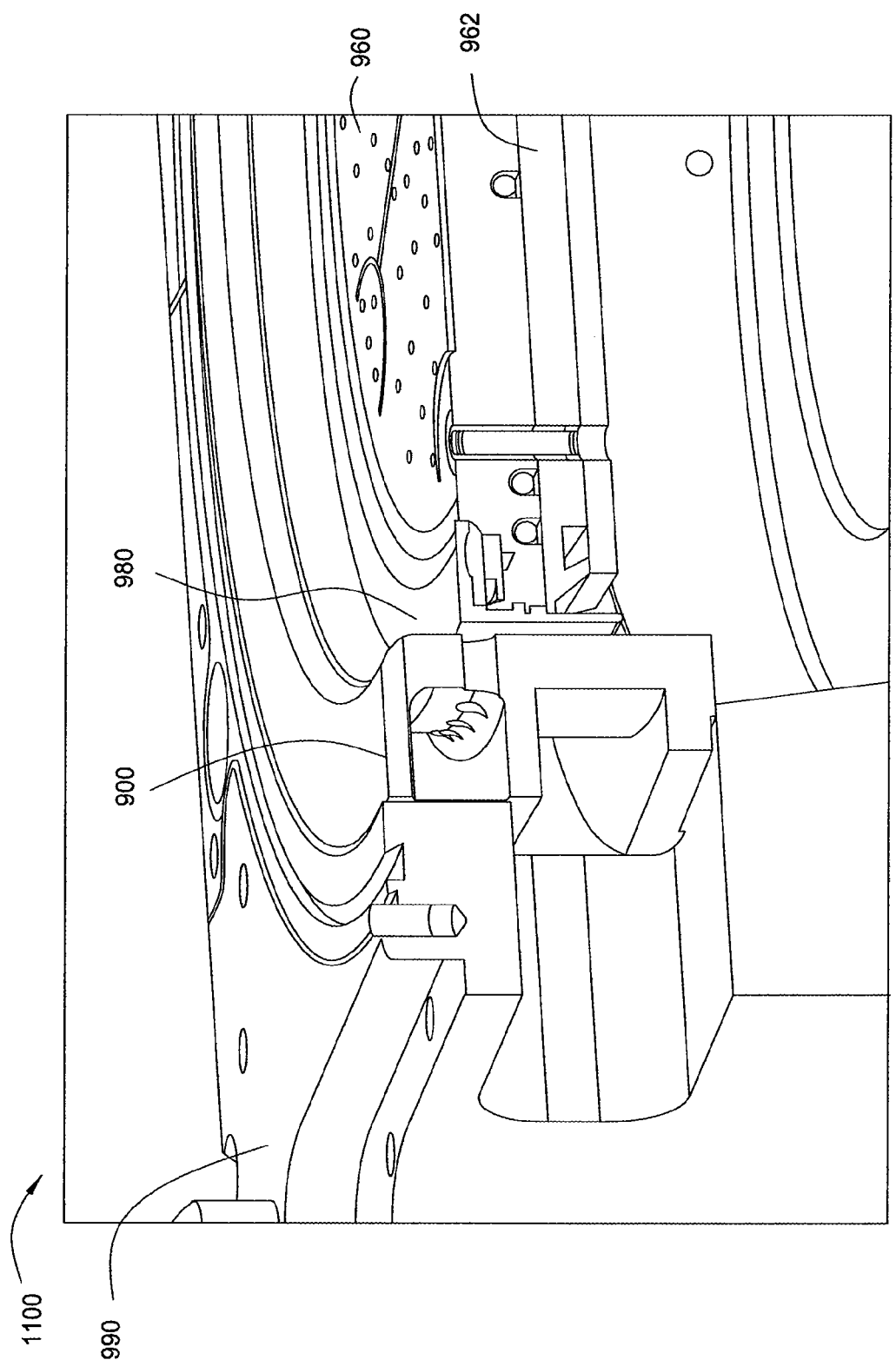
FIG. 11A depicts a schematic and partial view of a chamber body assembly as described in embodiments herein.

FIG. 11A depicts chamber body assembly 1100 and FIG. 11B depicts chamber body assembly 1150, which both may be contained within chamber lid assemblies 1400 and 1500, as described in embodiments herein. FIG. 11A depicts chamber body 990 within chamber body assembly 1100, as described in one embodiment herein. Chamber body assembly 1100 contains edge ring 980 encompassing or encircling substrate support 960. Substrate support 960 contains heater 962, which may be used to heat substrate support 960, substrates disposed thereon, and surrounding processing region. In another embodiment, chamber body assembly 1150 also contains pumping ring assembly 940, which includes outer shield 950 encompassing or encircling pumping ring 900, depicted in FIG. 11B.

Figure 12A:
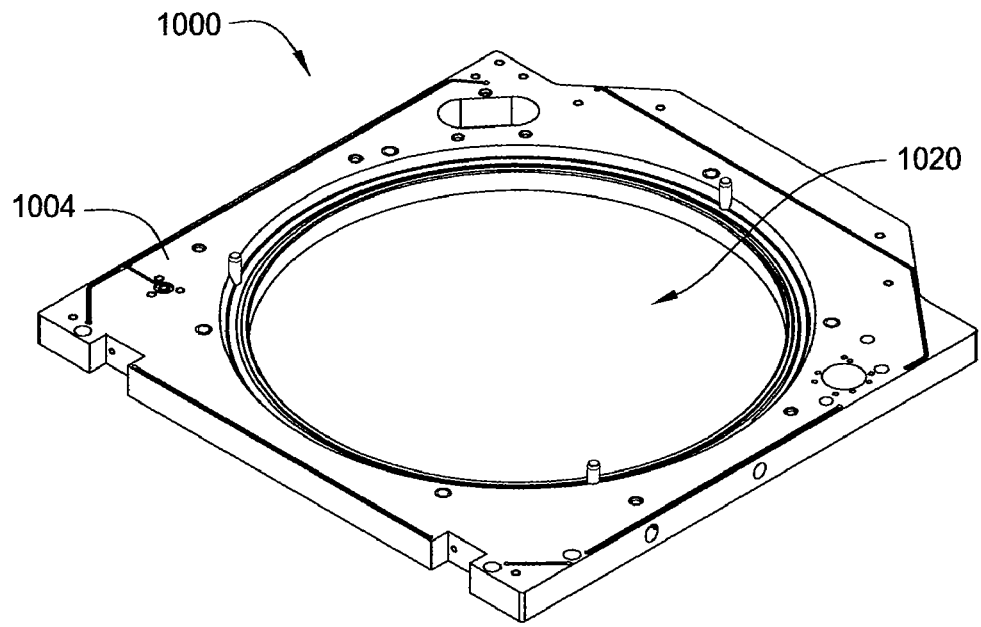
FIGS. 12A-12B depict schematic views of a chamber lid plate as described in some embodiments herein.
Figure 12B:
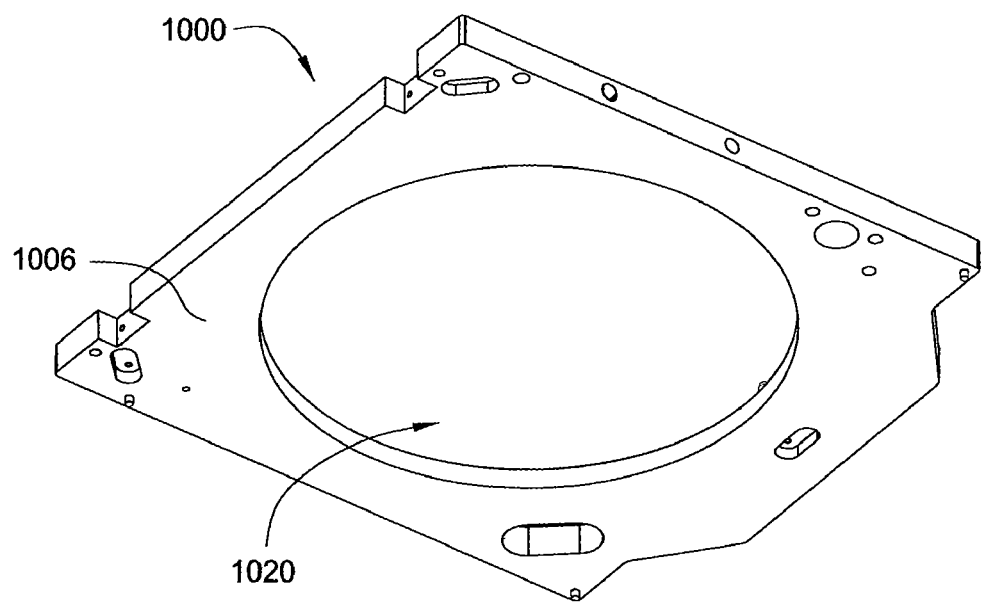

FIG. 12A-12B depicts chamber lid plate 1000, as described in some embodiments herein. Upper surface 1004 of chamber lid plate 1000 is illustrated in FIG. 12A while lower surface 1006 of chamber lid plate 1000 is illustrated in FIG. 12B. Showerhead assembly 600, or other shower heads, may be disposed within opening 1020 of chamber lid plate 1000, as depicted in FIGS. 14-16A. Chamber lid plate 1000 may contain or be formed from a metal such as aluminum, aluminum alloys (e.g., aluminum magnesium silicon alloys, such as aluminum 6061), aluminum-plated metals, stainless steel, nickel, nickel alloys (such as INCONEL® or HASTELLOY®), nickel-plated aluminum, nickel-plated metal, chromium, iron, alloys thereof, derivatives thereof, or combinations thereof.

FIGS. 13A-13E depict gas manifold assembly 1300, that may be contained within chamber lid assemblies 1400 and 1500, as described in embodiments herein. Gas manifold assembly 1300 contains at least one gas conduit, but usually contains two, three, or more gas conduits. FIGS. 13A-13E depict gas conduits 1302 and 1304 extending throughout manifold housing 1308 of gas manifold assembly 1300. Gas conduit 1302 extends from inlet 1310, through manifold housing 1308, and to outlet 1312 at outlet plate 1314. Gas conduit 1304 extends from inlet 1320, through manifold housing 1308, and to outlet 1322 at outlet plate 1314. Inlet 1310 may be coupled with and in fluid communication with a first precursor source containing a first chemical precursor while inlet 1320 may be coupled with and in fluid communication with a second precursor source containing a second chemical precursor.

Figure 16B:
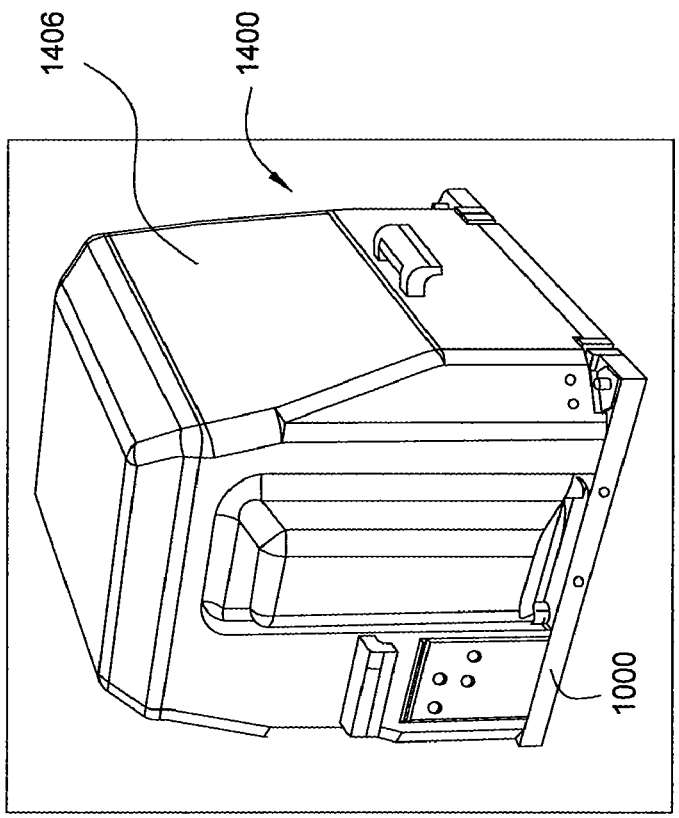
FIGS. 16A-16B depict schematic views of a chamber lid assembly as described in embodiments herein.
Figure 16A:
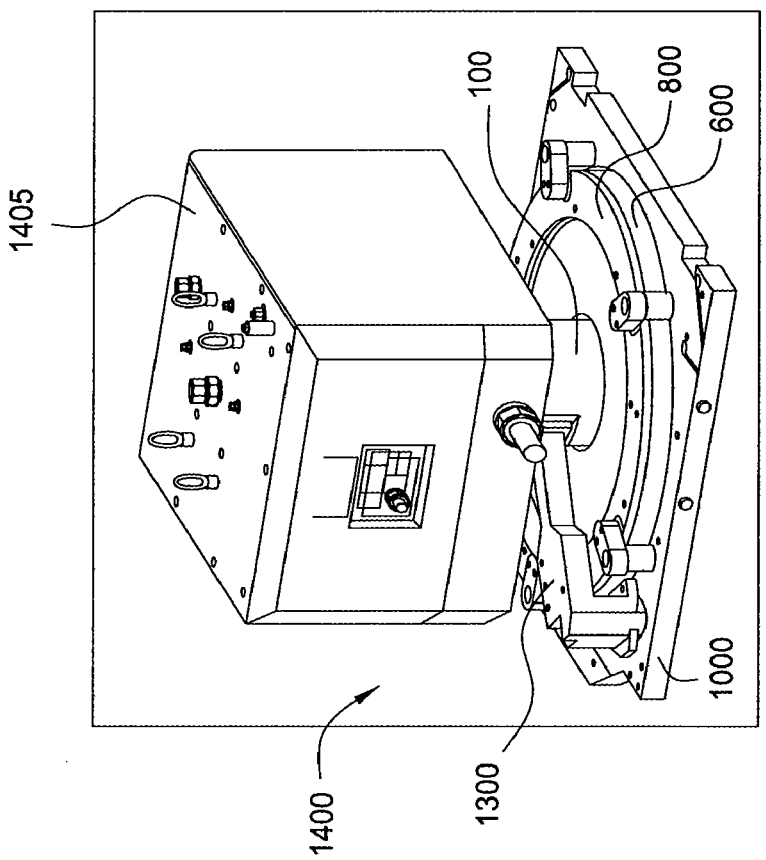

In one embodiment, FIGS. 14 and 16A schematically depicts chamber lid assembly 1400 containing remote plasma system (RPS) 1405 positioned on inlet manifold assembly 100 and in fluid communication with centralized channel 150. Lower inlet manifold 130 of centralized channel 150 contains injection holes 136 and injection holes 138, which extend through sidewall 139 of lower inlet manifold 130 and provide fluid communication between annular channel 140 and centralized channel 150. In some embodiments, injection holes 136 may be positioned directly towards or substantially towards central axis 152 extending through the middle of centralized channel 150. Injection holes 138 may be positioned tangentially towards or substantially tangentially towards sidewall 151 of centralized channel 150. FIG. 16B illustrates lid assembly cover 1406 over chamber lid assembly 1400.

Figure 15:
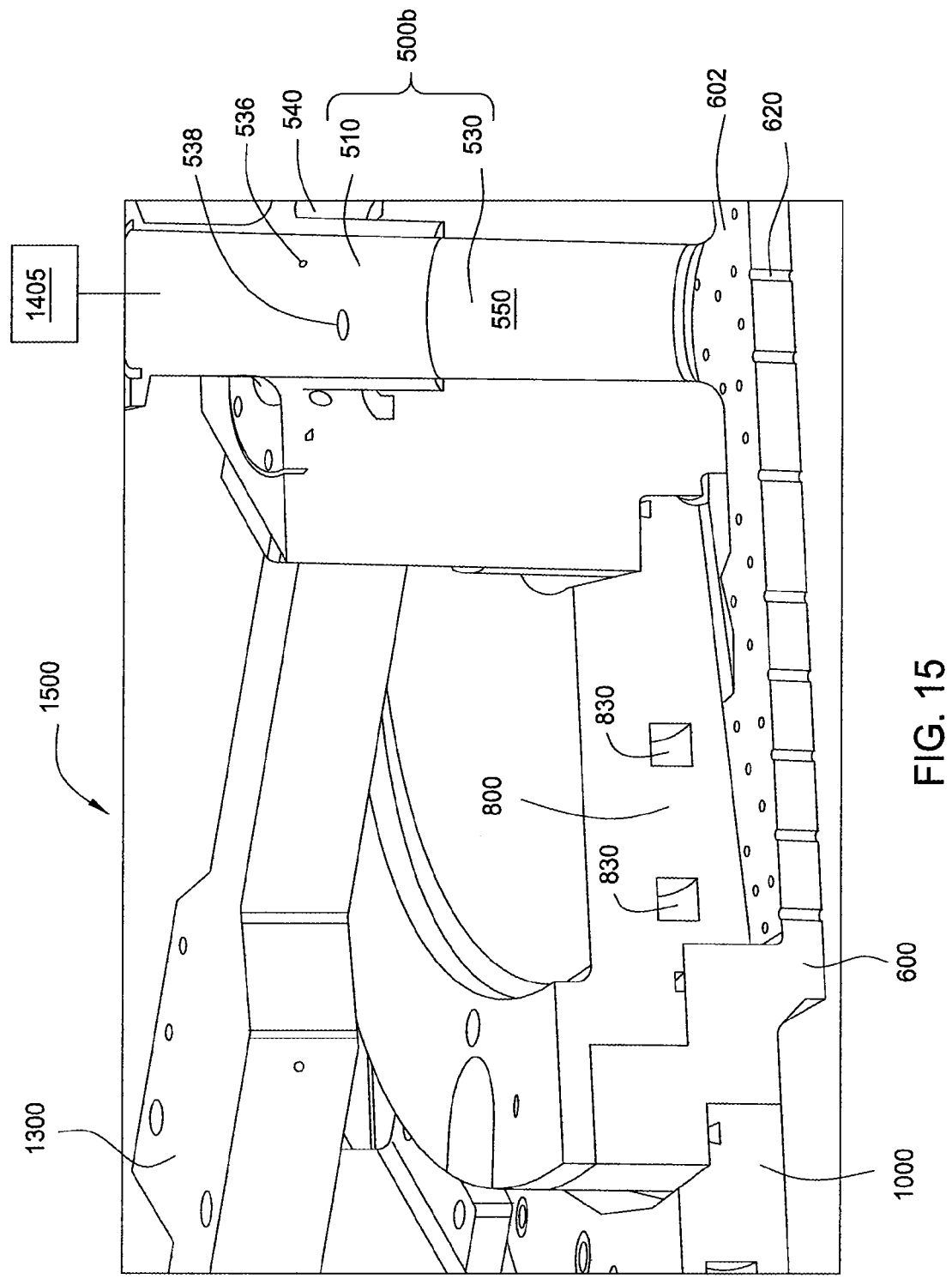
FIG. 15 depicts a schematic view of another chamber lid assembly as described in other embodiments herein.

In another embodiment, FIG. 15 schematically depicts lid assembly 1500 containing RPS 1405 positioned on inlet manifold assembly 500b and in fluid communication with centralized channel 550. Upper inlet manifold 510 of centralized channel 550 contains injection holes 536 and injection holes 538, which provide fluid communication between annular channel 540 and centralized channel 550. In some embodiments, injection holes 536 may be positioned directly towards or substantially towards central axis 552 extending through the middle of centralized channel 550. Injection holes 538 may be positioned tangentially towards or substantially tangentially towards sidewall 551 of centralized channel 550.

A plasma system and a chamber body assembly that may be used in combination with chamber lid assemblies 1400 and 1500 is the TXZ® CVD, chamber available from Applied Materials, Inc., located in Santa Clara, Calif. Further disclosure of plasma systems, ALD chambers, and deposition chambers is described in commonly assigned U.S. Pat. Nos. 5,846,332, 6,079,356, and 6,106,625, which are incorporated herein by reference in their entirety, to provide further disclosure for a plasma generator, a plasma chamber, an ALD chamber body, a substrate support or pedestal, and chamber liners.

Figure 17:
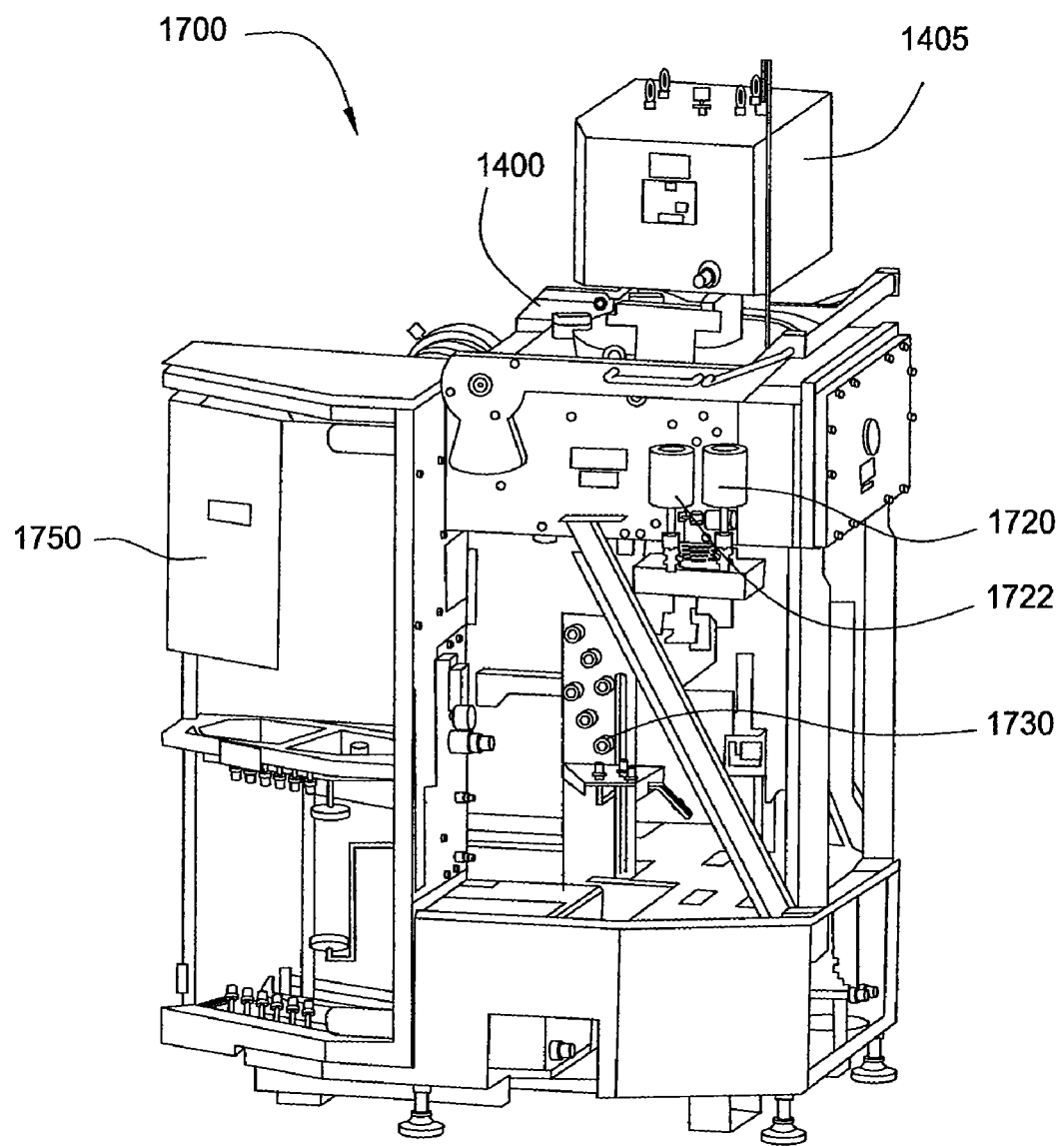
FIG. 17 depicts a schematic view of an ALD chamber assembly as described in embodiments herein.
Figure 18A:
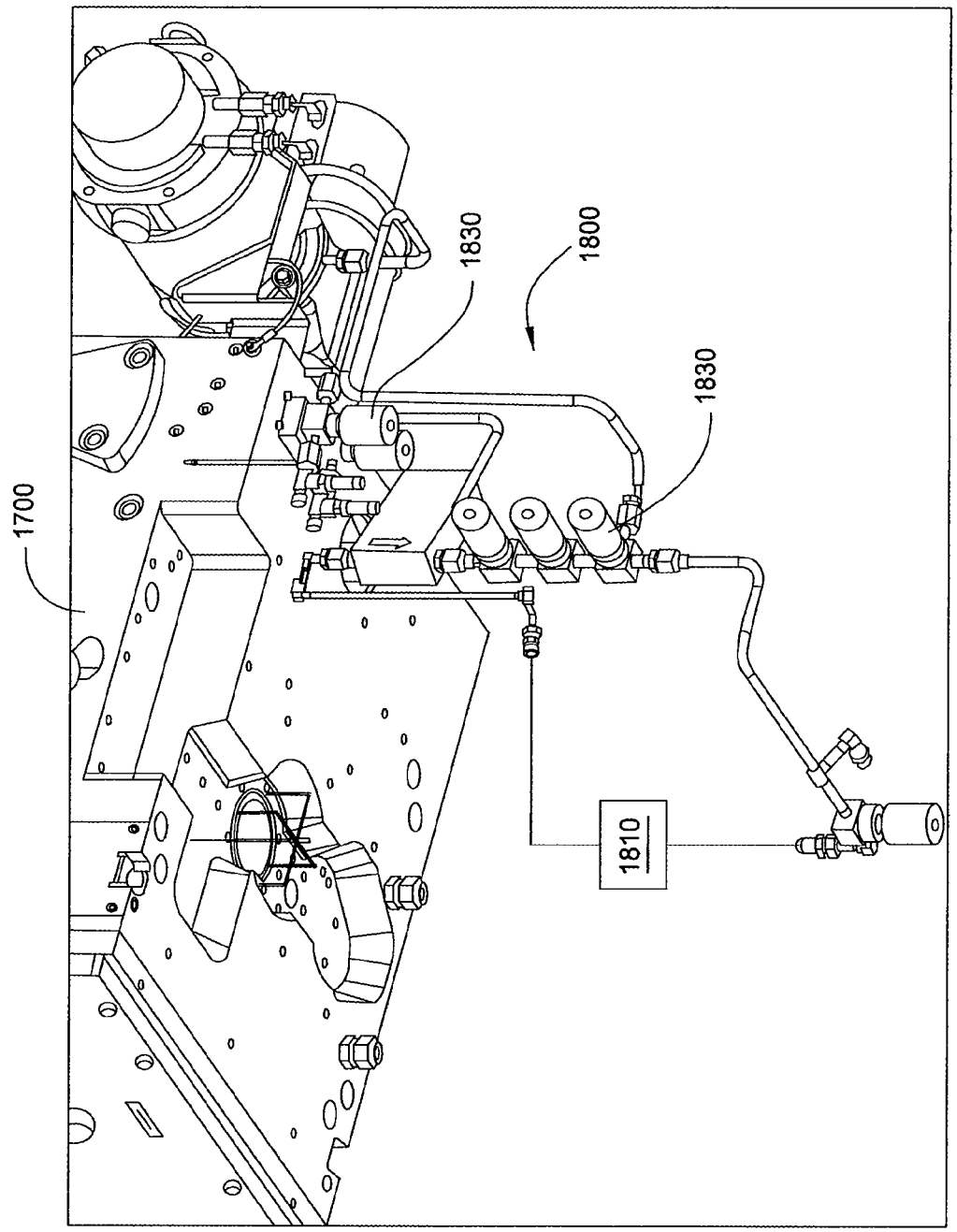

In another embodiment, FIG. 17 illustrates ALD chamber assembly 1700 containing chamber lid assembly 1400 equipped with RPS 1405. FIGS. 18A-18B illustrate gas purge assembly 1800 that may be used with ALD chamber assembly 1700 containing chamber lid assembly 1400. Gas purge assembly 1800 contains vacuum pumping system 1810 containing a plurality of valve assemblies 1830.

Gas sources (not shown) provide precursor gas, carrier gas, or purge gas to chamber lid assembly 1400 or 1500 and/or with ALD chamber assembly 1700 through a conduit system. In one embodiment, gas sources may be coupled with and in fluid communication with gas manifold assembly 1300. Gas sources may be directly or indirectly connected to a chemical supply or a gas supply. The chemical or gas supplies include a tank, an ampoule, a bubbler, a vaporizer or another container used to store, transfer, or form a chemical precursor. The chemical or gas supply may also be from an in-house source. Proper control and regulation of the gas flows from gas sources to gas manifold assembly 1300 are performed by valve assemblies 1720 and 1722 coupled to control unit 1750, as well as valve assembly 1730. Gas manifold assembly 1300 introduces process gases into ALD chamber assembly 1700 and may optionally be heated to prevent condensation of any gases within the conduits or lines of gas manifold assembly 1300.

Each valve assembly 1720 and 1722 may have a diaphragm and a valve seat. The diaphragm may be biased open or closed and may be actuated closed or open respectively. The diaphragms may be pneumatically actuated or may be electrically actuated. Examples of pneumatically actuated valves are available from Fujikin and Veriflow and examples of electrically actuated valves are available from Fujikin. Control unit 1750 may be coupled to valve assemblies 1720 and 1722 to control actuation of the diaphragms of the valves. Pneumatically actuated valves may provide pulses of gases in time periods as low as about 0.020 seconds. Electrically actuated valves may provide pulses of gases in time periods as low as about 0.005 seconds. Generally pneumatically and electrically actuated valves may provide pulses of gases in time periods as high as about 3 seconds. Although higher time period for gas pulsing is possible, a typical ALD process utilizes ALD valves to generate pulses of gas while being opened for an interval of about 5 seconds or less, preferably about 3 seconds or less, and more preferably about 2 seconds or less. In one embodiment, an ALD valve pulses for an interval within a range from about 0.005 seconds to about 3 seconds, preferably from about 0.02 seconds to about 2 seconds and more preferably from about 0.05 seconds to about 1 second. An electrically actuated valve typically requires the use of a driver coupled between the valve and control unit 1750. In another embodiment, each valve assembly 1720 and 1722 may contain a mass flow controller (MFC) to control gas dispersion, gas flow rates, and other attributes to an ALD pulse sequence.

A precursor or a gas delivery system within an ALD apparatus is used to store and dispense chemical precursors, carrier gases, purge gases or combinations thereof. The delivery system may contain valves (e.g., ALD valves or MFCs), conduits, reservoirs, ampoules and bubblers, heater and/or control unit systems, which may be used with gas manifold assembly 1300, chamber lid assembly 1400 or 1500, ALD chamber assembly 1700, and/or processing system 1900. In one example, a delivery system may contain gas sources and valve assemblies 1720 and 1722 coupled to control unit 1750. Delivery systems configured for an ALD process system are described in commonly assigned U.S. Ser. No. 11/127,753, filed May 12, 2005, and published as US 2005-0271812, U.S. Ser. No. 11/119,388, filed Apr. 29, 2005, published as US 2005-0252449, and now abandoned, U.S. Ser. No. 10/281,079, filed Oct. 25, 2002 and published as US 2003-0121608, and U.S. Ser. No. 10/700,328, filed Nov. 3, 2003, published as US 2005-009859, and now abandoned, which are incorporated herein by reference in their entirety.

Control unit 1750, such as a programmed personal computer, work station computer, or the like, may be coupled to ALD chamber assembly 1700 to control processing conditions. For example, control unit 1750 may be configured to control flow of various process gases and purge gases from gas sources through valve assemblies 1720 and 1722 during different stages of a substrate process sequence. Illustratively, control unit 1750 comprises central processing unit (CPU), support circuitry, and memory containing associated control software.

Software routines, as required, may be stored in the memory or executed by a remotely located source (e.g., computer or server). The software routines are executed to initiate process recipes or sequences. The software routines, when executed, transform the general purpose computer into a specific process computer that controls the chamber operation during a chamber process. For example, software routines may be used to precisely control the activation of gas sources through valve assemblies 1720 and 1722 during the execution of process sequences according to the embodiments described herein. Alternatively, the software routines may be performed in the hardware, as an application specific integrated circuit or other type of hardware implementation or a combination of software or hardware.

Control unit 1750 may be one of any form of general purpose computer processor that can be used in an industrial setting for controlling various chambers and sub-processors. The CPU may use any suitable memory, such as random access memory, read only memory, floppy disk drive, compact disc drive, hard disk, or any other form of digital storage, local or remote. Various support circuits may be coupled to the CPU for supporting ALD chamber assembly 1700. Control unit 1750 may be coupled to another controller that is located adjacent individual chamber components, such as programmable logic controllers of valve assemblies 1720 and 1722. Bi-directional communications between control unit 1750 and various other components of ALD chamber assembly 1700 are handled through numerous signal cables collectively referred to as signal buses. In addition to control of process gases and purge gases from gas sources, valve assemblies 1720 and 1722 and any programmable logic controllers, control unit 1750 may be configured to be responsible for automated control of other activities used during a fabrication process. Control unit 1750 may be connected with and configured to control the plasma generator controller for RPS 1405, vacuum pumping system 1810, and a support controller, including temperature monitoring and control of lift pins (not shown).

Figure 19:
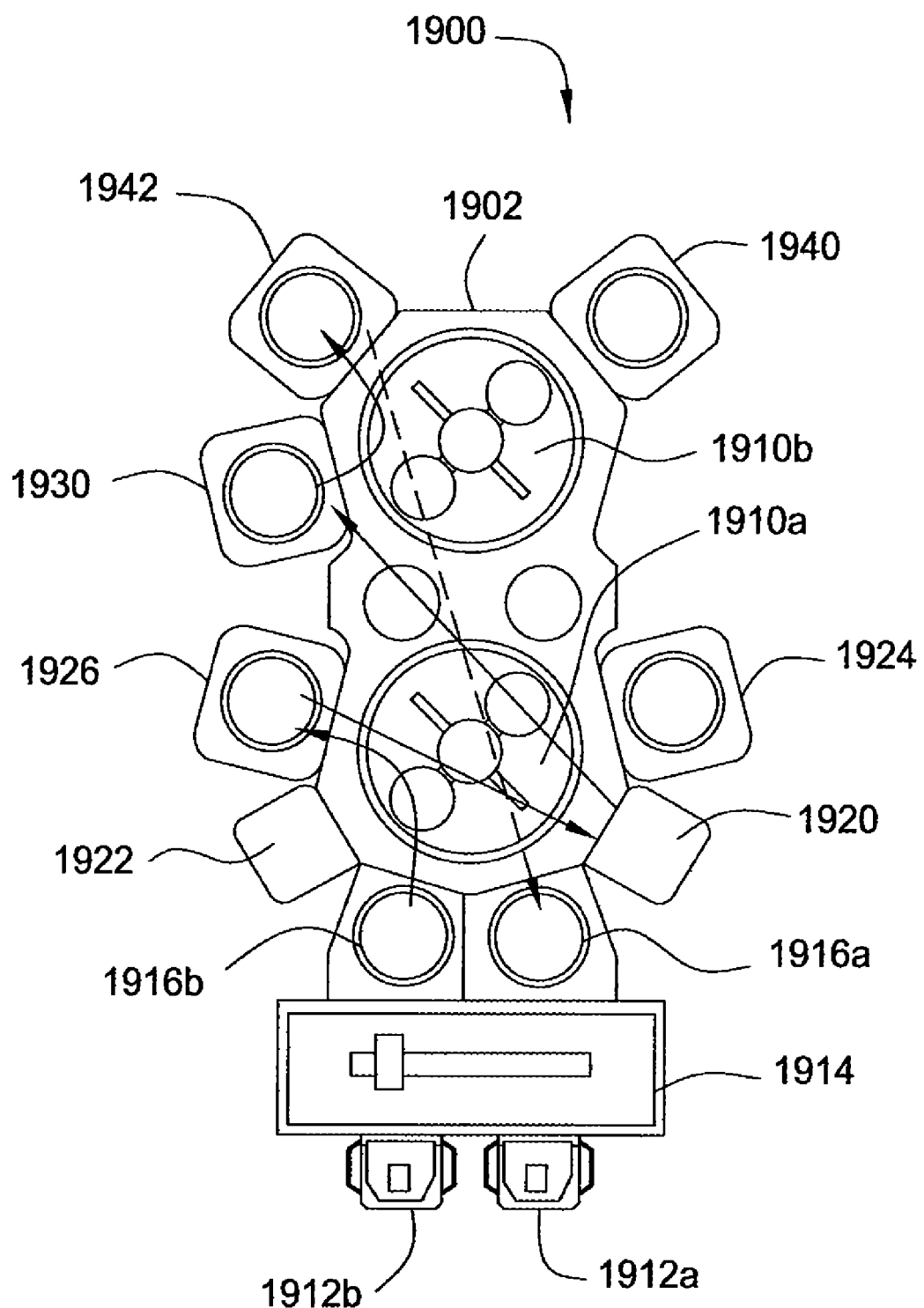
FIG. 19 depicts a schematic view of a processing system containing a variety of deposition chambers including ALD chambers, as described in embodiments herein.

FIG. 19 depicts processing system 1900 containing various deposition chambers for depositing and removing materials onto substrates. In one example, processing system 1900 contains two deposition chambers 1940 and 1942, such as ALD chambers configured to form titanium nitride, as described herein. In some embodiments, load locks 1912a and 1912b may be positioned on interface 1914. Processing system 1900 contains transfer robots 1910a, 1910b positioned on platform 1902. Deposition chambers 1916a, 1916b, 1920, 1922, 1924, 1926, 1930, 1940, and 1942 may be disposed around the perimeter of and coupled with platform 1902.

In several examples, deposition chambers 1916a and 1916b may each independently be a heating chamber or an annealing chamber, deposition chambers 1920 and 1922 may each independently be a degassing chamber, a vacuum chamber, or an annealing chamber, and deposition chambers 1924 and 1926 may each independently be a preclean chamber, a plasma chamber, a sublimation chamber, or an annealing chamber (e.g., a SICONI® preclean chamber). Deposition chambers 1930, 1940, and/or 1942 may each independently be a deposition chamber, such as a CVD, an ALD, or a PVD chamber. In one example, deposition chamber 1930 may be an ESIP® Ti chamber and be utilized to deposit a titanium containing material (e.g., metallic titanium, titanium nitride, or other titanium alloys). In another example, deposition chambers 1940 and 1942 may each independently be may be an TXZ® ALD-TiN chamber and be utilized to deposit a titanium containing material (e.g., metallic titanium, titanium nitride, or other titanium alloys) during an ALD process.

Titanium Nitride PE-ALD Process

Embodiments of the invention provide methods for depositing a variety of material (e.g., titanium nitride) on a substrate by a vapor deposition process, such as atomic layer deposition (ALD) or plasma-enhanced ALD (PE-ALD). In one aspect, the process has little or no initiation delay and maintains a fast deposition rate while forming a titanium material, such as metallic titanium, titanium nitride, titanium silicon nitride, or derivatives thereof.

In one embodiment, titanium precursors that may be used with the PE-ALD processes described herein include tetrakis(dimethylamino)titanium (TDMAT), tetrakis(diethylamino) titanium (TDEAT), titanium tetrachloride ($TiCl_4$), and derivatives thereof. The PE-ALD processes described herein include sequentially exposing a substrate with a nitrogen precursor and a nitrogen plasma or other ionized reagent plasma.

In one example, a process gas containing TDMAT is pulsed into inlet 122, through annular channel 140, from injection holes 136 and 138, and into centralized channel 150 and nitrogen plasma is sequentially pulsed from a RPS into centralized channel 150 from inlet 120. Both the process gas containing TDMAT and the nitrogen plasma are sequentially pulsed to and through showerhead assembly 600. Thereafter, the substrate is sequentially exposed to the process gas and the nitrogen plasma.

In one embodiment, a titanium nitride material may be formed during a PE-ALD process containing a constant flow of a reagent gas while providing sequential pulses of a titanium precursor and a plasma. In another embodiment, a titanium material may be formed during another PE-ALD process that provides sequential pulses of a titanium precursor (e.g., TDMAT) and a reagent plasma (e.g., nitrogen plasma). In both of these embodiments, the reagent is generally ionized during the process. The PE-ALD process provides that the plasma is generated external from the deposition chamber, such as by a remote plasma generator (RPS) system. During PE-ALD processes, a plasma may be generated from a microwave (MW) frequency generator or a radio frequency (RF) generator. In another embodiment, a titanium material may be formed during a thermal ALD process that provides sequential pulses of a titanium precursor and a reagent.

Chamber lid assemblies 1400 or 1500 may be utilized during ALD processes described in embodiments herein and may be coupled with various ALD chamber bodies described herein. Other ALD chambers may also be used during some of the embodiments described herein and are available from Applied Materials, Inc., located in Santa Clara, Calif. A detailed description of an ALD chamber may be found in commonly assigned U.S. Pat. Nos. 6,916,398 and 6,878,206, and commonly assigned U.S. Ser. No. 10/281,079, filed on Oct. 25, 2002, and published as US 2003-0121608, which are hereby incorporated by reference in their entirety. In another embodiment, a chamber configured to operate in both an ALD mode as well as a conventional CVD mode may be used to deposit titanium materials is described in commonly assigned U.S. Pat. No. 7,204,886, which is incorporated herein by reference in its entirety.

In some embodiment, the deposition chamber may be pressurized at a pressure within a range from about 0.01 Torr to about 80 Torr, preferably from about 0.1 Torr to about 10 Torr, and more preferably, from about 0.5 Torr to about 2 Torr during several of the ALD processes described herein. Also, the chamber or the substrate may be heated to a temperature of less than about 500° C., preferably, about 400° C. or less, such as within a range from about 200° C. to about 400° C., and more preferably, from about 340° C. to about 370° C., for example, about 360° C. during several of the ALD processes described herein. During PE-ALD processes, a plasma may be ignited by an external source, such as a remote plasma generator or a remote plasma system (RPS). A plasma may be generated by a microwave (MW) generator or a radio frequency (RF) generator. For example, the plasma generator may be set to have a power output within a range from about 1 kilowatts (kW) to about 40 kW, preferably, from about 2 kW to about 20 kW, and more preferably, from about 4 kW to about 10 kW.

The substrate may be for example, a silicon substrate having an interconnect pattern defined in one or more dielectric material layers formed thereon. In example, the substrate contains an adhesion layer thereon, while in another example, the substrate contains a dielectric surface. The deposition chamber conditions such as, the temperature and pressure, are adjusted to enhance the adsorption of the process gases on the substrate so as to facilitate the reaction of the titanium precursor and the reagent gas.

In one embodiment, the substrate may be exposed to a reagent gas throughout the whole ALD cycle. The substrate may be exposed to a titanium precursor gas formed by passing a carrier gas (e.g., nitrogen or argon) through an ampoule of a titanium precursor. The ampoule may be heated depending on the titanium precursor used during the process. In one example, an ampoule containing TDMAT may be heated to a temperature within a range from about 25° C. to about 80° C. The titanium precursor gas usually has a flow rate within a range from about 100 sccm to about 2,000 sccm, preferably, from about 200 sccm to about 1,000 sccm, and more preferably, from about 300 sccm to about 700 sccm, for example, about 500 sccm. The titanium precursor gas and the reagent gas may be combined to form a deposition gas. A reagent gas usually has a flow rate within a range from about 100 sccm to about 3,000 sccm, preferably, from about 200 sccm to about 2,000 sccm, and more preferably, from about 500 sccm to about 1,500 sccm. In one example, nitrogen plasma is used as a reagent gas with a flow rate of about 1,500 sccm. The substrate may be exposed to the titanium precursor gas or the deposition gas containing the titanium precursor and the reagent gas for a time period within a range from about 0.1 seconds to about 8 seconds, preferably, from about 1 second to about 5 seconds, and more preferably, from about 2 seconds to about 4 seconds. The flow of the titanium precursor gas may be stopped once a layer of the titanium precursor is adsorbed on the substrate. The layer of the titanium precursor may be a discontinuous layer, a continuous layer, or even multiple layers.

The substrate and chamber may be exposed to a purge step after stopping the flow of the titanium precursor gas. The flow rate of the reagent gas may be maintained or adjusted from the previous step during the purge step. Preferably, the flow of the reagent gas is maintained from the previous step. Optionally, a purge gas may be administered into the deposition chamber with a flow rate within a range from about 100 sccm to about 2,000 sccm, preferably, from about 200 sccm to about 1,000 sccm, and more preferably, from about 300 sccm to about 700 sccm, for example, about 500 sccm. The purge step removes any excess titanium precursor and other contaminants within the deposition chamber. The purge step may be conducted for a time period within a range from about 0.1 seconds to about 8 seconds, preferably, from about 1 second to about 5 seconds, and more preferably, from about 2 seconds to about 4 seconds. The carrier gas, the purge gas and the process gas may contain nitrogen, hydrogen, ammonia, argon, neon, helium or combinations thereof. In a preferred embodiment, the carrier gas contains nitrogen.

Thereafter, the flow of the reagent gas may be maintained or adjusted before igniting a plasma. The substrate may be exposed to the plasma for a time period within a range from about 0.1 seconds to about 20 seconds, preferably, from about 1 second to about 10 seconds, and more preferably, from about 2 seconds to about 8 seconds. Thereafter, the plasma power was turned off. In one example, the reagent may be ammonia, nitrogen, hydrogen or a combination thereof to form an ammonia plasma, a nitrogen plasma, a hydrogen plasma, or a combined plasma. The reactant plasma reacts with the adsorbed titanium precursor on the substrate to form a titanium material thereon. In one example, the reactant plasma is used as a reducing agent to form metallic titanium. However, a variety of reactants may be used to form titanium materials having a wide range of compositions. In one example, a boron-containing reducing compound (e.g., diborane) is used to form a titanium material containing boride. In another example, a silicon-containing reducing compound (e.g., silane) is used to form a titanium material containing silicide.

The deposition chamber was exposed to a second purge step to remove excess precursors or contaminants from the previous step. The flow rate of the reagent gas may be maintained or adjusted from the previous step during the purge step. An optional purge gas may be administered into the deposition chamber with a flow rate within a range from about 100 sccm to about 2,000 sccm, preferably, from about 200 sccm to about 1,000 sccm, and more preferably, from about 300 sccm to about 700 sccm, for example, about 500 sccm. The second purge step may be conducted for a time period within a range from about 0.1 seconds to about 8 seconds, preferably, from about 1 second to about 5 seconds, and more preferably, from about 2 seconds to about 4 seconds.

The ALD cycle may be repeated until a predetermined thickness of the titanium material is deposited on the substrate. The titanium material may be deposited with a thickness less than 1,000 Å, preferably less than 500 Å and more preferably from about 10 Å to about 100 Å, for example, about 30 Å. The processes as described herein may deposit a titanium material at a rate of at least 0.15 Å/cycle, preferably, at least 0.25 Å/cycle, more preferably, at least 0.35 Å/cycle or faster. In another embodiment, the processes as described herein overcome shortcomings of the prior art relative as related to nucleation delay. There is no detectable nucleation delay during many, if not most, of the experiments to deposit the titanium materials.

In another embodiment, a titanium material may be formed during another PE-ALD process that provides sequentially exposing the substrate to pulses of a titanium precursor and an active reagent, such as a reagent plasma. The substrate may be exposed to a titanium precursor gas formed by passing a carrier gas through an ampoule containing a titanium precursor, as described herein. The titanium precursor gas usually has a flow rate within a range from about 100 sccm to about 2,000 sccm, preferably, from about 200 sccm to about 1,000 sccm, and more preferably, from about 300 sccm to about 700 sccm, for example, about 500 sccm. The substrate may be exposed to the deposition gas containing the titanium precursor and the reagent gas for a time period within a range from about 0.1 seconds to about 8 seconds, preferably, from about 1 second to about 5 seconds, and more preferably from about 2 seconds to about 4 seconds. The flow of the titanium precursor gas may be stopped once the titanium precursor is adsorbed on the substrate. The titanium precursor may be a discontinuous layer, continuous layer or even multiple layers.

Subsequently, the substrate and chamber are exposed to a purge step. A purge gas may be administered into the deposition chamber during the purge step. In one aspect, the purge gas is the reagent gas, such as ammonia, nitrogen or hydrogen. In another aspect, the purge gas may be a different gas than the reagent gas. For example, the reagent gas may be ammonia and the purge gas may be nitrogen, hydrogen or argon. The purge gas may have a flow rate within a range from about 100 sccm to about 2,000 sccm, preferably, from about 200 sccm to about 1,000 sccm, and more preferably, from about 300 sccm to about 700 sccm, for example, about 500 sccm. The purge step removes any excess titanium precursor and other contaminants within the deposition chamber. The purge step may be conducted for a time period within a range from about 0.1 seconds to about 8 seconds, preferably, from about 1 second to about 5 seconds, and more preferably, from about 2 seconds to about 4 seconds. A carrier gas, a purge gas and a process gas may contain nitrogen, hydrogen, ammonia, argon, neon, helium, or mixtures thereof.

The substrate and the adsorbed titanium precursor thereon may be exposed to the reagent gas during the next step of the ALD process. Optionally, a carrier gas may be administered at the same time as the reagent gas into the deposition chamber. The reagent gas may be ignited to form a plasma. The reagent gas usually has a flow rate within a range from about 100 sccm to about 3,000 sccm, preferably, from about 200 sccm to about 2,000 sccm, and more preferably, from about 500 sccm to about 1,500 sccm. In one example, ammonia is used as a reagent gas with a flow rate of about 1,500 sccm. The substrate may be exposed to the plasma for a time period within a range from about 0.1 seconds to about 20 seconds, preferably, from about 1 second to about 10 seconds, and more preferably, from about 2 seconds to about 8 seconds. Thereafter, the plasma power may be turned off. In one example, the reagent may be ammonia, nitrogen, hydrogen or combinations thereof, while the plasma may be an ammonia plasma, a nitrogen plasma, a hydrogen plasma or a combination thereof. The reactant plasma reacts with the adsorbed titanium precursor on the substrate to form a titanium material thereon. Preferably, the reactant plasma is used as a reducing agent to form metallic titanium. However, a variety of reactants may be used to form titanium materials having a wide range of compositions, as described herein.

The deposition chamber may be exposed to a second purge step to remove excess precursors or contaminants from the deposition chamber. The flow of the reagent gas may have been stopped at the end of the previous step and started during the purge step, if the reagent gas is used as a purge gas. Alternative, a purge gas that is different than the reagent gas may be administered into the deposition chamber. The reagent gas or purge gas may have a flow rate within a range from about 100 sccm to about 2,000 sccm, preferably, from about 200 sccm to about 1,000 sccm, and more preferably, from about 300 sccm to about 700 sccm, for example, about 500 sccm. The second purge step may be conducted for a time period within a range from about 0.1 seconds to about 8 seconds, preferably, from about 1 second to about 5 seconds, and more preferably, from about 2 seconds to about 4 seconds.

The ALD cycle may be repeated until a predetermined thickness of the titanium material is deposited on the substrate. The titanium material may be deposited with a thickness less than 1,000 Å, preferably less than 500 Å and more preferably from about 10 Å to about 100 Å, for example, about 30 Å. The processes as described herein may deposit a titanium material at a rate of at least 0.15 Å/cycle, preferably, at least 0.25 Å/cycle, more preferably, at least 0.35 Å/cycle or faster. In another embodiment, the processes as described herein overcome shortcomings of the prior art relative as related to nucleation delay. There is no detectable nucleation delay during many, if not most, of the experiments to deposit the titanium materials.

The titanium precursor and the reagent may be sequentially introduced into the deposition chamber during a thermal ALD process or a PE-ALD process. The titanium materials formed by process herein include metallic titanium, titanium nitride, titanium silicon nitride, or derivatives thereof. A suitable reagent for forming a titanium material may be a nitrogen precursor or a reducing gas and include nitrogen (e.g., $N_2$ or atomic-N), hydrogen (e.g., $H_2$ or atomic-H), ammonia ($NH_3$), hydrazine ($N_2H_4$), silane ($SiH_4$), disilane ($Si_2H_6$), trisilane ($Si_3H_8$), tetrasilane ($Si_4H_{10}$). dimethylsilane ($SiC_2H_8$), methyl silane ($SiCH_6$), ethylsilane ($SiC_2H_8$), chlorosilane ($ClSiH_3$), dichlorosilane ($Cl_2SiH_2$), hexachlorodisilane ($Si_2Cl_6$), borane ($BH_3$), diborane ($B_2H_6$), triethylborane ($Et_3B$), derivatives thereof, plasmas thereof, or combinations thereof.

The time interval for the pulse of the titanium precursor is variable depending upon a number of factors such as, for example, the volume capacity of the deposition chamber employed, the vacuum system coupled thereto and the volatility/reactivity of the reactants used during the ALD process. For example, (1) a large-volume deposition chamber may lead to a longer time to stabilize the process conditions such as, for example, carrier/purge gas flow and temperature, requiring a longer pulse time; (2) a lower flow rate for the process gas may also lead to a longer time to stabilize the process conditions requiring a longer pulse time; and (3) a lower chamber pressure means that the process gas is evacuated from the deposition chamber more quickly requiring a longer pulse time. In general, the process conditions are advantageously selected so that a pulse of the titanium precursor provides a sufficient amount of precursor so that at least a monolayer of the titanium precursor is adsorbed on the substrate. Thereafter, excess titanium precursor remaining in the chamber may be removed from the deposition chamber by the constant carrier gas stream in combination with the vacuum system.

The time interval for each of the pulses of the titanium precursor and the reagent gas may have the same duration. That is, the duration of the pulse of the titanium precursor may be identical to the duration of the pulse of the reagent gas. For such an embodiment, a time interval ($T_1$) for the pulse of the titanium precursor (e.g., TDMAT) is equal to a time interval ($T_2$) for the pulse of the reagent gas (e.g., nitrogen plasma).

Alternatively, the time interval for each of the pulses of the titanium precursor and the reagent gas may have different durations. That is, the duration of the pulse of the titanium precursor may be shorter or longer than the duration of the pulse of the reagent gas. For such an embodiment, a time interval ($T_1$) for the pulse of the titanium precursor is different than the time interval ($T_2$) for the pulse of the reagent gas.

In addition, the periods of non-pulsing between each of the pulses of the titanium precursor and the reagent gas may have the same duration. That is, the duration of the period of non-pulsing between each pulse of the titanium precursor and each pulse of the reagent gas is identical. For such an embodiment, a time interval ($T_3$) of non-pulsing between the pulse of the titanium precursor and the pulse of the reagent gas is equal to a time interval ($T_4$) of non-pulsing between the pulse of the reagent gas and the pulse of the titanium precursor. During the time periods of non-pulsing only the constant carrier gas stream is provided to the deposition chamber.

Alternatively, the periods of non-pulsing between each of the pulses of the titanium precursor and the reagent gas may have different duration. That is, the duration of the period of non-pulsing between each pulse of the titanium precursor and each pulse of the reagent gas may be shorter or longer than the duration of the period of non-pulsing between each pulse of the reagent gas and the titanium precursor. For such an embodiment, a time interval ($T_3$) of non-pulsing between the pulse of the titanium precursor and the pulse of the reagent gas is different from a time interval ($T_4$) of non-pulsing between the pulse of the reagent gas and the pulse of titanium precursor. During the time periods of non-pulsing only the constant carrier gas stream is provided to the deposition chamber.

Additionally, the time intervals for each pulse of the titanium precursor, the reagent gas and the periods of non-pulsing therebetween for each deposition cycle may have the same duration. For such an embodiment, a time interval ($T_1$) for the titanium precursor, a time interval ($T_2$) for the reagent gas, a time interval ($T_3$) of non-pulsing between the pulse of the titanium precursor and the pulse of the reagent gas and a time interval ($T_4$) of non-pulsing between the pulse of the reagent gas and the pulse of the titanium precursor each have the same value for each deposition cycle. For example, in a first deposition cycle ($C_1$), a time interval ($T_1$) for the pulse of the titanium precursor has the same duration as the time interval ($T_1$) for the pulse of the titanium precursor in subsequent deposition cycles ($C_2 \ldots C_n$). Similarly, the duration of each pulse of the reagent gas and the periods of non-pulsing between the pulse of the titanium precursor and the reagent gas in the first deposition cycle ($C_1$) is the same as the duration of each pulse of the reagent gas and the periods of non-pulsing between the pulse of the titanium precursor and the reagent gas in subsequent deposition cycles ($C_2 \ldots C_n$), respectively.

Alternatively, the time intervals for at least one pulse of the titanium precursor, the reagent gas and the periods of non-pulsing therebetween for one or more of the deposition cycles of the titanium material deposition process may have different durations. For such an embodiment, one or more of the time intervals ($T_1$) for the pulses of the titanium precursor, the time intervals ($T_2$) for the pulses of the reagent gas, the time intervals ($T_3$) of non-pulsing between the pulse of the titanium precursor and the reagent gas and the time intervals ($T_4$) of non-pulsing between the pulses of the reagent gas and the titanium precursor may have different values for one or more deposition cycles of the cyclical deposition process. For example, in a first deposition cycle ($C_1$), the time interval ($T_1$) for the pulse of the titanium precursor may be longer or shorter than one or more time interval ($T_1$) for the pulse of the titanium precursor in subsequent deposition cycles ($C_2 \ldots C_n$). Similarly, the durations of the pulses of the reagent gas and the periods of non-pulsing between the pulse of the titanium precursor and the reagent gas in the first deposition cycle ($C_1$) may be the same or different than the duration of each pulse of the reagent gas and the periods of non-pulsing between the pulse of the titanium precursor and the reagent gas in subsequent deposition cycles ($C_2 \ldots C_n$).

In some embodiments, a constant flow of a carrier gas or a purge gas may be provided to the deposition chamber modulated by alternating periods of pulsing and non-pulsing where the periods of pulsing alternate between the titanium precursor and the reagent gas along with the carrier/purge gas stream, while the periods of non-pulsing include only the carrier/purge gas stream.

A PE-ALD chamber, as described herein, may be used to form many materials including tantalum, tantalum nitride, titanium, titanium nitride, ruthenium, tungsten, tungsten nitride, ruthenium, cobalt, hafnium, silicides thereof, oxides thereof, derivatives thereof, or combinations thereof, as well as other materials.

In one example, a copper seed layer may be formed on the titanium nitride material by a CVD process and thereafter, bulk copper is deposited to fill the interconnect by an ECP process. In another example, a copper seed layer may be formed on the titanium nitride material by a PVD process and thereafter, bulk copper is deposited to fill the interconnect by an ECP process. In another example, a copper seed layer may be formed on the titanium nitride material by an electroless process and thereafter, bulk copper is deposited to fill the interconnect by an ECP process. In another example, the titanium nitride material serves as a seed layer to which a copper bulk fill is directly deposited by an ECP process or an electroless deposition process.

In another example, a tungsten seed layer may be formed on the titanium nitride material by a PE-ALD process and thereafter, bulk tungsten is deposited to fill the interconnect by a CVD process or a pulsed-CVD process. In another example, a tungsten seed layer may be formed on the titanium nitride material by a PVD process and thereafter, bulk tungsten is deposited to fill the interconnect by a CVD process or a pulsed-CVD process. In another example, a tungsten seed layer may be formed on the titanium nitride material by a PE-ALD process and thereafter, bulk tungsten is deposited to fill the interconnect by an ECP process. In another example, the titanium nitride material serves as a seed layer to which a tungsten bulk fill is directly deposited by a CVD process or a pulsed-CVD process.

Several integration sequence are conducted in order to form a titanium nitride material within an interconnect. In one example, the subsequent steps follow: a) pre-clean of the substrate; b) deposition of a barrier layer (e.g., ALD of TiN); c) deposition of titanium nitride by PE-ALD; and d) deposition of seed copper by electroless, ECP or PVD followed by deposition of bulk copper by ECP. In another example, the subsequent steps follow: a) deposition of a barrier layer (e.g., PE-ALD of TiN); b) punch through step; c) deposition of titanium nitride by PE-ALD; and d) deposition of seed copper by electroless, ECP or PVD followed by deposition of bulk copper by ECP. In another example, the subsequent steps follow: a) deposition of titanium nitride by PE-ALD; b) punch through step; c) deposition of titanium nitride by PE-ALD; and d) deposition of seed copper by electroless, ECP or PVD followed by deposition of bulk copper by electroless, ECP or PVD. In another example, the subsequent steps follow: a) deposition of titanium nitride by PE-ALD; b) punch through step; c) deposition of titanium nitride by PE-ALD; and d) deposition of copper by electroless or ECP. In another embodiment, the subsequent steps follow: a) pre-clean of the substrate; b) deposition of titanium nitride by PE-ALD; and c) deposition of seed copper by electroless, ECP or PVD followed by deposition of bulk copper by ECP. In another example, the subsequent steps follow: a) deposition of a barrier layer (e.g., PE-ALD of TiN); b) deposition of titanium nitride by PE-ALD; c) punch through step; d) deposition of titanium nitride by PE-ALD; and e) deposition of seed copper by electroless, ECP or PVD followed by deposition of bulk copper by ECP. In another example, the subsequent steps follow: a) deposition of a barrier layer (e.g., PE-ALD of TiN); b) punch through step; c) deposition of a barrier layer (e.g., PE-ALD of TiN); d) deposition of titanium nitride by PE-ALD; and d) deposition of seed copper by electroless, ECP or PVD; and e) deposition of bulk copper by ECP. In one example, the subsequent steps follow: a) pre-clean of the substrate; b) deposition of a barrier layer (e.g., PE-ALD of TiN); c) deposition of titanium nitride by PE-ALD; and d) deposition of copper bulk by electroless or ECP.

In some embodiments, titanium nitride materials formed by the PE-ALD processes described herein, have very little or no chlorine concentration or impurity. In one example, the titanium precursor gas contains TDMAT and the nitrogen plasma is formed from nitrogen ($N_2$). The substrate may be heated to a temperature within a range from about 340° C. to about 370° C. The plasma may be applied at a power within a range from about 4 kW to about 10 kW. The nitrogen gas may have a flow rate within a range from about 200 sccm to about 2,000 sccm. The internal pressure of the deposition chamber may be within a range from about 500 mTorr to about 2 Torr.

The pre-clean steps include methods to clean or purify the via, such as the removal of residue at the bottom of the via (e.g., carbon) or reduction of copper oxide to copper metal. Punch through steps include a method to remove material (e.g., barrier layer) from the bottom of the via to expose conductive layer, such as copper. Further disclosure of punch through steps is described in more detail in the commonly assigned, U.S. Pat. No. 6,498,091, which is incorporated herein in its entirety by reference. The punch through steps may be conducted within a deposition chamber, such as either a barrier chamber or a clean chamber. In embodiments of the invention, clean steps and punch through steps are applied to titanium nitride barrier layers. Further disclosure of overall integrated methods are described in more detail in the commonly assigned, U.S. Pat. No. 7,049,226, which is incorporated herein in its entirety by reference.

The titanium nitride materials formed during the PE-ALD processes as described herein generally have a sheet resistance of less than 2,000 μΩ-cm, preferably, less than 1,000 μΩ-cm, and more preferably, less than 500 μΩ-cm.

A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum, tantalum nitride, suicides thereof, derivatives thereof, or combinations thereof. Substrates may have various dimensions, such as 200 mm or 300 mm diameter wafers, as well as, rectangular or square panes. Unless otherwise noted, embodiments and examples described herein are preferably conducted on substrates with a 200 mm diameter or a 300 mm diameter, more preferably, a 300 mm diameter. Processes of some embodiments described herein may be utilized to deposit titanium nitride and other titanium materials (e.g., metallic titanium or titanium silicon nitride) on many substrates and surfaces. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers and patterned or non-patterned wafers. Substrates may be exposed to a pretreatment process to polish, etch, reduce, oxidize, hydroxylate, anneal and/or bake the substrate surface.

"Atomic layer deposition" (ALD) or "cyclical deposition" as used herein refers to the sequential introduction of two or more reactive compounds to deposit a layer of material on a substrate surface. The two, three or more reactive compounds may alternatively be introduced into a reaction zone or process region of a deposition chamber. The reactive compounds may be in a state of gas, plasma, vapor, fluid or other state of matter useful for a vapor deposition process. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. Compound A and compound B react to form a deposited material. During each time delay a purge gas is introduced into the deposition chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film thickness of the deposited material is formed on the substrate surface. In either scenario, the ALD process of pulsing compound A, purge gas, pulsing compound B and purge gas is a cycle. A cycle can start with either compound A or compound B and continue the respective order of the cycle until achieving a film with the desired thickness. In another embodiment, a first precursor containing compound A, a second precursor containing compound B and a third precursor containing compound C are each separately pulsed into the deposition chamber. Alternatively, a pulse of a first precursor may overlap in time with a pulse of a second precursor while a pulse of a third precursor does not overlap in time with either pulse of the first and second precursors.

"Process gas" as used herein refers to a single gas, multiple gases, a gas containing a plasma, combinations of gases and/or plasmas. A process gas may contain at least one reactive compound for a vapor deposition process. The reactive compounds or reagents may be in a state of gas, plasma, vapor, or fluid during the vapor deposition process. Also, a process may contain a purge gas or a carrier gas and not contain a reactive compound.

Other ALD Processes

Embodiments of the invention provide methods for depositing a variety of metal-containing materials (e.g., tantalum or tungsten containing materials) on a substrate by a thermal ALD process or a PE-ALD process by utilizing the PE-ALD chambers and processes described herein. In one example, tantalum nitride is deposited by sequentially exposing a substrate to a tantalum precursor and a plasma during a PE-ALD process. In another example, tungsten nitride is deposited by sequentially exposing a substrate to a tungsten precursor and a plasma during a PE-ALD process. In other examples, metallic tantalum or metallic tungsten is deposited by sequentially exposing a substrate to a tantalum precursor or a tungsten precursor and a plasma during a PE-ALD process.

Tantalum precursors useful during vapor deposition processes as described herein include pentakis(dimethylamido)tantalum (PDMAT or $Ta(NMe_2)_5$), pentakis(ethylmethylamido)tantalum (PEMAT or $Ta[N(Et)Me]_5$), pentakis(diethylamido)tantalum (PDEAT or $Ta(NEt_2)_5$,), ethylimidotris(dimethylamido) tantalum $((EtN)Ta(NMe_2)_3)$, ethylimido-tris(diethylamido)tantalum $((EtN)Ta(NEt_2)_3)$, ethylimido-tris(ethylmethylamido)tantalum $((EtN)Ta[N(Et)Me]_3)$, tertiarybutylimido-tris(dimethylamido)tantalum (TBTDMT or $(^tBuN)Ta(NMe_2)_3$), tertiarybutylimido-tris(diethylamido)tantalum (TBTDET or $(^tBuN)Ta(NEt_2)_3$), tertiarybutylimido-tris(ethylmethylamido)tantalum (TBTEAT or $(^tBuN)Ta[N(Et)Me]_3$), tertiaryamylimido-tris(dimethylamido)tantalum (TAIMATA or $(^tAmylN)Ta(NMe_2)_3$, wherein $^t$amyl is the tertiaryamyl group ($C_5H_{11}$— or $CH_3CH_2C(CH_3)_2$—), tertiaryamylimido-tris(diethylamido)tantalum (TAIEATA or $(^tAmylN)Ta(N Et_2)_3$, tertiaryamylimido-tris(ethylmethylamido)tantalum (TAI MATA or $(^tAmylN)Ta([N(Et)Me]_3$), tantalum halides (e.g., $TaF_5$ or $TaCl_5$), derivatives thereof, or combinations thereof.

Tungsten precursors that may be useful during the vapor deposition processes as described herein include bis(tertiarybutylimido) bis(tertiarybutylamido)tungsten $((^tBuN)_2W(N(H)^tBu)_2)$, bis(tertiarybutylimido) bis(dimethylamido)tungsten $((^tBuN)_2W(NMe_2)_2)$, bis(tertiarybutylimido) bis(diethylamido)tungsten $((^tBuN)_2W(NEt_2)_2)$, bis(tertiarybutylimido) bis(ethylmethylamido)tungsten $((^tBuN)_2W(NEtMe)_2)$, tungsten hexafluoride, derivatives thereof, or combinations thereof.

Nitrogen precursors that may be useful for forming a metal-containing material during the vapor deposition processes as described herein include nitrogen (e.g., plasma, $N_2$, or atomic-N), ammonia ($NH_3$), hydrazine ($N_2H_4$), methylhydrazine ($Me(H)NNH_2$), dimethyl hydrazine ($Me_2NNH_2$ or $Me(H)NN(H)Me$), tertiarybutylhydrazine ($^tBu(H)NNH_2$), phenylhydrazine ($C_6H_5(H)NNH_2$), a nitrogen plasma source (e.g., N, $N_2$, $N_2/H_2$, $NH_3$, or a $N_2H_4$ plasma), 2,2'-azotertbutane ($^tBuNN^tBu$), an azide source, such as ethyl azide ($EtN_3$), trimethylsilyl azide ($Me_3SiN_3$), derivatives thereof, plasmas thereof, or combinations thereof.

A suitable reagent for forming a metal-containing material may be a reducing gas and include hydrogen (e.g., $H_2$ or atomic-H), atomic-N, ammonia ($NH_3$), hydrazine ($N_2H_4$), silane ($SiH_4$), disilane ($Si_2H_6$), trisilane ($Si_3H_8$), tetrasilane ($Si_4H_{10}$), dimethylsilane ($SiC_2H_8$), methyl silane ($SiCH_6$), ethylsilane ($SiC_2H_8$), chlorosilane ($ClSiH_3$), dichlorosilane ($Cl_2SiH_2$), hexachlorodisilane ($Si_2Cl_6$), borane ($BH_3$), diborane ($B_2H_6$), triborane, tetraborane, pentaborane, triethylborane ($Et_3B$), derivatives thereof, plasmas thereof, or combinations thereof.

A carrier gas, a purge gas and a process gas may contain nitrogen, hydrogen, ammonia, argon, neon, helium, or combinations thereof. A plasma may be ignited containing any of these gases. Preferably, a plasma precursor gas that may be useful for forming a metal-containing material during the vapor deposition processes as described herein include nitrogen, hydrogen, ammonia, argon or combinations thereof. In one example, a plasma contains nitrogen and hydrogen. In another example, a plasma contains nitrogen and ammonia. In another example, a plasma contains ammonia and hydrogen.

Metal-containing materials that may be formed during thermal ALD or PE-ALD processes as described herein include tantalum, tantalum nitride, tungsten, tungsten nitride, titanium, titanium nitride, alloys thereof, derivatives thereof or combinations thereof. In one embodiment, a metal-containing material may be formed during a PE-ALD process containing a constant flow of a reagent gas while providing sequential pulses of a metal precursor and a plasma. In another embodiment, a metal-containing material may be formed during another PE-ALD process that provides sequential pulses of a metal precursor and a reagent plasma. In both of these embodiments, the reagent is generally ionized during the process. Embodiments provide that the plasma may be generated external from the deposition chamber, such as by a remote plasma generator (RPS) system. During PE-ALD processes, a plasma may be generated from a microwave (MW) frequency generator or a radio frequency (RF) generator. The plasma may be ignited within the RPS system and delivered into deposition chamber. In many embodiments, the plasma may be delivered through the central channel of the inlet manifold assembly, through the showerhead assembly, and into deposition chamber.

The RF generator may be set at a frequency within a range from about 100 KHz to about 1.6 MHz. In one example, a RF generator, with a frequency of 13.56 MHz, may be set to have a power output within a range from about 100 watts to about 1,000 watts, preferably, from about 250 watts to about 600 watts, and more preferably, from about 300 watts to about 500 watts. In one example, a RF generator, with a frequency of 400 KHz, may be set to have a power output within a range from about 200 watts to about 2,000 watts, preferably, from about 500 watts to about 1,500 watts. A surface of substrate may be exposed to a plasma having a power per surface area value within a range from about 0.01 watts/cm$^2$ to about 10.0 watts/cm$^2$, preferably, from about 0.05 watts/cm$^2$ to about 6.0 watts/cm$^2$.

The ALD process provides that the deposition chamber may be pressurized at a pressure within a range from about 0.1 Torr to about 80 Torr, preferably from about 0.5 Torr to about 10 Torr, and more preferably, from about 1 to about 5. Also, the chamber or the substrate may be heated to a temperature of less than about 500° C., preferably within a range from about 100° C. to about 450° C., and more preferably, from about 150° C. to about 400° C., for example, about 300° C. In another embodiment, a metal-containing material may be formed during a thermal ALD process that provides sequential pulses of a metal precursor and a reagent.

The substrate may be for example, a silicon substrate having an interconnect pattern defined in one or more dielectric material layers formed thereon. In example, the substrate contains a barrier layer thereon, while in another example, the substrate contains a dielectric surface. The deposition chamber conditions such as, the temperature and pressure, are adjusted to enhance the adsorption of the process gases on the substrate so as to facilitate the reaction of the pyrrolyl metal precursors and the reagent gas.

In one embodiment, the substrate may be exposed to a reagent gas throughout the whole ALD cycle. The substrate may be exposed to a metal precursor gas formed by passing a carrier gas (e.g., nitrogen or argon) through an ampoule of a metal precursor. The ampoule may be heated depending on the metal precursor used during the process. The metal precursor gas usually has a flow rate within a range from about 100 sccm to about 2,000 sccm, preferably, from about 200 sccm to about 1,000 sccm, and more preferably, from about 300 sccm to about 700 sccm, for example, about 500 sccm. The metal precursor gas and the reagent gas may be combined to form a deposition gas. A reagent gas usually has a flow rate within a range from about 100 sccm to about 3,000 sccm, preferably, from about 200 sccm to about 2,000 sccm, and more preferably, from about 500 sccm to about 1,500 sccm. In one example, ammonia is used as a reagent gas with a flow rate of about 1,500 sccm. The substrate may be exposed to the metal precursor gas or the deposition gas containing the metal precursor and the reagent gas for a time period within a range from about 0.1 seconds to about 8 seconds, preferably, from about 1 second to about 5 seconds, and more preferably, from about 2 seconds to about 4 seconds. The flow of the metal precursor gas may be stopped once the metal precursor is adsorbed on the substrate. The metal precursor may be a discontinuous layer, continuous layer or even multiple layers.

The substrate and deposition chamber may be exposed to a purge step after stopping the flow of the metal precursor gas. The flow rate of the reagent gas may be maintained or adjusted from the previous step during the purge step. Preferably, the flow of the reagent gas is maintained from the previous step. Optionally, a purge gas may be administered into the deposition chamber with a flow rate within a range from about 100 sccm to about 2,000 sccm, preferably, from about 200 sccm to about 1,000 sccm, and more preferably, from about 300 sccm to about 700 sccm, for example, about 500 sccm. The purge step removes any excess metal precursor and other contaminants within the deposition chamber. The purge step may be conducted for a time period within a range from about 0.1 seconds to about 8 seconds, preferably, from about 1 second to about 5 seconds, and more preferably, from about 2 seconds to about 4 seconds. The carrier gas, the purge gas and the process gas may contain nitrogen, hydrogen, ammonia, argon, neon, helium, or combinations thereof. In a preferred embodiment, the carrier gas contains nitrogen.

Thereafter, the flow of the reagent gas may be maintained or adjusted before igniting a plasma. The substrate may be exposed to the plasma for a time period within a range from about 0.1 seconds to about 20 seconds, preferably, from about 1 second to about 10 seconds, and more preferably, from about 2 seconds to about 8 seconds. Thereafter, the plasma power was turned off. In one example, the reagent may be ammonia, nitrogen, hydrogen or a combination thereof to form an ammonia plasma, a nitrogen plasma, a hydrogen plasma or a combined plasma. The reactant plasma reacts with the adsorbed metal precursor on the substrate to form a metal-containing material thereon. In one example, the reactant plasma is used as a reducing agent to form metallic ruthenium, tantalum, tungsten, titanium, or alloys thereof. However, a variety of reactants may be used to form metal-containing materials having a wide range of compositions. In one example, a boron-containing reducing compound (e.g., diborane) is used to form a metal-containing material containing boride. In another example, a silicon-containing reducing compound (e.g., silane) is used to form a metal-containing material containing silicide.

The deposition chamber was exposed to a second purge step to remove excess precursors or contaminants from the previous step. The flow rate of the reagent gas may be maintained or adjusted from the previous step during the purge step. An optional purge gas may be administered into the deposition chamber with a flow rate within a range from about 100 sccm to about 2,000 sccm, preferably, from about 200 sccm to about 1,000 sccm, and more preferably, from about 300 sccm to about 700 sccm, for example, about 500 sccm. The second purge step may be conducted for a time period within a range from about 0.1 seconds to about 8 seconds, preferably, from about 1 second to about 5 seconds, and more preferably, from about 2 seconds to about 4 seconds.

The ALD cycle may be repeated until a predetermined thickness of the metal-containing material is deposited on the substrate. The metal-containing material may be deposited with a thickness less than 1,000 Å, preferably less than 500 Å and more preferably from about 10 Å to about 100 Å, for example, about 30 Å. The processes as described herein may deposit a metal-containing material at a rate of at least 0.15 Å/cycle, preferably, at least 0.25 Å/cycle, more preferably, at least 0.35 Å/cycle or faster. In another embodiment, the processes as described herein overcome shortcomings of the prior art relative as related to nucleation delay. There is no detectable nucleation delay during many, if not most, of the experiments to deposit the metal-containing materials.

In another embodiment, a metal-containing material may be formed during another PE-ALD process that provides sequentially exposing the substrate to pulses of a metal precursor and an active reagent, such as a reagent plasma. The substrate may be exposed to a metal precursor gas formed by passing a carrier gas through an ampoule containing a metal precursor, as described herein. The metal precursor gas usually has a flow rate within a range from about 100 sccm to about 2,000 sccm, preferably, from about 200 sccm to about 1,000 sccm, and more preferably, from about 300 sccm to about 700 sccm, for example, about 500 sccm. The substrate may be exposed to the deposition gas containing the metal precursor and the reagent gas for a time period within a range from about 0.1 seconds to about 8 seconds, preferably, from about 1 second to about 5 seconds, and more preferably from about 2 seconds to about 4 seconds. The flow of the metal precursor gas may be stopped once the metal precursor is adsorbed on the substrate. The metal precursor may be a discontinuous layer, continuous layer or even multiple layers.

Subsequently, the substrate and chamber are exposed to a purge step. A purge gas may be administered into the deposition chamber during the purge step. In one aspect, the purge gas is the reagent gas, such as ammonia, nitrogen or hydrogen. In another aspect, the purge gas may be a different gas than the reagent gas. For example, the reagent gas may be ammonia and the purge gas may be nitrogen, hydrogen or argon. The purge gas may have a flow rate within a range from about 100 sccm to about 2,000 sccm, preferably, from about 200 sccm to about 1,000 sccm, and more preferably, from about 300 sccm to about 700 sccm, for example, about 500 sccm. The purge step removes any excess metal precursor and other contaminants within the deposition chamber. The purge step may be conducted for a time period within a range from about 0.1 seconds to about 8 seconds, preferably, from about 1 second to about 5 seconds, and more preferably, from about 2 seconds to about 4 seconds. A carrier gas, a purge gas, and/or a process gas may contain nitrogen, hydrogen, ammonia, argon, neon, helium, plasmas thereof, or mixtures thereof.

The substrate and the adsorbed metal precursor thereon may be exposed to the reagent gas during the next step of the ALD process. Optionally, a carrier gas may be administered at the same time as the reagent gas into the deposition chamber. The reagent gas may be ignited by the RPS to form a plasma. The reagent gas usually has a flow rate within a range from about 100 sccm to about 3,000 sccm, preferably, from about 200 sccm to about 2,000 sccm, and more preferably, from about 500 sccm to about 1,500 sccm. In one example, ammonia is used as a reagent gas with a flow rate of about 1,500 sccm. The substrate may be exposed to the plasma for a time period within a range from about 0.1 seconds to about 20 seconds, preferably, from about 1 second to about 10 seconds, and more preferably, from about 2 seconds to about 8 seconds. Thereafter, the plasma power may be turned off. In one example, the reagent may be ammonia, nitrogen, hydrogen or combinations thereof, while the plasma may be an ammonia plasma, a nitrogen plasma, a hydrogen plasma or a combination thereof. The reactant plasma reacts with the adsorbed metal precursor on the substrate to form a metal-containing material thereon. Preferably, the reactant plasma is used as a reducing agent or as a nitrogen source to form metal layers or nitride layers of ruthenium, tantalum, tungsten, titanium or alloys thereof. However, a variety of reactants may be used to form metal-containing materials having a wide range of compositions, as described herein.

The deposition chamber may be exposed to a second purge step to remove excess precursors or contaminants from the deposition chamber. The flow of the reagent gas may have been stopped at the end of the previous step and started during the purge step, if the reagent gas is used as a purge gas. Alternative, a purge gas that is different than the reagent gas may be administered into the deposition chamber. The reagent gas or purge gas may have a flow rate within a range from about 100 sccm to about 2,000 sccm, preferably, from about 200 sccm to about 1,000 sccm, and more preferably, from about 300 sccm to about 700 sccm, for example, about 500 sccm. The second purge step may be conducted for a time period within a range from about 0.1 seconds to about 8 seconds, preferably, from about 1 second to about 5 seconds, and more preferably, from about 2 seconds to about 4 seconds.

The ALD cycle may be repeated until a predetermined thickness of the metal-containing material is deposited on the substrate. The metal-containing material may be deposited with a thickness less than 1,000 Å, preferably less than 500 Å and more preferably from about 10 Å to about 100 Å, for example, about 30 Å. The processes as described herein may deposit a metal-containing material at a rate of at least 0.15 Å/cycle, preferably, at least 0.25 Å/cycle, more preferably, at least 0.35 Å/cycle or faster. In another embodiment, the processes as described herein overcome shortcomings of the prior art relative as related to nucleation delay. There is no detectable nucleation delay during many, if not most, of the experiments to deposit the metal-containing materials.

The time interval for the pulse of the metal precursor is variable depending upon a number of factors such as, for example, the volume capacity of the deposition chamber employed, the vacuum system coupled thereto and the volatility/reactivity of the reactants used during the ALD process. For example, (1) a large-volume deposition chamber may lead to a longer time to stabilize the process conditions such as, for example, carrier/purge gas flow and temperature, requiring a longer pulse time; (2) a lower flow rate for the process gas may also lead to a longer time to stabilize the process conditions requiring a longer pulse time; and (3) a lower chamber pressure means that the process gas is evacuated from the deposition chamber more quickly requiring a longer pulse time. In general, the process conditions are advantageously selected so that a pulse of the metal precursor provides a sufficient amount of precursor so that at least a monolayer of the metal precursor is adsorbed on the substrate. Thereafter, excess metal precursor remaining in the chamber may be removed from the deposition chamber by the constant carrier gas stream in combination with the vacuum system.

The time interval for each of the pulses of the metal precursor and the reagent gas may have the same duration. That is, the duration of the pulse of the metal precursor may be identical to the duration of the pulse of the reagent gas. For such an embodiment, a time interval ($T_1$) for the pulse of the metal precursor is equal to a time interval ($T_2$) for the pulse of the reagent gas.

Alternatively, the time interval for each of the pulses of the metal precursor and the reagent gas may have different durations. That is, the duration of the pulse of the metal precursor may be shorter or longer than the duration of the pulse of the reagent gas. For such an embodiment, a time interval ($T_1$) for the pulse of the metal precursor is different than the time interval ($T_2$) for the pulse of the reagent gas.

In addition, the periods of non-pulsing between each of the pulses of the metal precursor and the reagent gas may have the same duration. That is, the duration of the period of non-pulsing between each pulse of the metal precursor and each pulse of the reagent gas is identical. For such an embodiment, a time interval ($T_3$) of non-pulsing between the pulse of the metal precursor and the pulse of the reagent gas is equal to a time interval ($T_4$) of non-pulsing between the pulse of the reagent gas and the pulse of the metal precursor. During the time periods of non-pulsing only the constant carrier gas stream is provided to the deposition chamber.

Alternatively, the periods of non-pulsing between each of the pulses of the metal precursor and the reagent gas may have different duration. That is, the duration of the period of non-pulsing between each pulse of the metal precursor and each pulse of the reagent gas may be shorter or longer than the duration of the period of non-pulsing between each pulse of the reagent gas and the metal precursor. For such an embodiment, a time interval ($T_3$) of non-pulsing between the pulse of the metal precursor and the pulse of the reagent gas is different from a time interval ($T_4$) of non-pulsing between the pulse of the reagent gas and the pulse of metal precursor. During the time periods of non-pulsing only the constant carrier gas stream is provided to the deposition chamber.

Additionally, the time intervals for each pulse of the metal precursor, the reagent gas and the periods of non-pulsing therebetween for each deposition cycle may have the same duration. For such an embodiment, a time interval ($T_1$) for the metal precursor, a time interval ($T_2$) for the reagent gas, a time interval ($T_3$) of non-pulsing between the pulse of the metal precursor and the pulse of the reagent gas and a time interval ($T_4$) of non-pulsing between the pulse of the reagent gas and the pulse of the metal precursor each have the same value for each deposition cycle. For example, in a first deposition cycle ($C_1$), a time interval ($T_1$) for the pulse of the metal precursor has the same duration as the time interval ($T_1$) for the pulse of the metal precursor in subsequent deposition cycles ($C_2 \ldots C_n$). Similarly, the duration of each pulse of the reagent gas and the periods of non-pulsing between the pulse of the metal precursor and the reagent gas in the first deposition cycle ($C_1$) is the same as the duration of each pulse of the reagent gas and the periods of non-pulsing between the pulse of the metal precursor and the reagent gas in subsequent deposition cycles ($C_2 \ldots C_n$), respectively.

Alternatively, the time intervals for at least one pulse of the metal precursor, the reagent gas and the periods of non-pulsing therebetween for one or more of the deposition cycles of the metal-containing material deposition process may have different durations. For such an embodiment, one or more of the time intervals ($T_1$) for the pulses of the metal precursor, the time intervals ($T_2$) for the pulses of the reagent gas, the time intervals ($T_3$) of non-pulsing between the pulse of the metal precursor and the reagent gas and the time intervals ($T_4$) of non-pulsing between the pulses of the reagent gas and the metal precursor may have different values for one or more deposition cycles of the cyclical deposition process. For example, in a first deposition cycle ($C_1$), the time interval ($T_1$) for the pulse of the metal precursor may be longer or shorter than one or more time interval ($T_1$) for the pulse of the metal precursor in subsequent deposition cycles ($C_2 \ldots C_n$). Similarly, the durations of the pulses of the reagent gas and the periods of non-pulsing between the pulse of the metal precursor and the reagent gas in the first deposition cycle ($C_1$) may be the same or different than the duration of each pulse of the reagent gas and the periods of non-pulsing between the pulse of the metal precursor and the reagent gas in subsequent deposition cycles ($C_2 \ldots C_n$).

In some embodiments, a constant flow of a carrier gas or a purge gas may be provided to the deposition chamber modulated by alternating periods of pulsing and non-pulsing where the periods of pulsing alternate between the metal precursor and the reagent gas along with the carrier/purge gas stream, while the periods of non-pulsing include only the carrier/purge gas stream.

While foregoing is directed to the preferred embodiment of the invention, other and further embodiments of the invention may be devised without departing from the basic scope thereof, and the scope thereof is determined by the claims that follow.

The invention claimed is:

1. A chamber for plasma-enhanced atomic layer deposition processes, comprising:
   a substrate support containing a substrate receiving surface and disposed within a chamber body;
      a chamber lid assembly coupled with the chamber body and comprising:
      an inlet manifold assembly comprising an annular channel encompassing a centralized channel, wherein the centralized channel extends through the inlet manifold assembly, the inlet manifold assembly further comprises injection holes extending from the annular channel, through a sidewall of the centralized channel, and into the centralized channel;
      a showerhead assembly comprising a showerhead plate disposed below the inlet manifold assembly;
      a water box disposed between the inlet manifold assembly and the showerhead assembly; and
   a remote plasma system disposed above and coupled with the inlet manifold assembly, and in fluid communication with the centralized channel; and
      a processing region disposed between the substrate receiving surface and a lower surface of the showerhead plate.

2. The chamber of claim 1, wherein the injection holes comprise a first plurality of injection holes extending towards or substantially towards a central axis of the centralized channel.

3. The chamber of claim 2, wherein the first plurality of injection holes contains three or more injection holes.

4. The chamber of claim 2, wherein the injection holes comprise a second plurality of injection holes extending tangential or substantially tangential towards the sidewall of the centralized channel.

5. The chamber of claim 4, wherein the second plurality of injection holes are disposed along the sidewall of the centralized channel and between the first plurality of injection holes and the showerhead assembly.

6. The chamber of claim 2, wherein the injection holes comprise a second plurality of injection holes extending at a different angle than the first plurality of holes.

7. The chamber of claim 6, wherein the first plurality of injection holes contains three or more injection holes and the second plurality of injection holes contains three or more injection holes.

8. The chamber of claim 1, wherein each injection hole has a diameter within a range from about 0.06 inches to about 0.12 inches.

9. The chamber of claim 1, wherein the inlet manifold assembly comprises aluminum or an aluminum alloy.

10. The chamber of claim 9, wherein the inlet manifold assembly comprises an aluminum alloy, and the aluminum alloy further comprises magnesium and silicon.

11. The chamber of claim 1, further comprising a gas manifold assembly coupled with and in fluid communication with the inlet manifold assembly.

12. The chamber of claim 11, wherein the gas manifold assembly comprises a first conduit coupled with and in fluid communication with the annular channel.

13. The chamber of claim 12, wherein a valve assembly is coupled with and in fluid communication with the first conduit, and the valve assembly comprises a mass flow controller to enable an atomic layer deposition process.

14. The chamber of claim 12, wherein the gas manifold assembly comprises a second conduit coupled with and in fluid communication with the annular channel.

15. The chamber of claim 12, wherein the gas manifold assembly comprises a second conduit coupled with and in fluid communication with the remote plasma system.

16. The chamber of claim 1, wherein the remote plasma system is disposed at the upper end of the centralized channel and the showerhead assembly is disposed at the lower end of the centralized channel.

* * * * *

UNITED STATES PATENT AND TRADEMARK OFFICE
CERTIFICATE OF CORRECTION

PATENT NO.         : 8,291,857 B2
APPLICATION NO.    : 12/494901
DATED              : October 23, 2012
INVENTOR(S)        : Lam et al.

Page 1 of 1

It is certified that error appears in the above-identified patent and that said Letters Patent is hereby corrected as shown below:

In the Detailed Description:

Column 22, Line 62, please delete "suicides" and insert --silicides-- therefor.

Signed and Sealed this
Twelfth Day of March, 2013

Teresa Stanek Rea
*Acting Director of the United States Patent and Trademark Office*